United States Patent
Watabe et al.

(10) Patent No.: US 6,642,599 B1
(45) Date of Patent: Nov. 4, 2003

(54) SEMICONDUCTOR DEVICE AND METHOD OF MANUFACTURING THE SAME

(75) Inventors: Kiyoto Watabe, Hyogo (JP); Tomohide Terashima, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 08/689,636

(22) Filed: Aug. 13, 1996

(30) Foreign Application Priority Data

Aug. 22, 1995 (JP) .............................................. 7-213718
Mar. 15, 1996 (JP) .............................................. 8-059356

(51) Int. Cl.[7] .......................... H01L 29/76; H01L 29/00
(52) U.S. Cl. ........................ 257/509; 257/328; 257/329; 257/506; 438/212; 438/268
(58) Field of Search ................................ 257/329, 328, 257/341, 509, 513, 510, 492, 514, 515; 438/212, 268, 221, 296, 353, 345

(56) References Cited

U.S. PATENT DOCUMENTS

| | | | |
|---|---|---|---|
| 4,935,800 A | * 6/1990 | Taguchi | 357/49 |
| 5,055,896 A | * 10/1991 | Williams et al. | 357/23.8 |
| 5,512,774 A | * 4/1996 | Nakagawa et al. | 257/513 X |
| 5,525,824 A | * 6/1996 | Himi | 257/370 |
| 5,629,558 A | * 5/1997 | Galbiati et al. | 257/653 |
| 5,661,329 A | * 8/1997 | Hiramoto et al. | 257/510 |
| 5,708,287 A | * 1/1998 | Nakagawa et al. | 257/350 |

FOREIGN PATENT DOCUMENTS

| | | |
|---|---|---|
| JP | 01 042863 A | 2/1989 |
| JP | 3-167879 | 7/1991 |
| JP | 4-123456 | 4/1992 |
| JP | 04123456 | * 4/1992 |
| JP | 04154147 | * 5/1992 |
| JP | 4-154147 | 5/1992 |
| JP | 5-048095 | 2/1993 |
| JP | 07176692 | * 7/1995 |
| JP | 7-176692 | 7/1995 |
| JP | 7-283406 | 10/1995 |

OTHER PUBLICATIONS

Basil Weir, "Integrated High–Voltage Driver Circuit in Gate Array Form," SIDD International Symposium Digest of Technical Paper, SID 82 Digest, May 1982, pp 268–269.*

T. Terashima et al. Structure of 600V IC and A New Voltage Sensing Device, IEEE, 1993 pp. 224–229.

K. Tsuchiya et al, P–CH and N–CH IGBTS for push–pull circuit in Driver ICS, IEEE 1991, pp. 65–69.

(List continued on next page.)

Primary Examiner—Steven Loke
Assistant Examiner—Donghee Kang
(74) Attorney, Agent, or Firm—McDermott, Will & Emery

(57) ABSTRACT

A high resistance n-type base layer is formed on a silicon substrate with an insulating layer made of a silicon oxide film therebetween. In the high resistance n-type base layer a p-ch MOS transistor is formed. The p-ch MOS transistor is electrically isolated from another element by trench isolation formed of a trench. A $p^+$ source layer in the p-ch MOS transistor surrounds a periphery of a $p^+$ drain layer and has, for example, an elliptical planar configuration. A semiconductor device thus formed has a high drive capacity and is suitable to high integration.

16 Claims, 73 Drawing Sheets

OTHER PUBLICATIONS

A. Nakagawa et al. New 500V Output Device Structures for thin Silicon Layer on Silicon Dioxide Film. Proceedings of 1990 International Symposium on Power semiconductor Devices & Ics, pp. 97–101, 1990.

Basil Weir, "Integrated High–Voltage Driver Circuits in Gate Array Form," SID International Symposium Digest of Technical Papers, SID 82 Digest, May 1982, pp. 268–269.

Jacek Korec, "Silicon–on–insulator technology for high–temperature, smart–power applications," Materials Science and Engineering B, vol. B29, No. 1/03, Jan. 1, 1995, pp. 1–6.

Tadanori Yamaguchi et al., "Process and Device Design of a 1000–V MOS IC," IEEE Transactions on Electron Devices, vol. Ed–29, No. 8, Aug. 1982, pp. 1171–1178.

Kiyoto Watabe et al., "A 0.8$\mu$m High Voltage IC using Newly Designed 600V Lateral IGBT o Thick Buried–Oxide SOI," Proceedings of the 8th International Symposium on Power Semiconductor Devices and IC'S (ISPSD), Maui, Hawaii, May 20–23, 1996, No. SYMP. 8, May 20, 1996, pp. 151–154.

* cited by examiner

FIG.67

SEMICONDUCTOR DEVICE AND METHOD OF MANUFACTURING THE SAME

BACKGROUND OF THE INVENTION

1. Field of the Invention

The present invention relates to a semiconductor device and a method of manufacturing the same, and in particular to a semiconductor device including a lateral power device and a method of manufacturing the same.

2. Description of the Background Art

Power ICs (Integrated Circuits), which include a power element for a large current having a high breakdown voltage as well as its drive circuit and a protection circuit integrated integrally with the power element, will be the mainstream of power elements hereafter. It is preferable to perform gate driving in such a power element by a system of a voltage control type using an insulated gate electrode (MOS (Metal Oxide Semiconductor) gate). In this voltage control type, the gate driving requires less current compared with a current driving type.

Among integrated circuits (ICs) each including a plurality of semiconductor elements integrated on a single semiconductor substrate, ICs including a high breakdown voltage element are called power ICs. High breakdown voltage elements including an MOS gate such as a power MOSFET (Field Effect Transistor) and an IGBT (Insulated Gate Bipolar Transistor) are achieved utilizing combination of pn junction isolation and RESURF (Reduced Surface Field) technologies.

According to the pn junction isolation, an island of silicon surrounded by a p-type layer is formed, and the surrounded p-type layer is set to the lowest potential. Thereby, the inner n-type island and the outer p-type layer are always biased oppositely, so that a depletion layer of a high resistance exists at the pn junction.

The RESURF technology which was named by Apple Corp. and others is essentially the same as the offset gate technology which is used for accomplishing the lateral MOS transistor of high breakdown voltage.

A semiconductor device in the prior art will be described below in connection with a lateral p-ch (p-channel) MOS transistor having a structure similar to that disclosed in Terashima et al., Proc. ISPSD '93, pp. 224–229.

FIGS. 77 and 78 are a cross section and a plan schematically showing structure of a conventional semiconductor device. More specifically, FIG. 77 is a cross section taken along line LXXVII–LXXVII in FIG. 78.

Referring to FIGS. 77 and 78, an $n^-$ buried layer 903 is selectively formed at a $p^-$ high resistance substrate 901. An $n^+$ buried layer 904 is formed on $n^-$ buried layer 903.

An $n^-$ layer 905 is formed on $p^-$ high resistance substrate 901. Around $n^-$ layer 905, there is formed a p-type diffusion layer 963 having a substantially elliptical planar form for element isolation. The p-type diffusion layer 963 and $p^-$ high resistance substrate 901 form together with $n^-$ layer 905 a pn junction isolation. A lateral p-ch MOS transistor is formed at $n^-$ layer 905 thus isolated from other elements.

The lateral p-ch MOS transistor includes a $p^+$ source layer 909, a $p^+$ drain layer 911, a $p^-$ drain layer 915, a gate oxide film 919 and a gate electrode layer 921.

$P^+$ source layer 909 having a substantially elliptical planar form is formed at the surface of $n^-$ layer 905 and surrounds the periphery of n-type base layer 907. At the surface of $n^-$ layer 905 is formed a $p^+$ drain layer 911 which has a substantially elliptical planar form and surrounds the periphery of $p^+$ source layer 909 with a predetermined space therebetween. $P^-$ drain layer 915 extends between $p^+$ drain layer 911 and $p^+$ source layer 909 and is located immediately under a field oxide film 969. $P^-$ drain layer 915 surrounds the periphery of $p^+$ source layer 909 to define a channel region therebetween and is electrically connected to $p^+$ drain layer 911 to define, with $p^+$ source layer 909, a channel region. A gate electrode layer 921 is formed on the surface of $n^-$ layer 905, which is located between $p^+$ source layer 909 and $p^-$ drain layer 915, with a gate oxide film 919 therebetween.

There is also formed an interlayer insulating layer 951 covering the p-ch MOS transistor. Interlayer insulating film 951 is provided with a through hole 951b exposing $p^+$ source layer 909 and n-type base layer 907. Interlayer insulating film 951 is also provided with through holes 951a exposing portions of $p^+$ drain layer 911.

There is formed an interconnection layer 953b for source leading, which electrically connects $p^+$ source layer 909 and n-type base layer 907 through through hole 951b. There is also formed an interconnection layer 953a for drain leading, which is electrically connected to $p^+$ drain layer 911 through through holes 951a.

A plurality of conductive layers 927 formed on field oxide film 969 and a plurality of conductive layers 953g formed on interlayer insulating layer 951 form a multilayer field plate of a capacity coupling type. Conductive layer 927 among conductive layers 927 located at the outermost position is electrically connected to interconnection layer 953a through through holes 951g.

Referring particularly to FIG. 78, interconnection layer 953b for source electrode leading, an interconnection layer (not shown) for gate electrode leading and interconnection layer 953a for drain electrode leading are formed on the same interlayer insulating layer 951. Interconnection layer 953a for drain electrode leading has an elliptical planar form. Therefore, it is necessary to form a recess at conductive layer 953a and dispose interconnection layer 953b in the recess in order to keep isolation between interconnection layers 953a and 953b.

A method of manufacturing the conventional semiconductor device will be describe below.

FIGS. 79 to 86 are schematic cross sections showing, in the order of steps, a method of manufacturing the conventional semiconductor device. Particularly, FIGS. 79 to 86 show a portion corresponding to a region R5 in FIG. 77.

Referring first to FIG. 79, an $n^-$ buried layer 903a is selectively formed at $p^-$ high resistance substrate 901, and an $n^+$ buried layer 904a is selectively formed at $n^-$ buried layer 903a.

Referring to FIG. 80, n-type layer 905 is formed by epitaxial growth on $p^-$ high resistance substrate 901. P-type diffusion layer 963a extending deep to $p^-$ high resistance substrate 901 is formed at a boundary between regions to be isolated. P-type diffusion layer 963a is formed in the substantially elliptical form extending around $n^-$ layer 905.

Referring to FIG. 81, an oxide film 971 and a nitride film 973 are successively formed, and a resist pattern 975 is formed to cover regions not to be oxidized. Using resist pattern 975 as a mask, nitride film 973 is etched and removed. Thereafter, boron (B), i.e., p-type impurity is ion-implanted using resist pattern 975 as a mask. Thereafter, resist pattern 975 is removed. Thermal processing is performed by a conventional LOCOS (Local Oxidation of Silicon) method. Then, nitride film 973 is removed.

Referring to FIG. 82, the above thermal processing selectively forms field oxide film 969 at the surface of n⁻ layer 905. Also, p⁻ drain layer 915 is formed immediately under field oxide film 969.

Referring to FIG. 83, gate oxide films 919a and 925a are formed on exposed portions of the surface of n⁻ layer 905. Thereafter, polycrystalline silicon 921a doped with impurity (which will be referred to as a doped polycrystalline) is deposited on the whole surface. A resist pattern 973a having an intended configuration is formed on doped polycrystalline silicon 921a. Anisotropic etching is effected on doped polycrystalline silicon 921a using this resist pattern 973a as a mask. Thereafter, resist pattern 973a is removed.

Referring to FIG. 84, the above etching forms gate electrode layer 921 opposed to n⁻ layer 905 with gate oxide film 919 therebetween. This processing also forms a plurality of conductive layers 927 forming a lower portion of the field plate on field oxide film 969. Thereafter, a resist pattern 973b is formed on the n-type base leading region. Using resist pattern 973b as a mask, boron is implanted to form p⁺ source layer 909 and p⁺ drain layer 911. P⁺ drain layer 911 thus formed has an elliptical form, surrounds p⁺ source layer 909 with a predetermined space therebetween and is electrically connected to p⁻ drain layer 915. P⁺ source layer 909, p⁺ drain layer 911, p⁻ drain layer 915, gate oxide film 919 and gate electrode layer 921 form the p-ch MOS transistor.

Referring to FIG. 85, a resist pattern 973c is formed over p⁺ drain layer 911 and p⁺ source layer 909. Using resist pattern 973c as a mask, arsenic (As) is ion-implanted. By this ion-implantation, n-type base layer 907 reaching n⁺ buried layer 904 is formed at a region surround by p⁺ source layer 909. Thereafter, resist pattern 973c is removed.

Referring to FIG. 86, interlayer insulating film 951 is formed on the whole surface after the thermal processing. Through holes 951a, 951b and 951g are formed at interlayer insulating film 951 by conventional photolithography and etching technique. Through holes 951b exposes surfaces of p⁺ source layer 909 and n-type base layer 907. Through holes 951a partially exposes the surface of p⁺ drain layer 911, and through hole 951g partially exposes interconnection layer 927.

Thereafter, interconnection layers 953a and 953b made of aluminum as well as the plurality of conductive layers 953g forming the upper portion of the field plate are formed, whereby the conventional semiconductor device having the lateral p-ch MOS transistor is formed as shown in FIG. 77.

The conventional semiconductor device has a planar layout in which drain layers 911 and 915 surround p⁺ source layer 909 as shown in FIG. 78. Therefore, it is impossible to provide a semiconductor device which has a large drive current and is suitable to high integration. This will be described below more in detail.

FIG. 87 schematically shows a planar layout of the conventional semiconductor device shown in FIG. 78. FIG. 88 schematically shows a planar layout in which the source layer surrounds the drain layer.

Compared with the structure in which p⁺ drain layer 911 surrounds p⁺ source layer 909 as shown in FIG. 87, a larger drive current can be utilized in the structure which includes p⁺ source layer 909 surrounding p⁺ drain layer 911 as shown in FIG. 88, and thus has a larger gate width, provided that both the structures have an equal gate length and the p-type inverted layer region immediately under the gate electrode governs the drive current.

In view of improvement of the current drive capacity, the structure of the conventional semiconductor device shown in FIGS. 77 and 78 may be modified into a structure in which the source layer surrounds the drain layer.

FIG. 89 is a schematic cross section showing the modified structure of the conventional semiconductor device, in which the source surrounds the drain. Referring to FIG. 89, p⁺ source layer 909 is located radially outside the region for forming the p-ch MOS transistor, and p⁺ drain layer 911 is located at the radially inner position, because the p⁺ source layer 909 is located to surround p⁺ source layer 911. In the conventional semiconductor device, pn junction isolation is employed for isolating the p-ch MOS transistor from other elements. Therefore, p⁺ source layer 909 disposed at the radially outer position is located near the p-type diffusion layer 963 forming the pn junction isolation.

During operation of the p-ch MOS transistor, a Vcc potential is generally applied to p⁺ source layer 909, and a GND potential is generally applied to p⁻ high resistance substrate 901 and p⁺ drain layer 911. Particularly, in the case of a power element having a high breakdown voltage, an extremely high potential of 600V may be applied as Vcc to p⁺ source layer 909. In this case, an extremely high potential difference is applied between p⁺ source layer 909 and p⁻ high resistance substrate 901. Therefore, a current I inevitably flows from p⁺ source layer 909 to p⁻ high resistance substrate 901 through p-type diffusion layer 963 along arrows shown in FIG. 89, if p⁺ source layer 909 and p-type diffusion layer 963 are close to each other. The flow of this current I remarkably impairs isolation performance of the pn junction isolation.

In order to prevent the flow of current I, p-type diffusion layer 963 must be spaced by a distance L from p⁻ source layer 909 as shown in FIG. 90. This enlarges the region for forming the p-ch MOS transistor, resulting in a structure not suitable to high integration.

SUMMARY OF THE INVENTION

An object of the invention is to provide a semiconductor device which has a high current drive capacity and is suitable to high integration.

A semiconductor device according to the invention includes a semiconductor substrate, semiconductor layer and an element having an insulated gate transistor portion. The semiconductor substrate has a main surface. The semiconductor layer is formed on the main surface of the semiconductor substrate with an insulating layer therebetween. The semiconductor layer has a formation region for forming the element having an insulated gate transistor portion and another element formation region. The semiconductor layer is provided with a trench surrounding the element formation region for electrically isolating the element formation region from another element formation region. The insulated gate transistor has a source region and a drain region formed at the surface of the semiconductor layer. The source region is located in the element formation region at the surface of the semiconductor layer and surrounds the periphery of the drain region.

Since the semiconductor device of the invention described above has the structure in which the source region surrounds the drain region, the current drive capacity can be improved. The insulated gate transistor is isolated from another element by the trench in contrast to the prior art using pn junction for isolation. Therefore, it is possible to prevent flow of a current from the source region to the semiconductor substrate during operation even in a structure including the source region disposed near the isolating region. Thus, it is not necessary to dispose the trench for isolation remote from the source region. Accordingly, the semiconductor device can have a high current drive capacity and can be suitable to high integration.

Preferably, the structure of the above aspect further includes a source leading interconnection layer electrically connected to the source region and a drain leading interconnection layer electrically connected to the drain region. The drain leading interconnection layer is located on the insulating layer covering the source leading interconnection layer, and extends in a direction crossing the source leading interconnection layer while it is kept electrically insulated from said source leading interconnection layer.

The source leading interconnection layer and the drain leading interconnection layer extend on different layers. Therefore, electrical short-circuit between the source leading interconnection layer and the drain leading interconnection layer is prevented even if the source leading interconnection layer is in contact with the source region through the entire circumference of the source region.

Preferably, the structure of the above aspect further includes a source leading interconnection layer electrically connected to the source region. The source leading interconnection layer may be in contact with the surface of the source region through the entire circumference of the source region.

The source leading interconnection layer is in contact with the surface of the source region through the entire circumference of the source region. Therefore, a contact area between the source region and the source leading interconnection layer can be large, and thus a source contact resistance can be small.

The source leading interconnection layer may be made of a material such as aluminum having a small resistance.

Thereby, a current can be supplied to the entire circumference of the source region via the source leading interconnection layer of a low resistance. Therefore, the resistance can be reduced as compared with the case where the current is supplied to the entire circumference of the source region through the source region having a relatively high resistance.

In the above aspect, a silicide layer is preferably formed at the surface of the source region around the entire circumference of the source region.

Provision of the silicide layer can significantly reduce a sheet resistance of the source region. Therefore, the resistance of the source region can be small, even when a current is supplied to the entire circumference of the source region through the source region.

The structure of the above aspect further includes a source leading interconnection layer electrically connected to the source region. The source leading interconnection layer is in contact with a silicide layer at a portion of the surface of the source region.

Provision of the silicide layer can significantly reduce a sheet resistance of the source region. Therefore, the resistance can be small even if the source leading interconnection layer is not in contact with the entire circumference of the source region.

In the above aspect, the trench surrounds the insulated gate transistor formation region with its width kept constant.

Since the trench has the constant width, a filler can be uniformly filled into the groove. Therefore, it is possible to prevent lowering of the breakdown voltage of element isolation which may be caused by insufficient filling of the filler into the groove.

In the above aspect, the source region may have a curved portion having a predetermined curvature radius.

Since the source region has the curved portion, the channel region can have a larger area compared with the case where it is formed of only straight portions. Therefore, the drive capacity of the semiconductor device can be improved.

In the above aspect, the trench may have first and second trenches. The semiconductor layer has an isolation region neighboring to the element formation region with the first trench therebetween and electrically isolated from another element formation region with the second trench therebetween. The isolation region is electrically connected to the source region.

An isolation region of the same potential as the source of the insulated gate transistor is arranged between the insulated gate transistor and another element formation region. Therefore, the side wall of the trench can maintain a stable potential, and the insulated gate transistor is prevented from electrically affecting other elements.

In the above aspect, the insulated gate transistor preferably has a p-channel power device and an n-channel power device both formed at a first semiconductor layer and electrically isolated from each other by the groove. The p-channel and n-channel power devices each have two lightly doped layers located between the source region and the drain region. The lightly doped layer of the p channel device and the lightly doped layer of the n channel device are of different conductivity types. One of the two lightly doped layers is electrically connected to the drain region and has a lower concentration than the drain region.

The p-channel and n-channel power devices each have the two lightly doped layers of the different conductivity types located between the source and drain regions, and one of these two layers is electrically connected to the drain region and has a lower concentration than the drain region. Therefore, each of the lightly doped layers of the p-channel and n-channel power devices may be set to have a concentration which causes complete depletion upon application of a high voltage in an off state, whereby the elements can have high and equal breakdown voltages.

In the above aspect, the insulated gate transistor preferably has an impurity region neighboring to the source region, formed on the surface of the semiconductor layer and having a conductivity type different from that of the source region. In a planar layout, a junction between the source region and the impurity region has a portion protruding toward the source region.

Protrusion of the junction between the source region and the impurity region toward the source region locally reduces a width of the source region. Therefore, a resistance immediately under the source region can be reduced.

In the above described aspect, preferably, the drain region has an approximately circular shape at the surface of the semiconductor layer. The source region has a ring shape surrounding the periphery of the drain region at the surface of the semiconductor layer. The inner peripheral surface and the outer periphery surface defining the ring shape are approximately circular.

Since the drain region is approximately circular and the source region has approximately circular ring shape, drain current density can be improved, and latch up capability can be improved.

In the above described aspects, preferably, three elements neighboring to each other are arranged at the surface of the semiconductor layer. The centers of the approximately circular drain regions of these three elements respectively are arranged to be positioned at vertexes of an approximately triangle.

As the elements are arranged in this manner, it becomes possible to arrange elements having approximately circular shape with highest density at the surface of the semiconductor layer, and hence effective element area can be increased.

In the above described aspects, preferably, another element includes a diode having first and second impurity regions of mutually different conductivity types. The first and second impurity regions are arranged such that a junction between the first and second impurity regions has a portion linearly extended at the surface of the semiconductor layer.

An IGBT is used as the element including the insulated gate transistor, and by the IGBT and the diode, a half bridge circuit can be provided. Further, in the diode, the first and second impurity regions are arranged to have a portion linearly extending, so that higher current density on the side of the anode and cathode can be ensured.

In the above described aspects, preferably, four mutually neighboring elements are arranged at the surface of the semiconductor layer. Centers of the drain regions of the four approximately circular elements are arranged to be positioned at the vertexes of approximately regular square. When the elements are developed in the lattice form, the time for electronic ray exposure can be reduced.

A method of manufacturing a semiconductor device according to the invention includes the following steps:

A semiconductor layer having an insulated gate transistor formation region and another element formation region is formed on a main surface of a semiconductor substrate with an insulating layer therebetween. A trench surrounding a periphery of the insulated gate transistor formation region is formed at the semiconductor layer for isolating the insulated gate transistor formation region from another electrode formation region. An insulated gate transistor having a source region and a drain region is formed at the insulated gate transistor formation region such that the source region of the insulated gate transistor surrounds the periphery of the drain region of the insulated gate transistor.

The above method of manufacturing the semiconductor device according to the invention can provide the semiconductor device which has a high current drive capacity and is suitable to high integration.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 67 is an illustration of an example in which cell arrays arranged in a honeycomb are used for the IGBT and a track-shaped one is used for the diode, of the half bridge circuit.

DESCRIPTION OF THE PREFERRED EMBODIMENTS

Embodiments of the invention will be described below with reference to the drawings.

Embodiment 1

Figure 1:
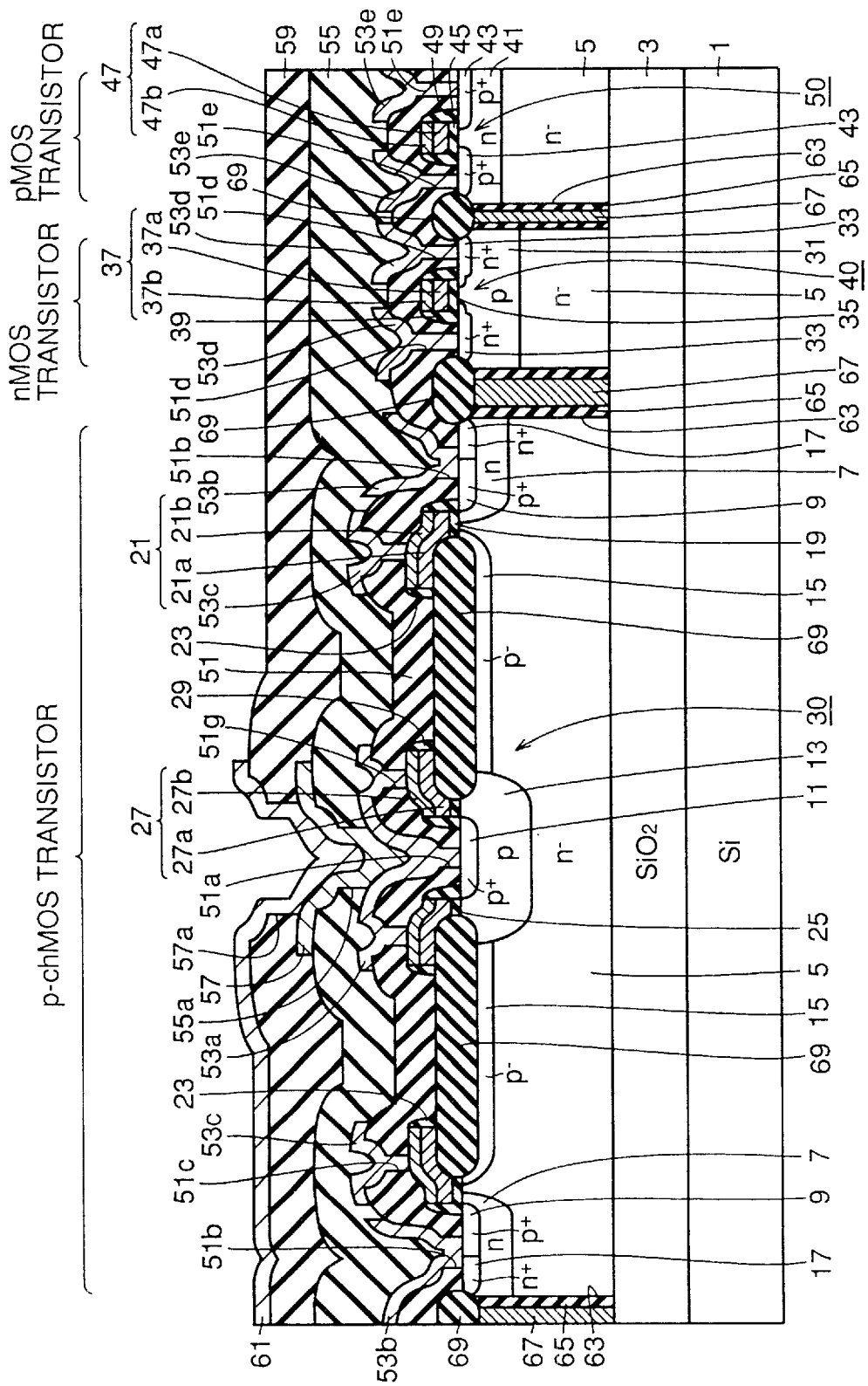
FIG. 1 is a cross section schematically showing a structure of a semiconductor device of an embodiment 1 of the invention.
Figure 2:
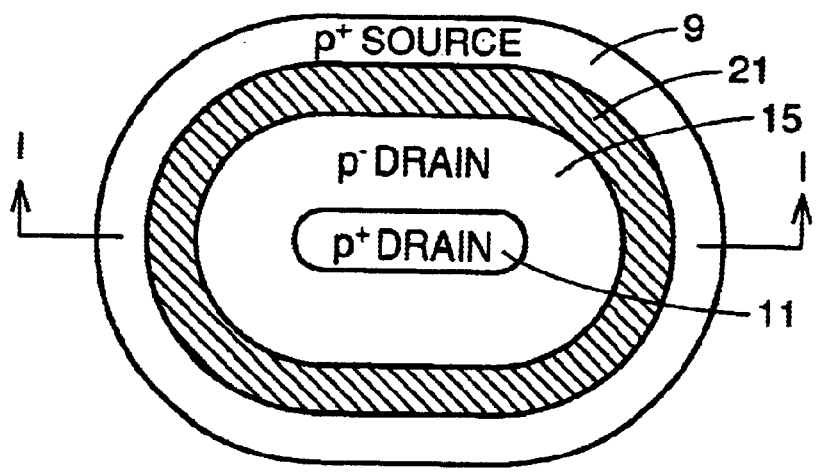
FIG. 2 shows a planar layout of source and drain layers in a p-ch MOS transistor of the embodiment 1 of the invention.

FIG. 1 shows a section taken along line I–I in FIG. 2.

Figure 3:
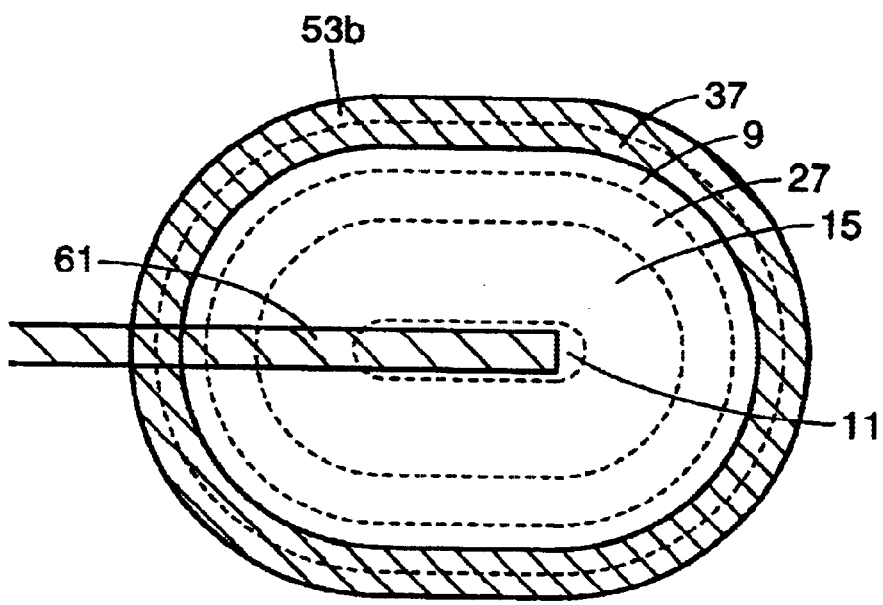
FIG. 3 shows a planar layout showing a source leading interconnection layer and a drain leading interconnection layer together with the structure in FIG. 2.

Referring to FIGS. 1 to 3, a high resistance n-type base layer 5 is formed on a surface of a silicon substrate 1 with an insulating layer 3 made of a silicon oxide film ($SiO_2$ film) therebetween. High resistance n-type base layer 5 is electrically divided by trench isolation formed of trenches 63 into regions of a p-ch MOS transistor, an nMOS transistor and pMOS transistor. An oxide film 65 is formed at each side wall of trenches 63, and interiors thereof are filled with polycrystalline silicon 67. A field oxide film 69 is located on each trench 63.

P-ch MOS transistor 30 has a $p^+$ source layer 9, a $p^+$ drain layer 11, a p-type buffer layer 13, a $p^-$ drain layer 15, a gate oxide film 19 and a gate electrode layer 21.

$P^+$ source layer 9 is formed at an n-type base layer 7 formed at the surface of high resistance n-type base layer 5, and is adjacent to a heavily doped n-type layer 17. $P^+$ drain layer 11 is formed at a p-type buffer layer 13 formed at the surface of high resistance n-type base layer 5. $P^-$ drain layer 15 is formed immediately under field oxide film 69 and is in contact with p-type buffer layer 13. Gate electrode layer 21 is formed on a surface between $p^+$ source layer 9 and $p^-$ drain layer 15 with gate oxide film 19 therebetween. Gate electrode layer 21 is formed of, e.g., a two-layer structure including a doped polycrystalline silicon layer 21a and a tungsten silicide layer 21b.

Referring particularly to FIG. 2, $p^+$ source layer 9 surrounds the periphery of $p^+$ drain layer 11, and has, for example, an elliptical planar form. $P^-$ drain layer 15 also has an elliptical planar form. Gate electrode layer 21 is also formed inside the inner periphery of $p^+$ source layer 9, extending along $p^+$ source layer 9 of elliptical planar form. Thereby, the channel region of this p-ch MOS transistor 30 is formed as an elliptical ring inside the inner periphery of $p^+$ source layer 9.

Referring particularly to FIG. 1, a conductive layer 27 is formed on p-type buffer layer 13 with an oxide film 25 therebetween. Conductive layer 27 has a two-layer structure including, e.g., a doped polycrystalline silicon layer 27a and a tungsten silicide layer 27b. Side wall oxide films 23 and 29 are formed at side walls of gate electrode layer 21 and conductive layer 27, respectively.

NMOS transistor 40 has a pair of n-type source/drain layers 33, a gate oxide film 35 and a gate electrode layer 37. The paired source/drain layers 33 are formed at p-type well layer 31 on high resistance n-type base layer 5 and are spaced from each other by a predetermined distance. The pair of source/drain layers 33 each has an LDD (Lightly Doped Drain) structure formed of a two-layer structure including a relatively lightly doped $n^-$ impurity region and a relatively heavily doped $n^+$ impurity region. Gate electrode layer 37 is formed on a region between paired source/drain layers 33 with gate oxide film 35 therebetween. Gate electrode layer 37 is formed of a layered structure including, e.g., a doped polycrystalline silicon layer 37a and a tungsten silicide layer 37b. The side wall of gate electrode layer 37 is covered with a side wall oxide film 39.

PMOS transistor 50 has a pair of source/drain layers 43, a gate oxide film 45 and a gate electrode layer 47. The pair of p+ source/drain layers 43 are formed at a surface of an n-type well layer 41 on high resistance n-type base layer 5 and are spaced from each other by a predetermined distance. Gate electrode layer 47 is formed on a surface between paired p+ source/drain layers 43 with gate oxide film 45 therebetween. Gate electrode layer 47 has a two-layer structure including, e.g., a doped polycrystalline silicon layer 47a and a tungsten silicide layer 47b. The side wall of gate electrode layer 47 is covered with a side wall oxide film 49.

These regions are covered with a first interlayer insulating layer 51. First interlayer insulating layer 51 is provided with through holes 51a, 51b, 51c, 51d, 51e and 51g. A first interconnection layer 53a for a drain leading interconnection is formed for electrically connecting p+ drain layer 11 and conductive layer 27 through through holes 51a and 51g. A first interconnection layer 53b for a source leading interconnection is formed to electrically connect to p+ source layer 9 and heavily doped n-type layer 17 through through hole 51b. Further, a first interconnection layer 53c is formed to electrically connect to gate electrode layer 21 through through hole 51c.

First interconnection layers 53d are formed to electrically connect to n-type source/drain layers 33 through through holes 51d. Further, first interconnection layers 53e are formed electrically connect to p+ source/drain layers 43 through through holes 51e.

These first interconnection layers 51a, 51b, 51c, 51d and 51e are covered with second interlayer insulating layer 55. At a second interlayer insulating layer 55, a through hole 55a is formed. A second interconnection layer 57 is formed to electrically connect to first interconnection layer 53a through through hole 55a.

A third interlayer insulating layer 59 is formed to cover a second interconnection layer 57. At a third interlayer insulating layer 59, a through hole 59a is formed. A third interconnection layer 61 for a drain leading interconnection layer is formed to electrically connect to second interconnection layer 57 through through hole 59a.

Referring particularly to FIG. 3, first interconnection layer 53b is in contact with the surface of p+ source layer 9, which has, e.g., an elliptical form, around the entire circumference of the p+ source layer 9. Third interconnection layer 61 extends above first interconnection layer 53b with second and third interlayer insulating layers 55 and 59 therebetween, and crosses over first interconnection layer 53b in the plan view.

A method of manufacturing a semiconductor device of this embodiment will now be described below.

Figure 4:
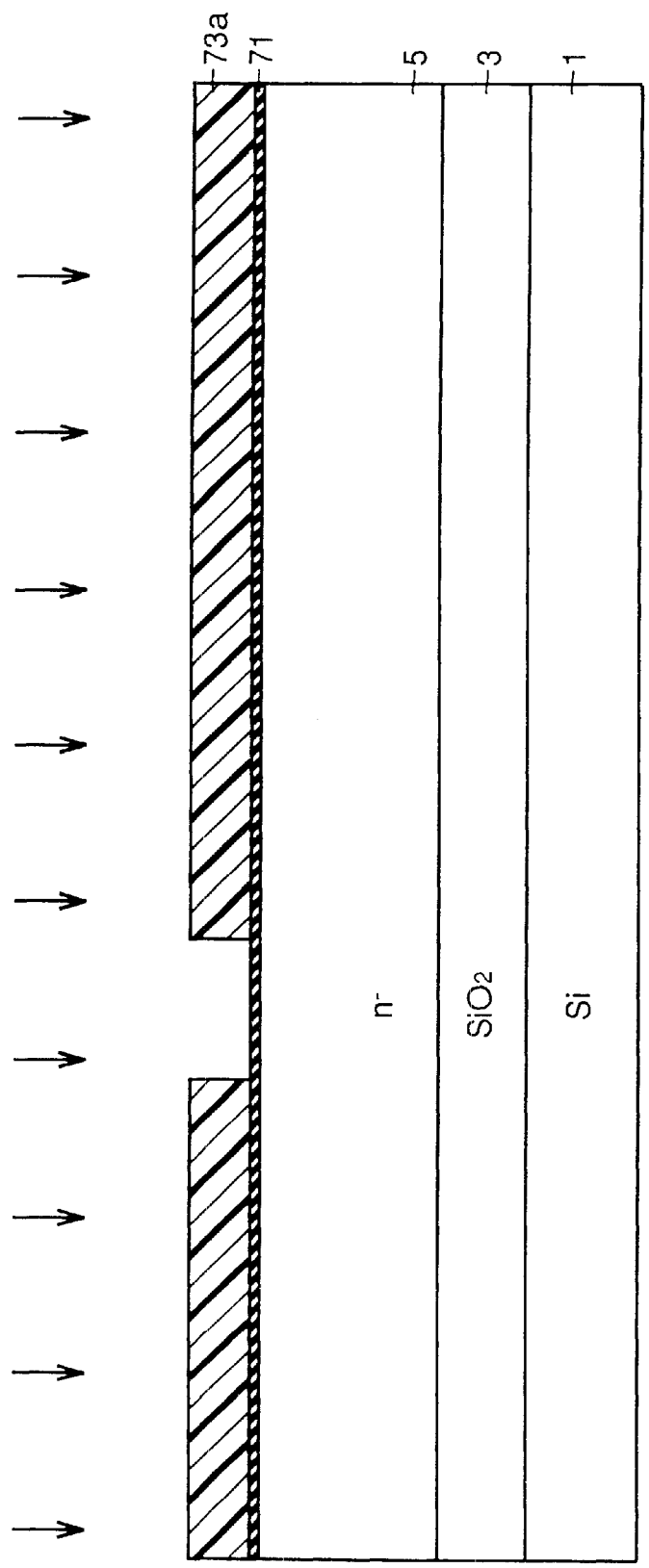
FIGS. 4 to 18 are schematic cross sections showing, in the order of steps, a method of manufacturing the semiconductor device of the embodiment 1 of the invention.

Referring first to FIG. 4, silicon substrate 1, insulating layer 3 made of the silicon oxide film, and high resistance n-type base layer 5 are formed, e.g., by a laminating SOI method or an SIMOX method. An oxide film 71 is formed on the entire surface of high resistance n-type base layer 5. Thereafter, a resist pattern 73a having an intended configuration is formed on oxide film 71 by ordinary photolithography. Ions of p-type impurity are implanted using resist pattern 73a as a mask. After removing resist pattern 73a, thermal processing is performed at 1215° C. for about 3 hours.

Figure 5:
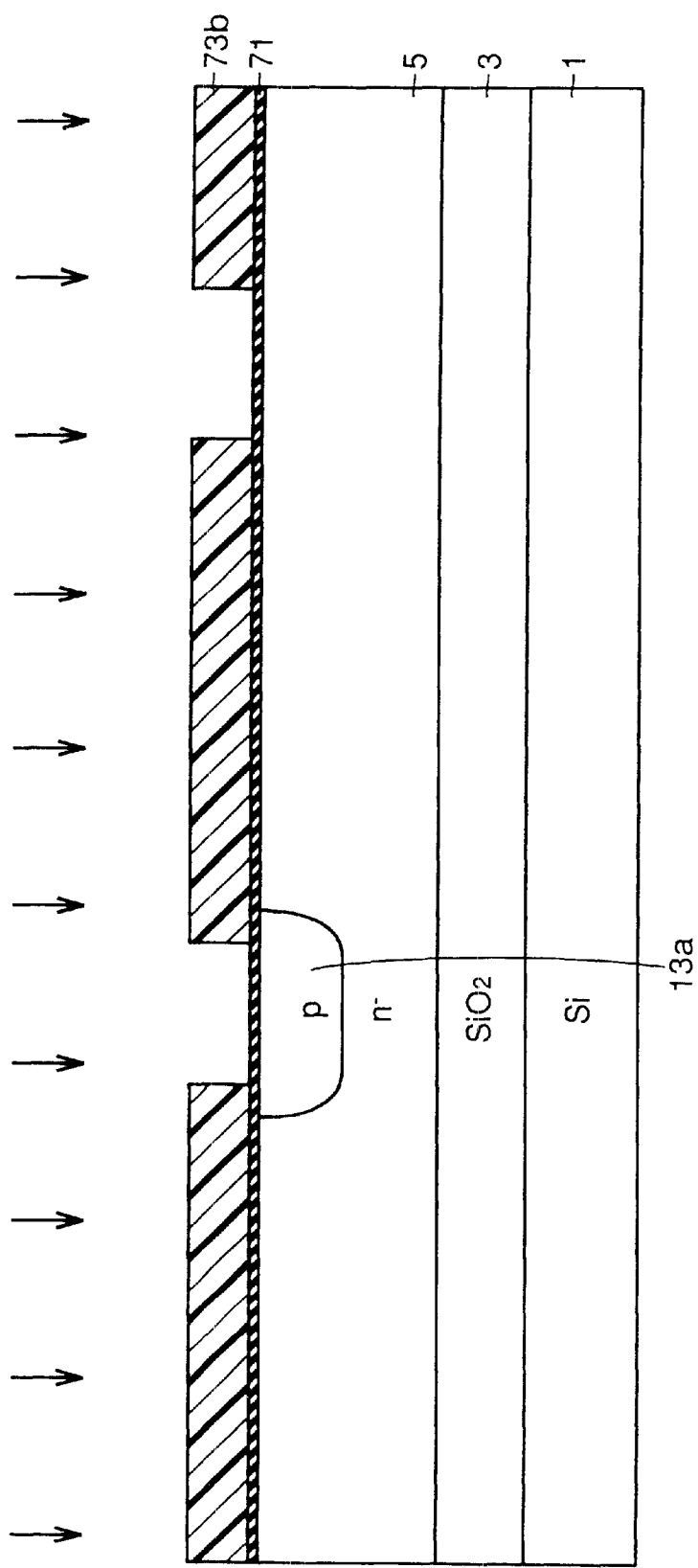

Referring to FIG. 5, this thermal processing forms p-type diffusion layer 13a at high resistance n-type base layer 5. A resist pattern 73b having hole patterns located on p-type diffusion layer 13a and other regions is formed on oxide film 71 by ordinary photolithography. Using resist pattern 73b as a mask, p-type impurity ions are implanted. After removing resist pattern 73b, thermal processing is performed at a temperature of 1050° C.

Figure 6:
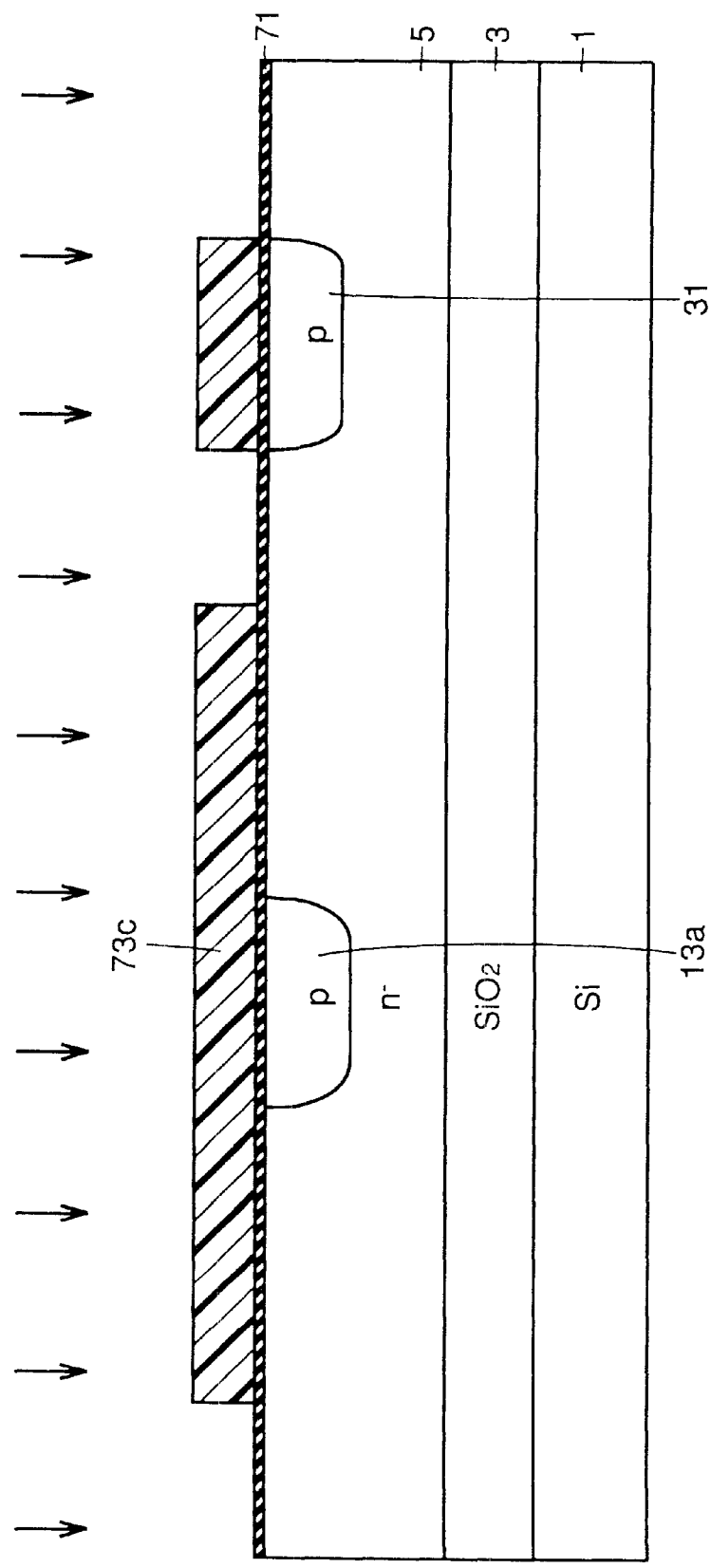

Referring to FIG. 6, this thermal processing forms p-type well layer 31 as well as p-type buffer layer 13 having a portion doped more heavily than p-type well layer 31. A resist pattern 73c having an intended configuration is formed on oxide film 71 by ordinary photolithography. Using resist pattern 73c as a mask, n-type impurity ions are implanted. After removing resist pattern 73c, predetermined thermal processing is performed.

Figure 7:
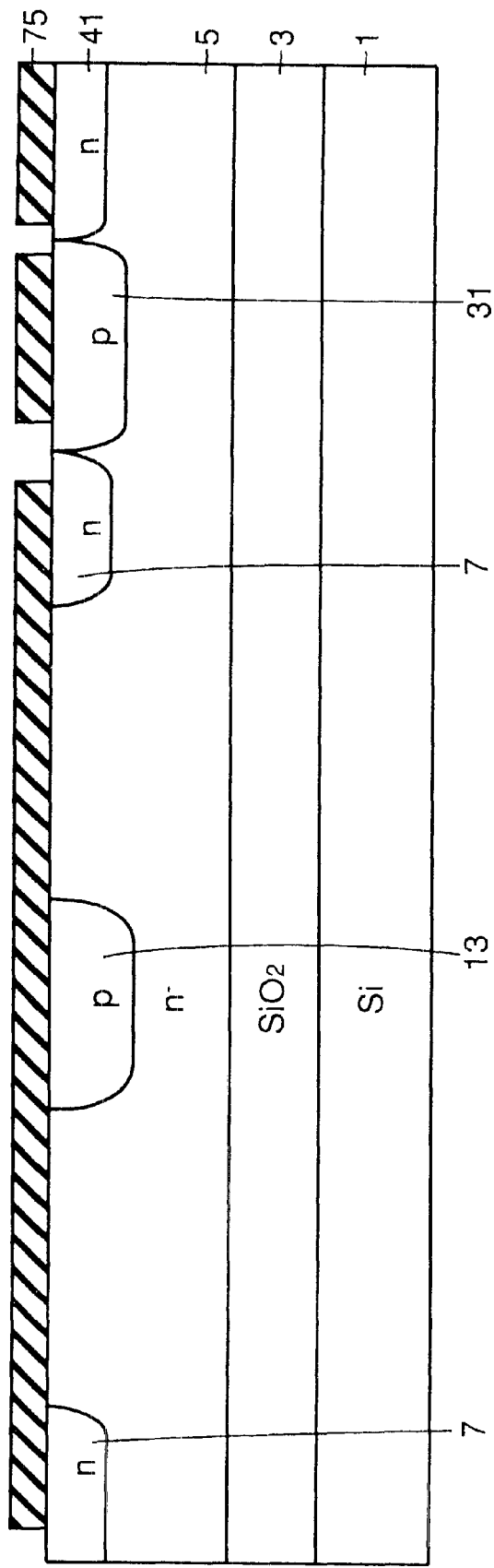

Referring to FIG. 7, by this thermal processing, n-type base layer 7 and n-type well layer 41 are formed at the surface of high resistance n-type base layer 5. Thereafter, an oxide film 75 is deposited on the entire surface. By ordinary photolithography and etching technique, portions of oxide film 75 at which trenches are to be formed are removed by etching. Using oxide film 75 as a mask, high resistance n-type base layer 5 is etched to reach insulating layer 3. Thereafter, oxide film 75 is removed by etching.

Figure 8:
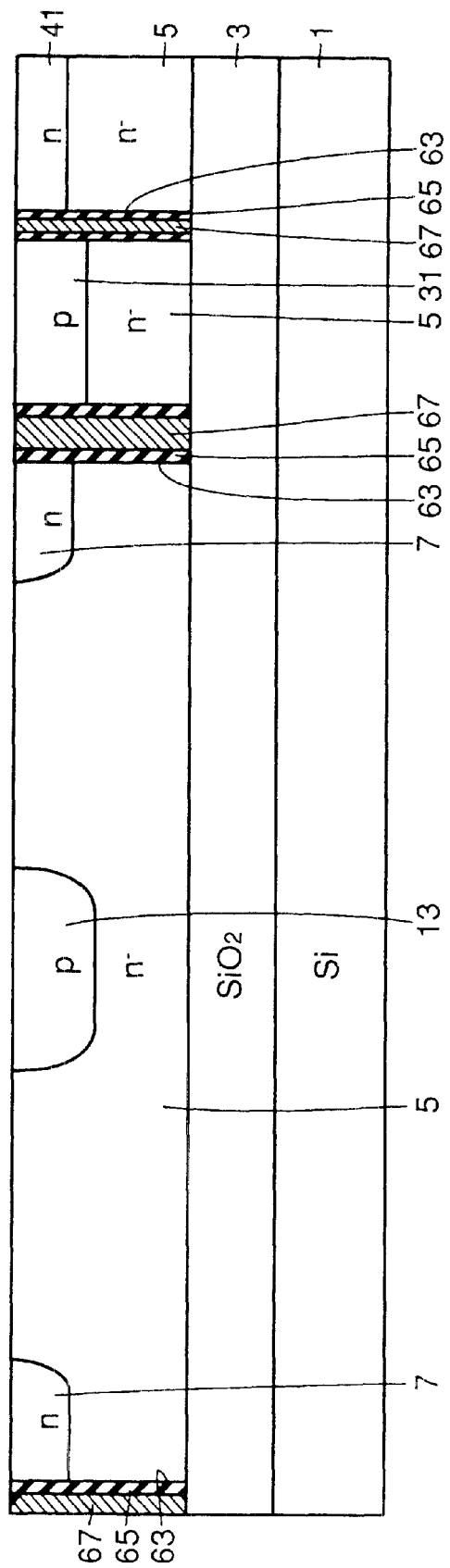

Referring to FIG. 8, this etching of the high resistance n type base layer 5 provides trenches 63 which extend through high resistance n-type base layer 5 to insulating layer 3. Oxide films 65 are formed at the side walls of trenches 63, and polycrystalline silicon layer 67 which will serve as fillers is deposited on the whole surface. Thereafter, the entire surface of polycrystalline silicon layer 67 is etched back, so that polycrystalline silicon layers 67 is left only in trenches 63.

Figure 9:
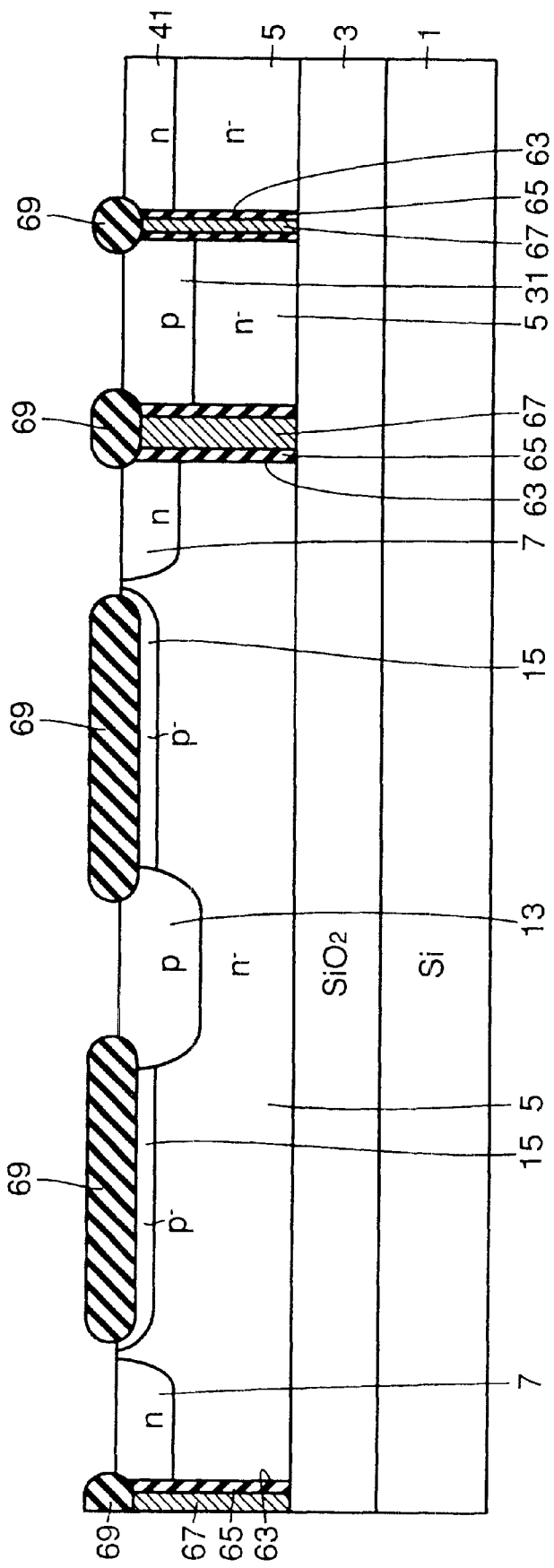

Although not shown in FIG. 9, an oxide film and a nitride film are deposited on the whole surface, and the nitride film is removed by etching from a region at which the field oxide film of the p-ch MOS transistor is to be formed, using a resist pattern as a mask, and then p-type impurity ions are implanted using the same resist pattern as a mask. After removing the resist pattern, the nitride film is selectively removed by etching from regions at which other field oxide films are to be formed, using a resist pattern as a mask. After removing this resist pattern, an ordinary LOCOS method is executed to form field oxide film 69 at intended positions. Simultaneously with formation of field oxide film 69, p− drain layer 15 is formed immediately under the field oxide film 69.

Figure 10:
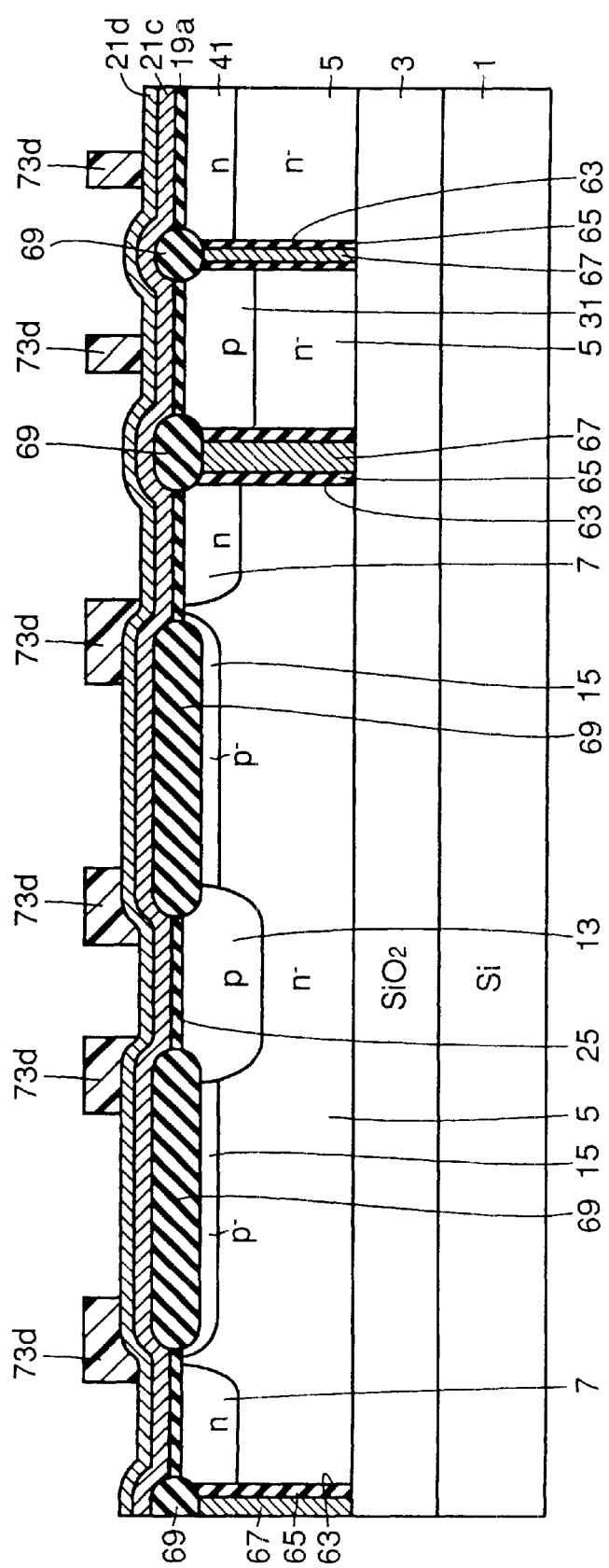

Referring to FIG. 10, after forming a gate oxide film 19a, a doped polycrystalline silicon layer 21c is deposited, and a tungsten silicide layer 21d is formed by sputtering. Then, a resist pattern 73d is formed at intended positions on tungsten silicide layer 21d by ordinary photolithography. Using resist pattern 73d as a mask, tungsten silicide layer 21d, doped polycrystalline silicon layer 21c and gate oxide film 19a are successively etched. Thereafter, resist pattern 73d is removed.

Figure 11:
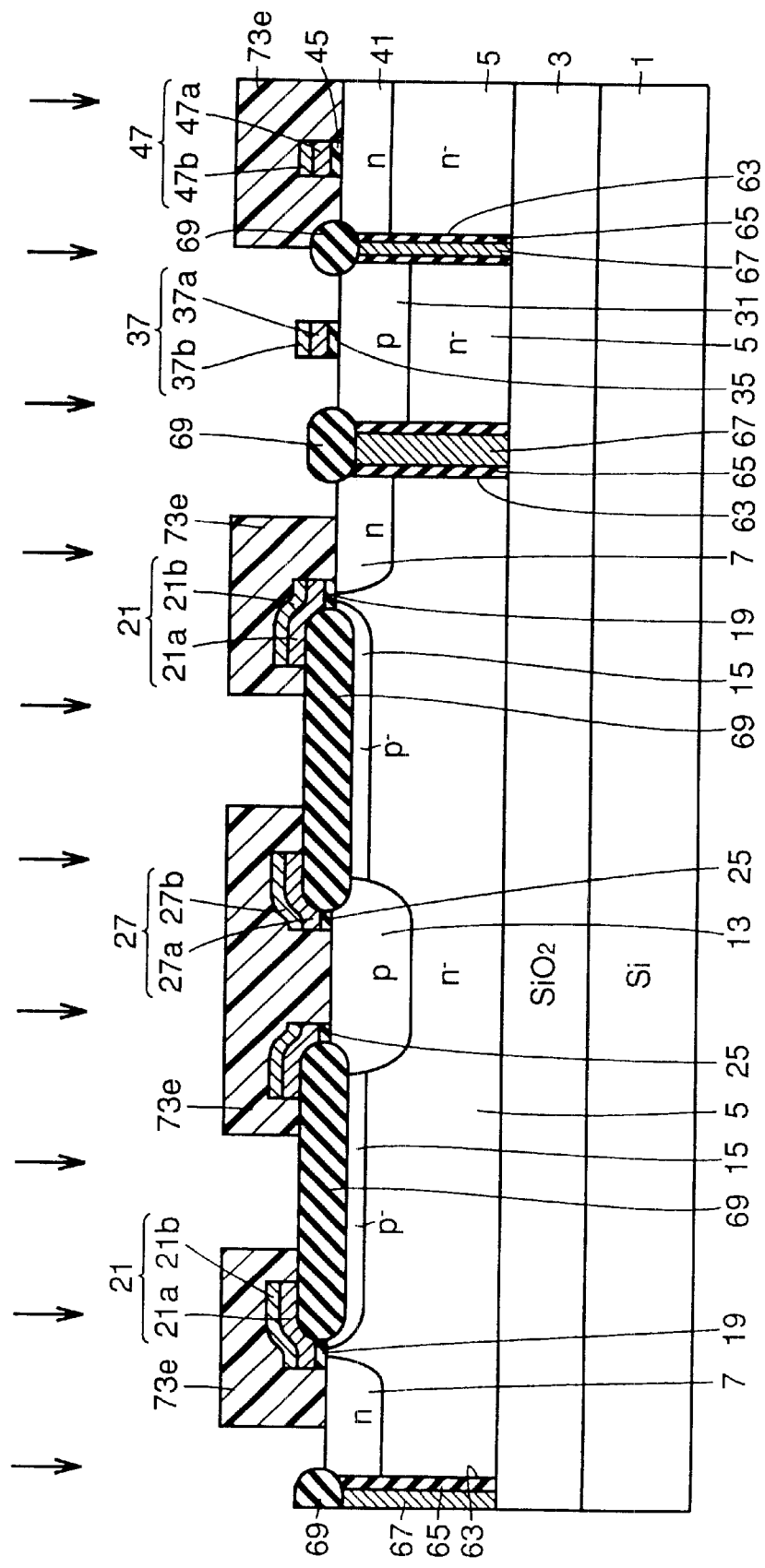

Referring to FIG. 11, the above etching forms respective gate oxide films 19, 25, 35 and 45, and also forms gate electrode layers 21, 37 and 47, which have layered structures including doped polycrystalline silicon layers 21a, 27a, 37a and 47a and tungsten silicide layers 21b, 27b, 37b and 47b, respectively, as well as field plate layer 27 formed of a layered structure including doped polycrystalline silicon layer 27a and tungsten silicide layer 27b. Thereafter, a resist pattern 73e is formed to cover intended regions by ordinary photolithography. Using resist pattern 73e as a mask, phosphorus (P) is ion-implanted. Thereafter, resist pattern 73e is removed.

Figure 12:
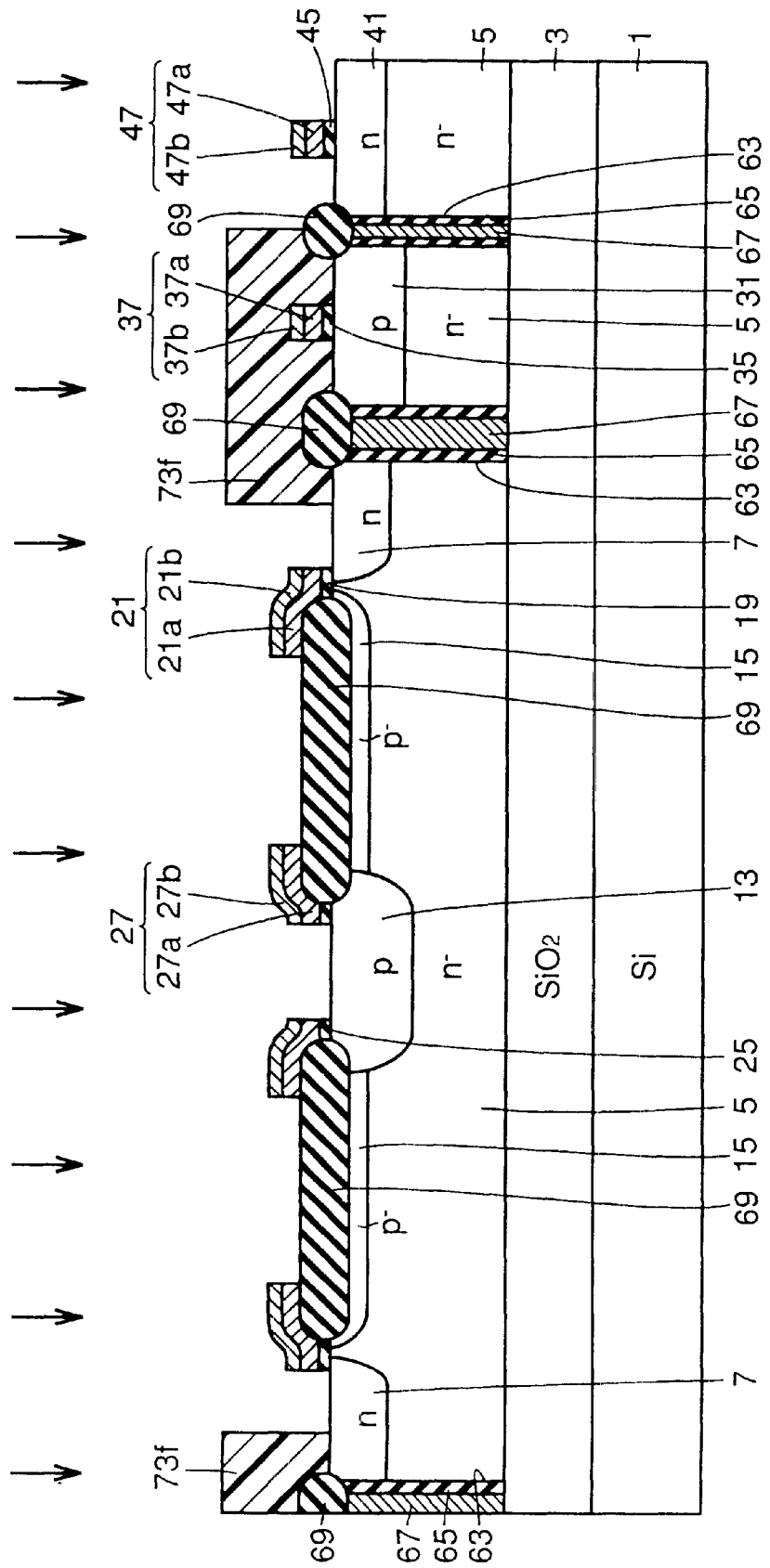

Referring to FIG. 12, the above ion implantation forms n-type lightly doped region (not shown) at intended regions. Thereafter, $BF_2$ is ion-implanted using resist pattern 73f, gate electrode layer and others as a mask. Thereafter, resist pattern 73f is removed.

Figure 13:
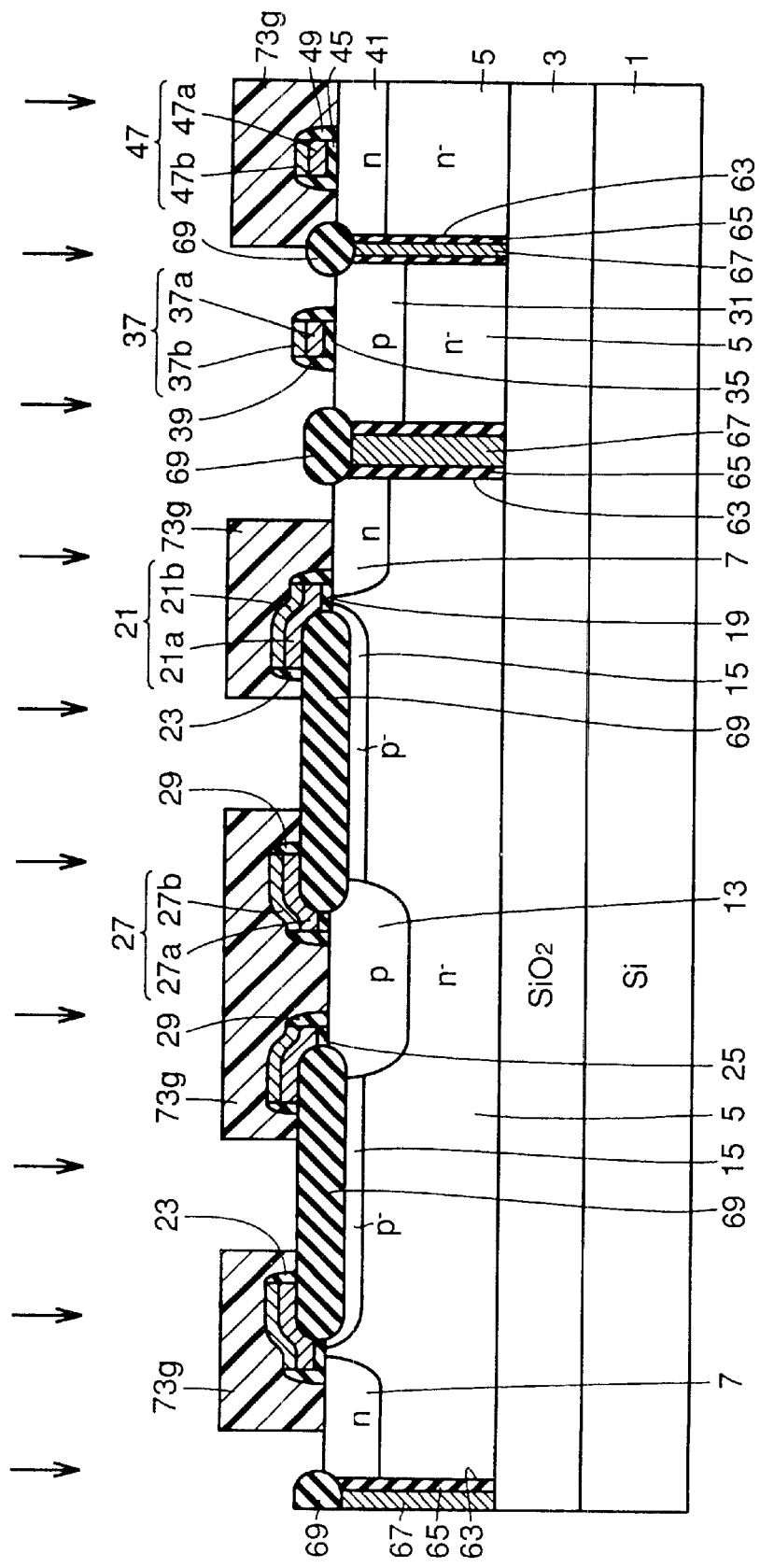

Referring to FIG. 13, the above ion implantation forms p-type lightly doped regions (not shown) at intended regions. Thereafter, an oxide film (not shown) having a film thickness of 250 nm is deposited on the whole surface. Anisotropic etching is effected on the oxide film to leave side wall oxide films 23, 29, 39, and 49 covering the side walls of gate electrodes and field plate electrode, respectively. Thereafter, a resist pattern 73g is formed. Arsenic is ion-implanted using resist pattern 73g, the respective gate electrode layers, side wall oxide films or the like as a mask. Then, resist pattern 73g is removed.

Figure 14:
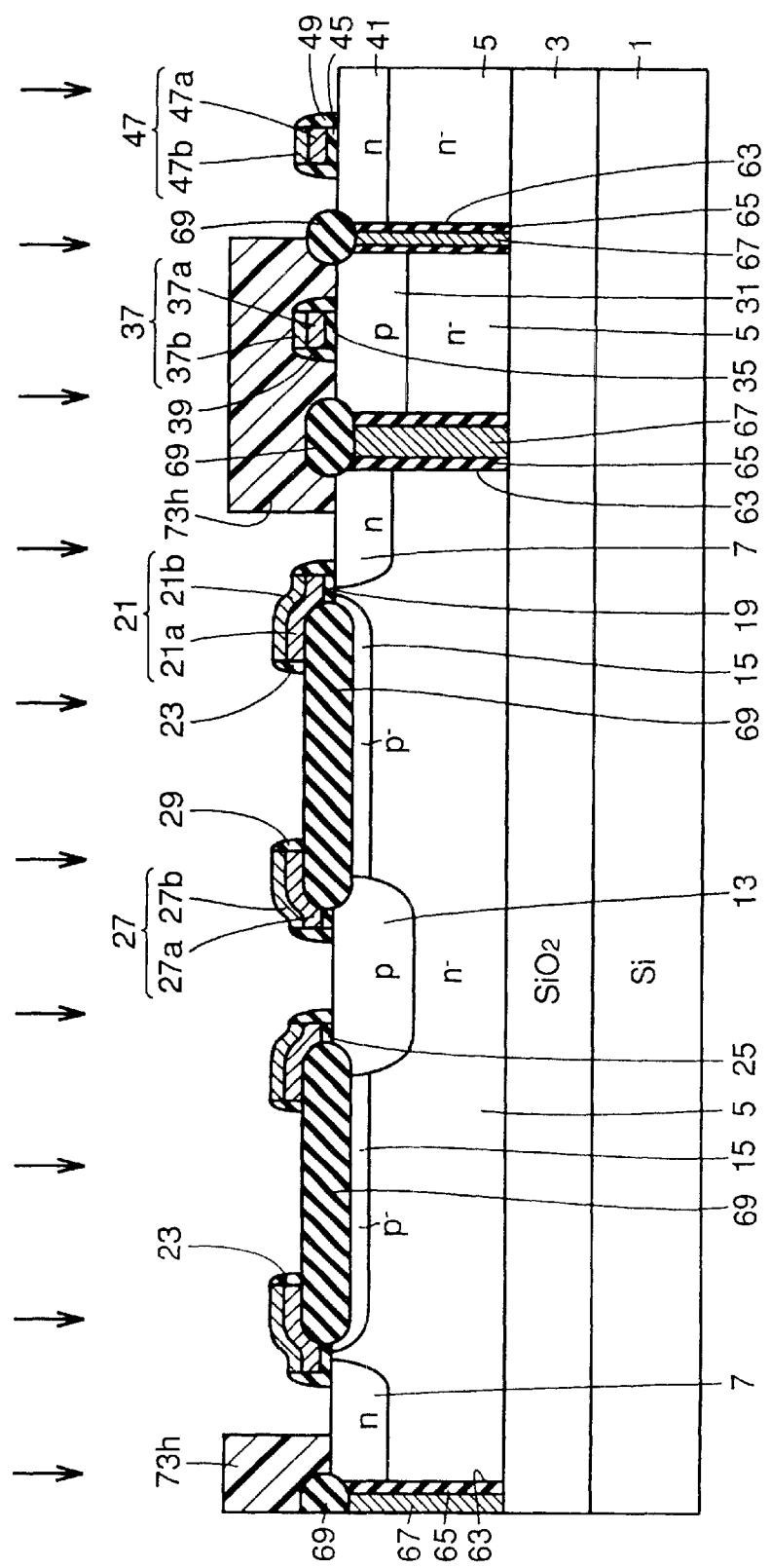

Referring to FIG. 14, the above ion-implantation forms n-type heavily doped regions (not shown). Thereafter, $BF_2$ is ion-implanted using a resist pattern 73h, gate electrode layers, side wall oxide films and others as a mask. This ion implantation forms p-type heavily doped regions (not shown). After removing resist pattern 73h, thermal processing is performed.

Figure 15:
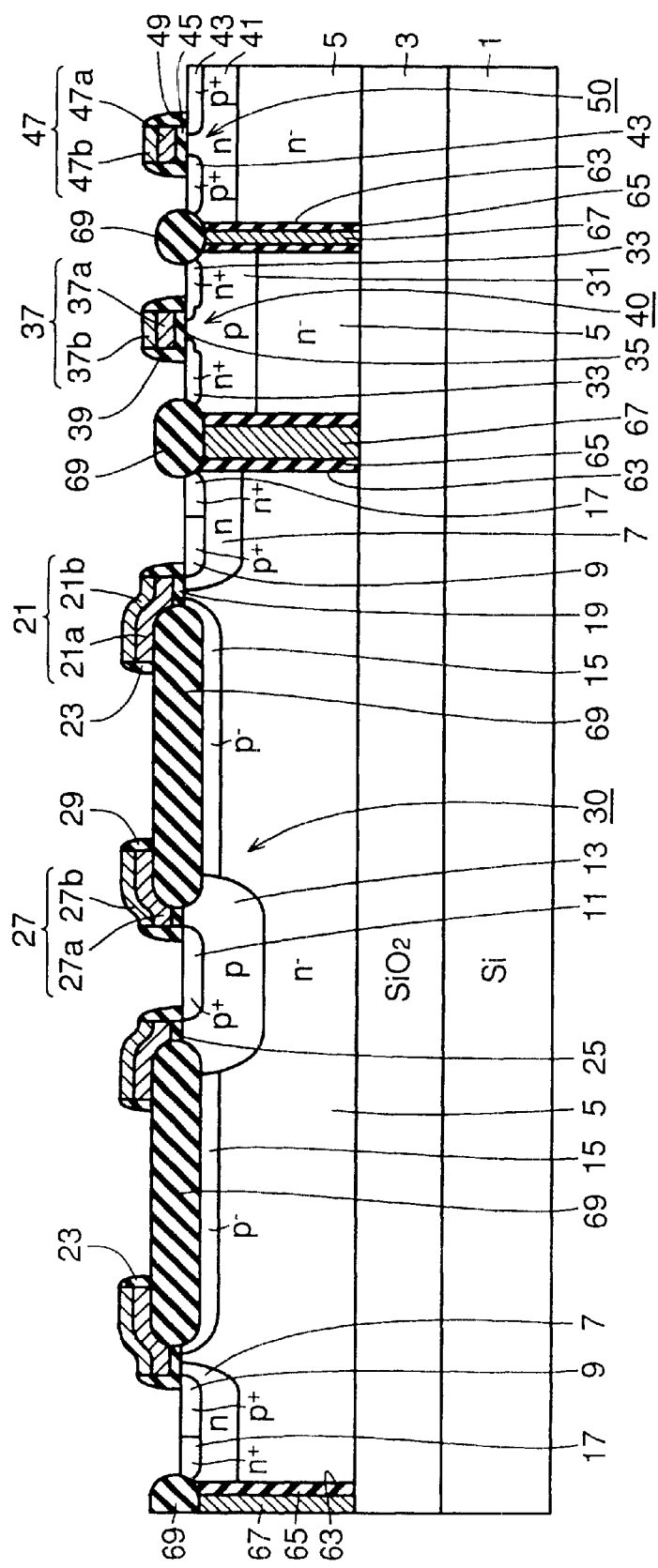

Referring to FIG. 15, the above thermal processing activates the impurity implanted into the respective regions, and thus forms $p^+$ source layer 9, $p^+$ drain layer 11, heavily doped n-type layer 17, paired n-type source/drain layers 33 and paired p-type source/drain layers 43. Thereby, p-ch MOS transistor 30, nMOS transistor 40 and pMOS transistor 50 are completed.

Figure 16:
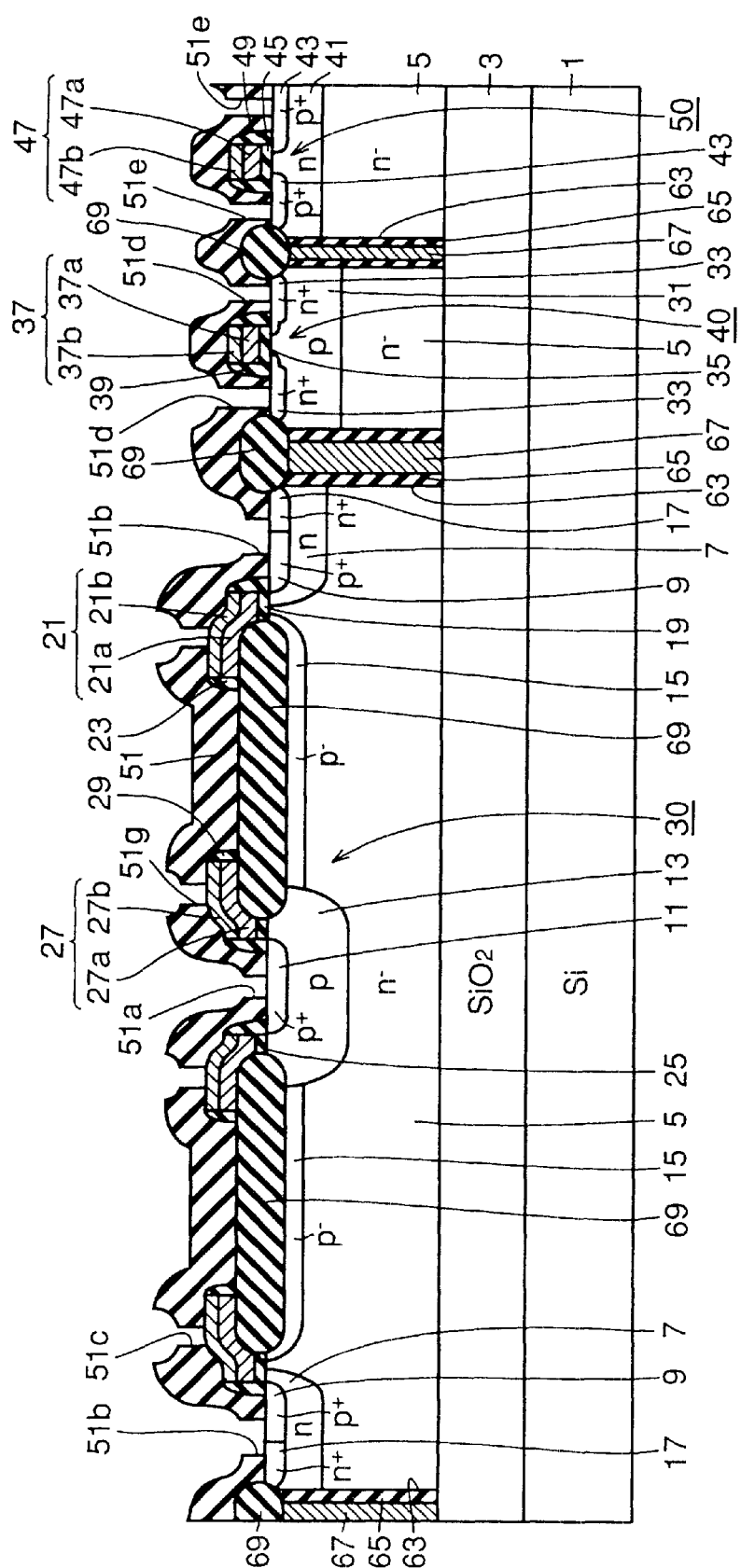

Referring to FIG. 16, first interlayer insulating layer 51 is deposited on the whole surface, and through holes 51a, 51b, 51c, 51d, 51e and 51g are formed by the ordinary photolithography and etching techniques.

Figure 17:
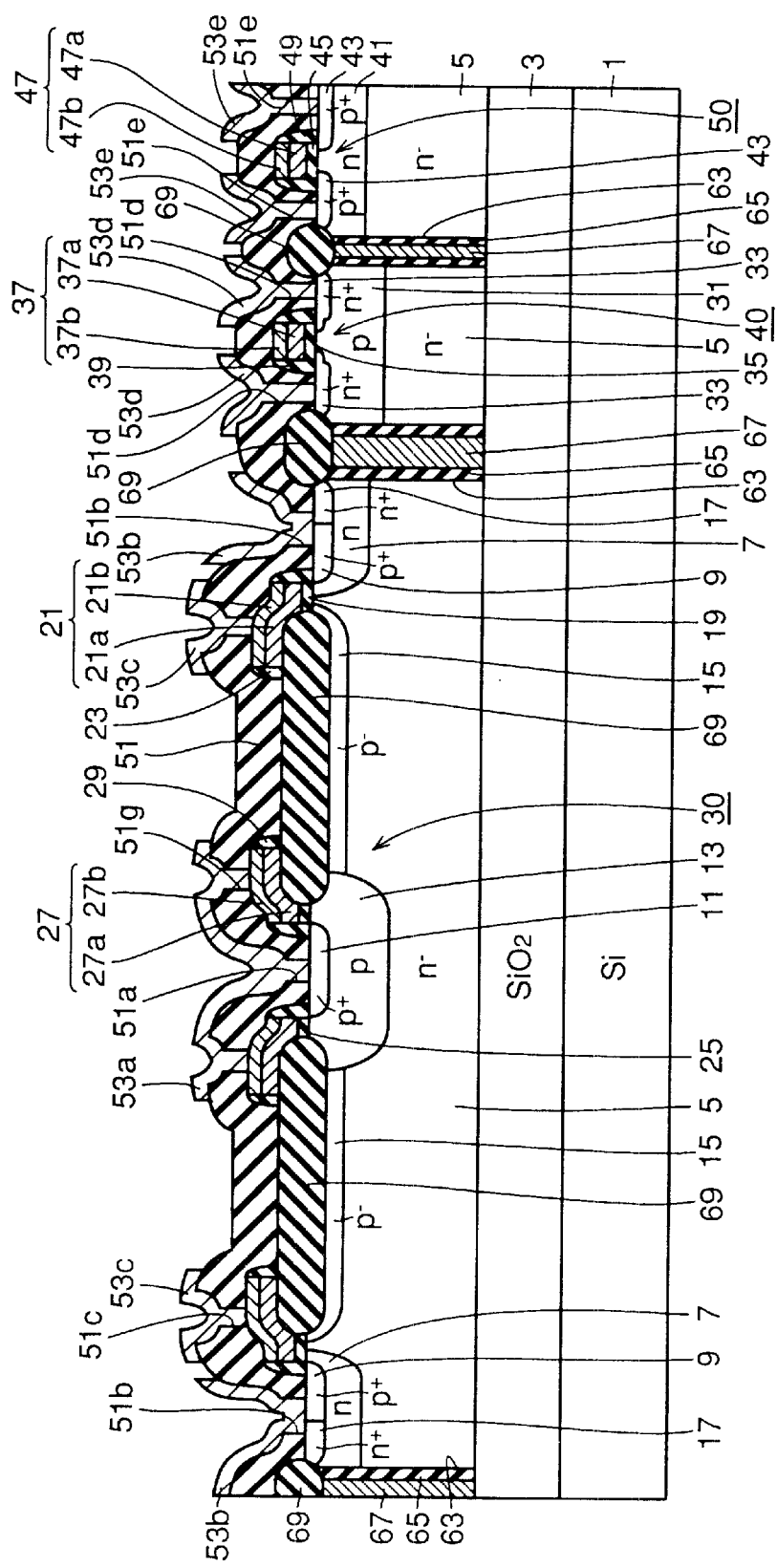

Referring to FIG. 17, processing is performed to form first interconnection layers 53a, 53b, 53c, 53d and 53e which are patterned into intended configurations and are electrically connected to underlying layers through the corresponding through holes.

Figure 18:
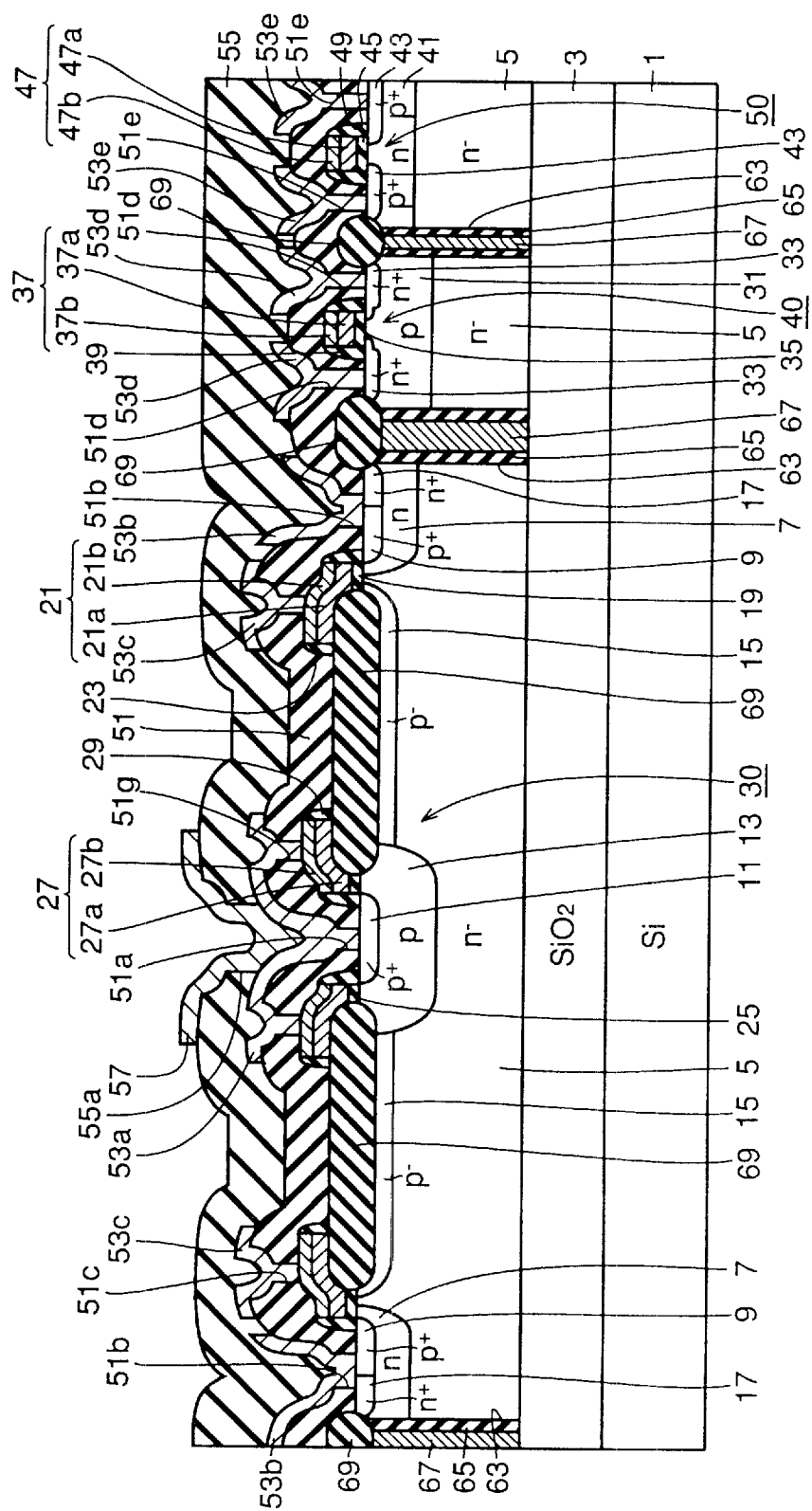

Referring to FIG. 18, second interlayer insulating layer 55 is formed to cover the first interconnection layers. Through hole 55a is formed at second interlayer insulating layer 55 by the ordinary photolithography and etching technique. A processing is performed to form second interconnection layer 57 electrically connected to first interconnection layer 53a through through hole 55a. In a similar manner, third interlayer insulating layer 59, through hole 59a and third interconnection layer 61 are then formed, so that the semiconductor device shown in FIG. 1 is completed.

Through the manufacturing steps described above, the p-ch MOS transistor and the CMOS transistor are formed on the same substrate.

The semiconductor device of this embodiment has a planar layout structure (outside source structure) in which $p^+$ source layer 9 surrounds peripheries of drain layers 11, 13 and 15 as shown particularly in FIG. 2. Therefore, the resistance of the $p^+$ inverted layer immediately under the gate electrode can be low, and the current drive performance can be improved as compared with the prior art. The structure shown in FIG. 2 may be referred to as a source electrode surround drain structure, as the source leading interconnection layer 51b is positioned at the outer periphery of the drain layer.

This embodiment does not employ pn junction isolation but employ trench isolation using trenches 63 for electrically isolating the p-ch MOS transistor from other elements such as a CMOS transistor. Owing to employment of the trench isolation, it is possible to prevent flow of a current from $p^+$ source layer 9 toward silicon substrate 1 during operation of the element, even if $p^+$ source layer 9 is disposed near trench 63 for trench isolation. Therefore, it is not necessary to dispose trench 63 for trench isolation at a radially outer position remote from $p^+$ source layer 9, which may be required for improving the isolating performance in the prior art.

As described above, the semiconductor device of this embodiment can have a high current drive capacity and is suitable to high integration.

As shown in FIG. 1, this embodiment employs the multilayer interconnection structure, whereby the source leading interconnection layer 53b and drain leading interconnection layer 61 are formed on different insulating layers. Therefore, as shown particularly in FIG. 3, drain leading interconnection layer 61 can be extended to another element region while keeping electrical isolation with respect to source leading interconnection layer 53b even in the structure in which source leading interconnection layer 53b has an elliptical planar form.

Source leading interconnection layer 53b can be in contact with the surface of $p^+$ source layer 9 around the entire circumference of $p^+$ source layer 9 as shown in FIG. 3. Therefore, a large contact area can be ensured between $p^+$ source layer 9 and source leading interconnection layer 53b, and thus a source contact resistance can be small.

Source leading interconnection layer 53b may be made of a material of a small resistance such as aluminum. Thereby, a current can be supplied to the entire circumference of $p^+$ source layer 9 through source leading interconnection layer 53b of a low resistance. Therefore, the current can be supplied to the entire circumference of $p^+$ source layer 9 with a smaller resistance than the case where the current is supplied to the entire circumference of $p^+$ source layer 9 via $p^+$ source layer 9 having a relatively high resistance.

The above structure can be applied to power devices of a high breakdown voltage such as an n-ch MOS transistor, n-ch IGBT and p-ch IGBT. An example in which the above structure is applied to an n-ch IGBT will be described below as an embodiment 2.

Embodiment 2

Figure 19:
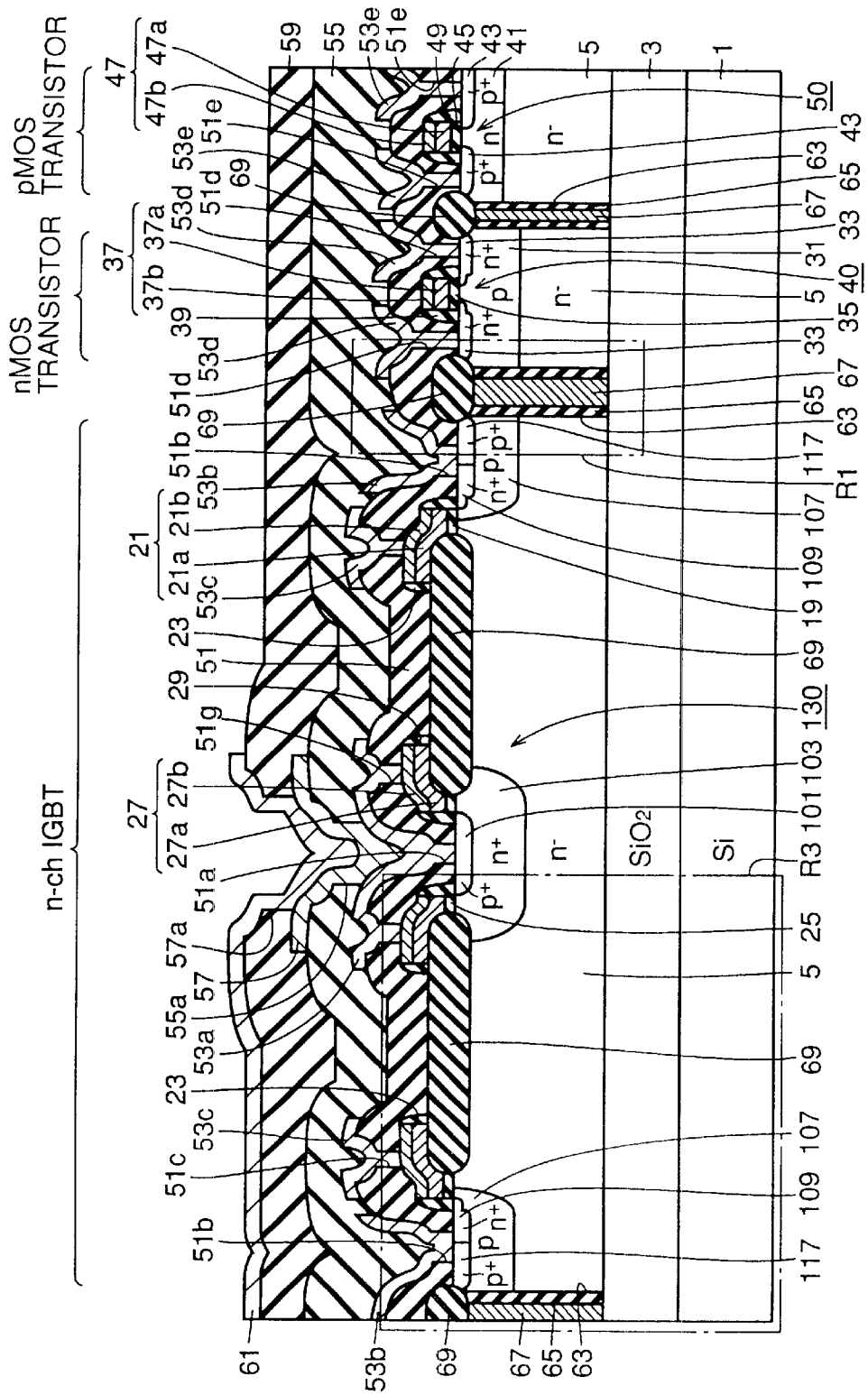
FIG. 19 is a cross section schematically showing a structure of a semiconductor device of an embodiment 2 of the invention.

FIG. 19 to be discussed below shows a section taken along line XIX–XIX in FIG. 20.

Figure 20:
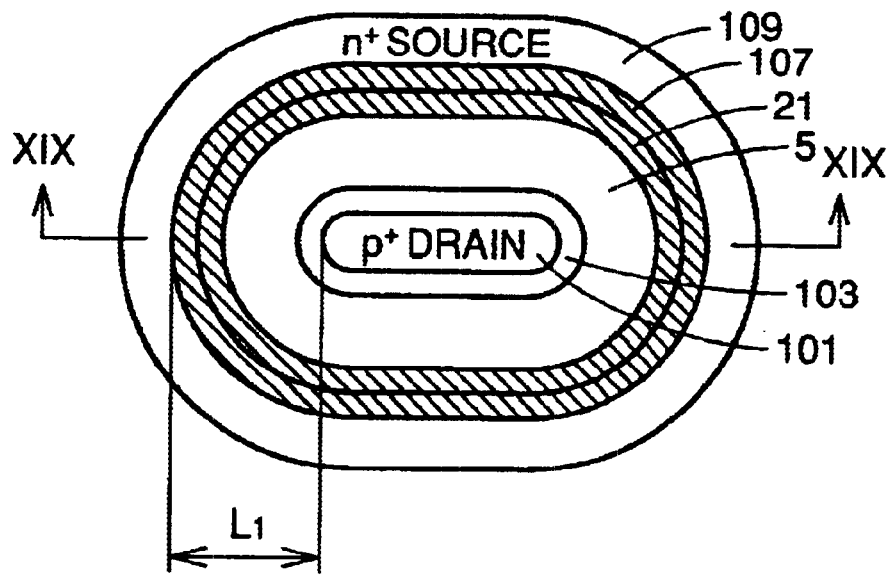
FIG. 20 shows a planar layout of a drain layer and a source layer in an n-ch IGBT of the embodiment 2 of the invention.
Figure 21:
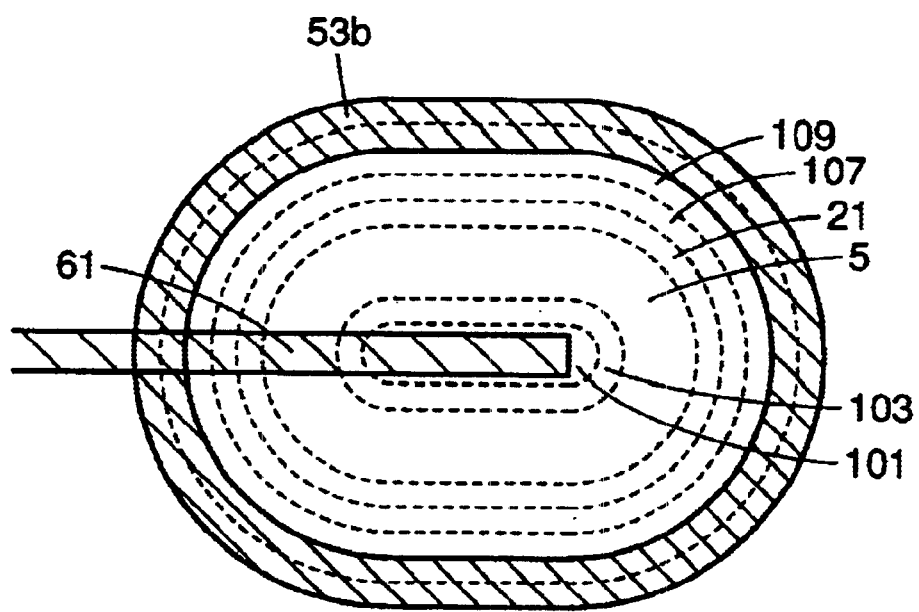
FIG. 21 shows a planar layout showing a drain leading interconnection layer and a source leading interconnection layer together with the structure in FIG. 20.

Referring to FIGS. 19 to 21, high resistance n-type base layer 5 is formed on the surface of silicon substrate 1 with insulating layer 3 made of, e.g., a silicon oxide film therebetween. High resistance n-type base layer 5 is electrically divided by trench isolation formed of trenches 63 into n-ch IGBT formation region, nMOS transistor formation region and pMOS transistor formation region.

N-ch IGBT 130 has high resistance n-type base layer 5, a $p^+$ drain layer 101, an $n^+$ buffer layer 103, a p-type base layer 107, an $n^+$ source layer 109, gate oxide film 19 and gate electrode layer 21. $N^+$ source layer 109 is formed in a region of $p^+$ base layer 107 formed at the surface of high resistance n-type base layer 5 and is adjacent to heavily doped p-type layer 117. $P^+$ drain layer 101 is formed in a region of $n^+$ buffer layer 103 formed at the surface of high resistance n-type base layer 5. Gate electrode layer 21 is formed on the surfaces of p-type base layer 107 and high resistance n-type base layer 5 with gate oxide film 19 therebetween.

Conductive layer 27 is formed on $n^+$ buffer layer 103 with insulating film 25 therebetween.

In the n-ch IGBT, p+ drain layer 101 corresponds to an anode (collector), and n+ source layer 109 corresponds to a cathode (emitter). The same applies to the following description.

Referring particularly to FIG. 20, n+ source layer 109 surrounds the periphery of p+ drain layer 101, and has, for example, an elliptical planar form.

Referring particularly to FIG. 21, source leading interconnection layer 53b is in contact with the surface of n+ source layer 109 through the entire circumference of n+ source layer 109 having, e.g., an elliptical form. Third interconnection layer 61 is located on source leading interconnection layer 53b with second and third interlayer insulating layers 55 and 59 therebetween, and crosses over source leading interconnection layer 53b in a plan view. Source leading interconnection layer 53b is also connected electrically to heavily doped p-type layer 117.

Structures other than the above are substantially the same as those of the embodiment 1 described above. Therefore, the same portions and members bear the same reference numbers, and will not be described below.

A method of manufacturing the semiconductor device of this embodiment will be described below.

Figure 22:
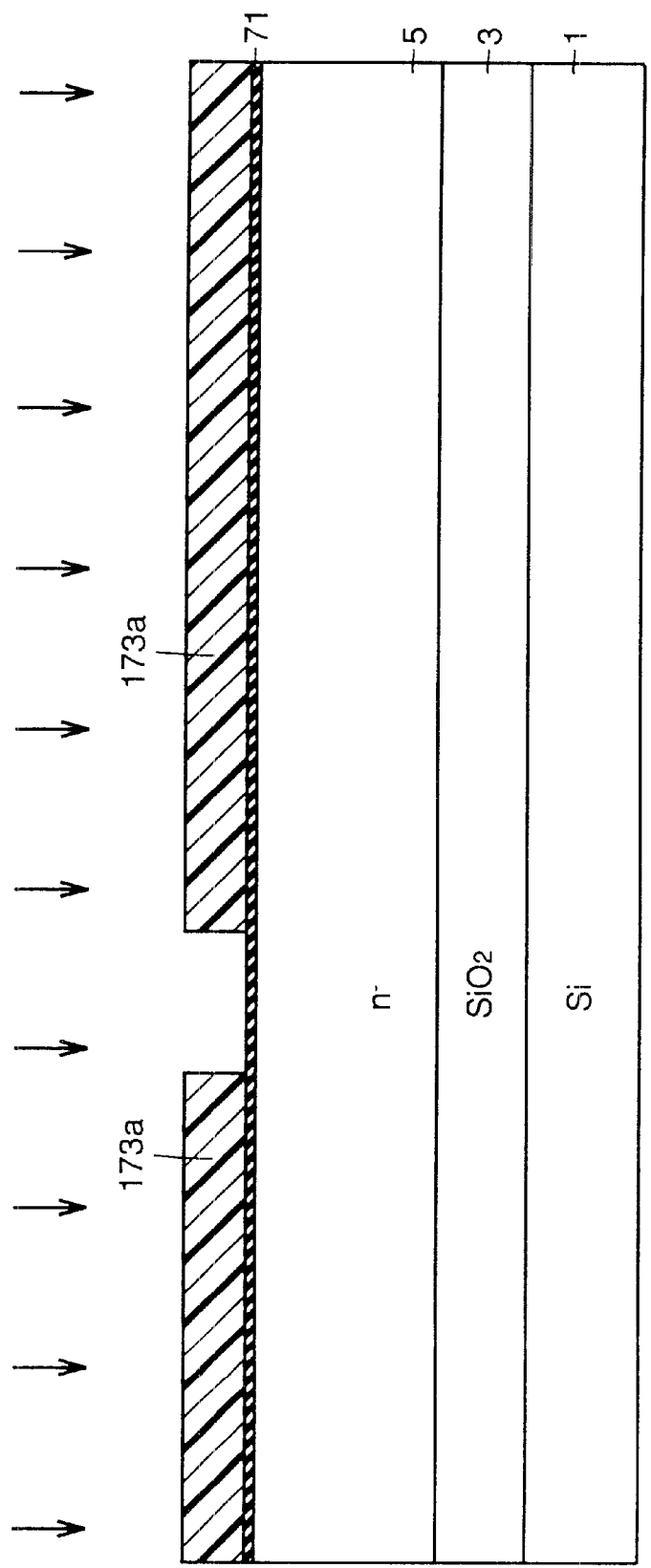
FIGS. 22 to 36 are schematic cross sections showing, in the order of steps, a method of manufacturing the semiconductor device of the embodiment 2 of the invention.

Referring first to FIG. 22, silicon substrate 1, insulating layer 3 made of, e.g., the silicon oxide film and high resistance n-type base layer 5 are formed, e.g., by a laminating SOI method or an SIMOX method. Oxide film 71 is formed on the whole surface of high resistance n-type base layer 5. A resist pattern 173a having an intended configuration is formed on oxide film 71 by ordinary photolithography. Ions of n-type impurity are implanted using resist pattern 173a as a mask. After removing resist pattern 173a, thermal processing is performed at 1215° C. for about 3 hours.

Figure 23:
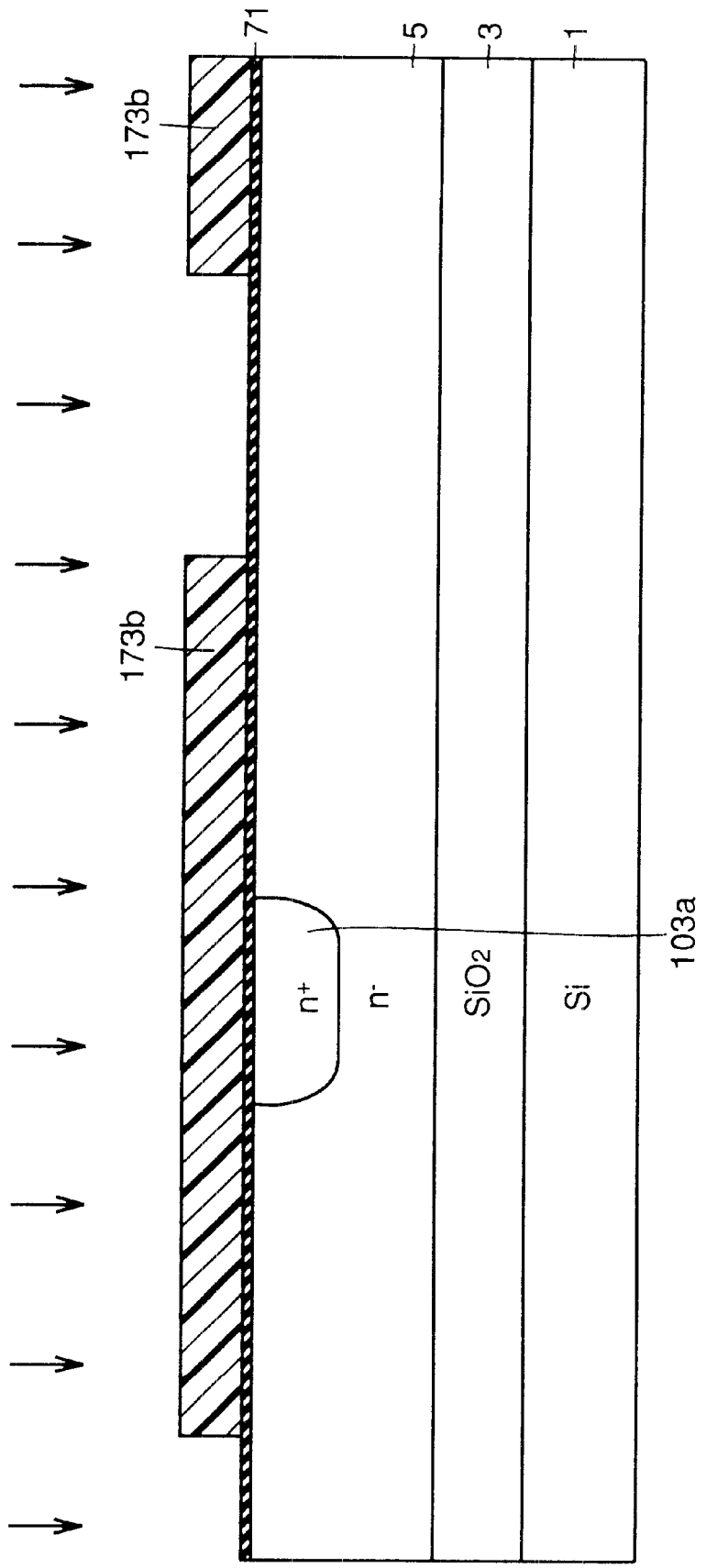

Referring to FIG. 23, this thermal processing forms an n-type diffusion layer 103a. A resist pattern 173b having an intended configuration is formed on oxide film 71 by ordinary photolithography. Using resist pattern 173b as a mask, p-type impurity ions are implanted. After removing resist pattern 173b, thermal processing is performed at 1050° C.

Figure 24:
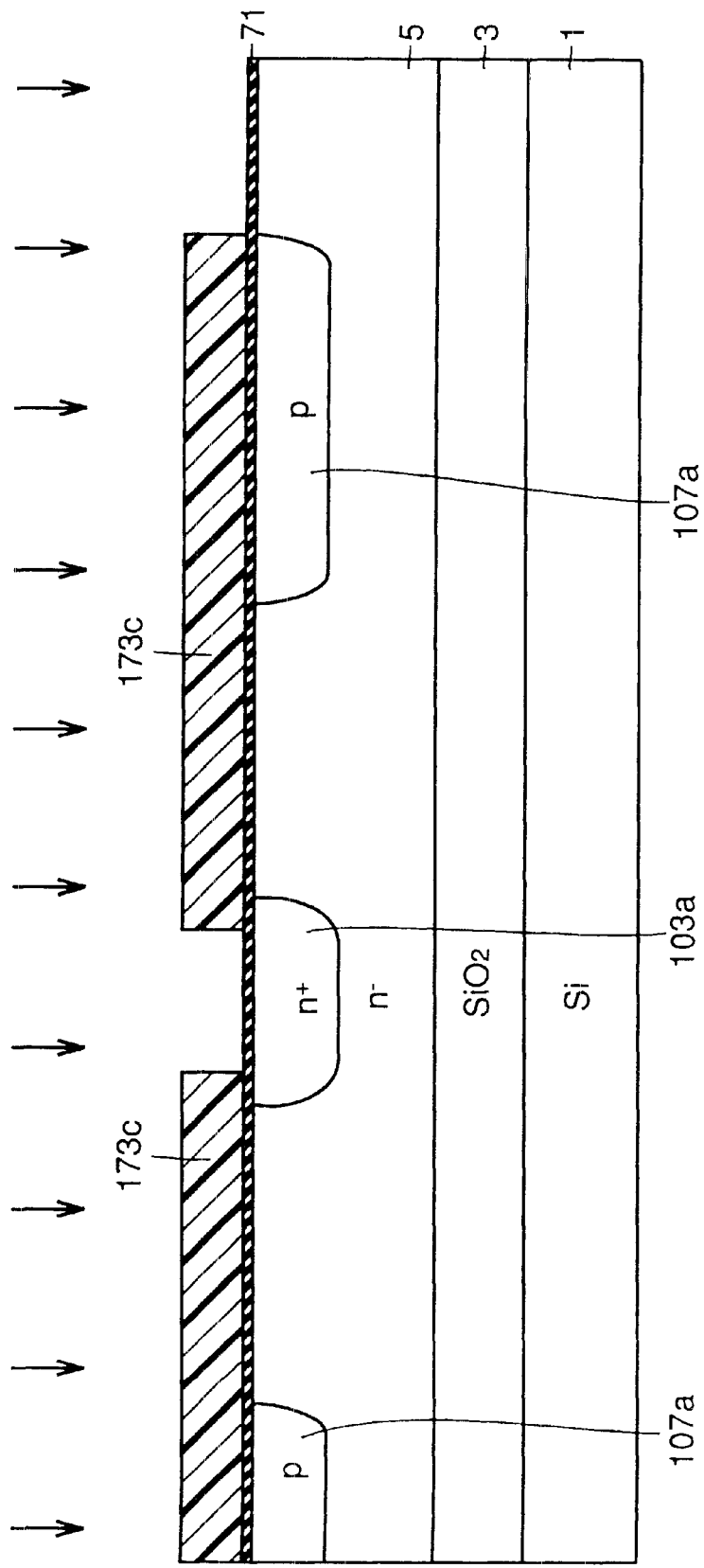

Referring to FIG. 24, this thermal processing forms a p-type well layer 107a having, e.g., a planar shape of an elliptical ring. A resist pattern 173c having an intended configuration is formed on oxide film 71. Using resist pattern 173c as a mask, n-type impurity ions are implanted. After removing resist pattern 173c, thermal processing is performed at a temperature of 1050° C.

Figure 25:
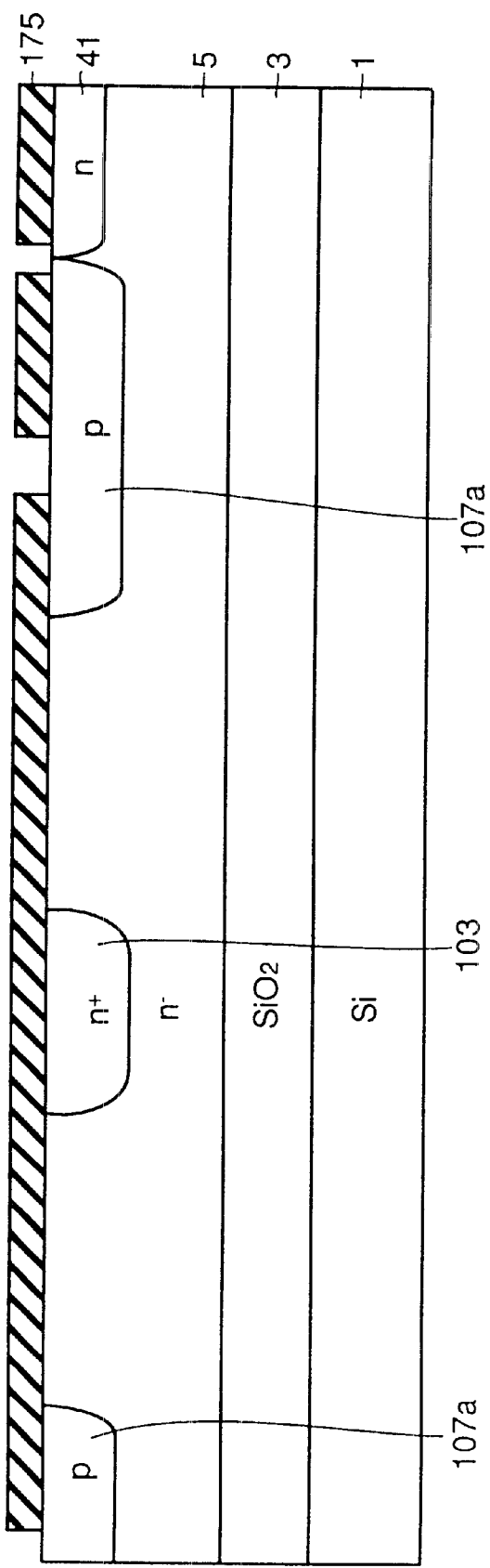

Referring to FIG. 25, the above thermal processing forms n-type well layer 41 as well as n+ buffer layer 103 having a portion of a higher concentration than n+ well layer 41. An oxide film 175 is formed on the entire surface. Oxide film 175 is etched to remove portions at which trenches or trenches are to be formed. Using oxide film 175 as a mask, high resistance n-type base layer 5 and others are etched to form removed portions reaching insulating layer 3. Thereafter, oxide film 175 is removed by etching.

Figure 26:
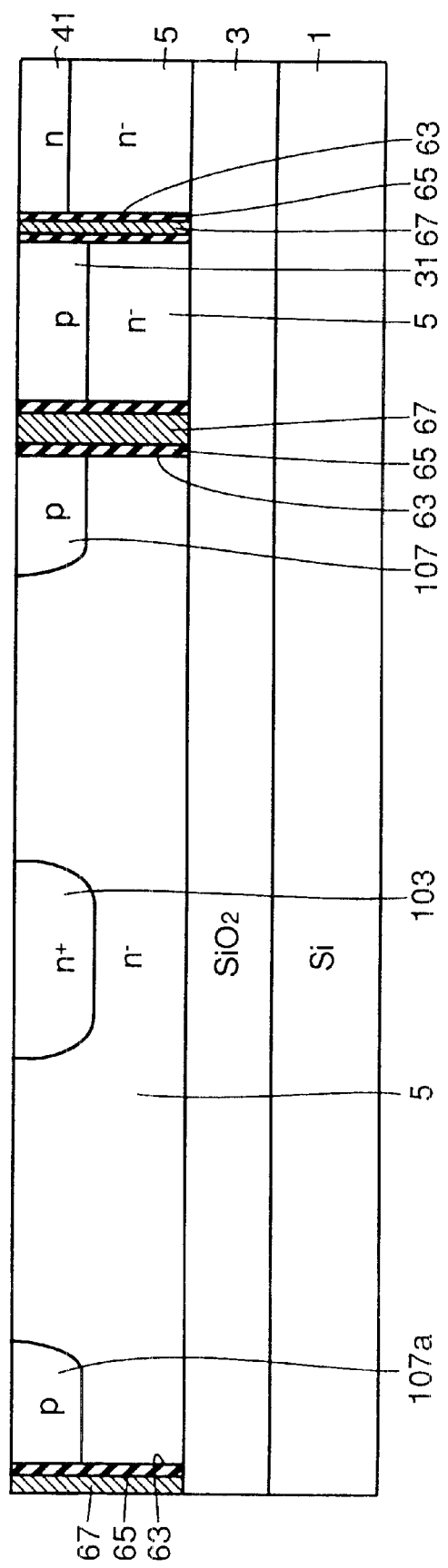

Referring to FIG. 26, this etching effected on high resistance n-type base layer 5 forms a plurality of trenches 63 which extend through high resistance n-type base layer 5 to insulating layer 3. Oxide films 65 are formed at the side walls of trenches 63, and polycrystalline silicon layer 67 which will form fillers is deposited on the whole surface. Thereafter, etchback is effected on the entire surface of polycrystalline silicon layer 67, so that polycrystalline silicon layers 67 remain only in trenches 63.

Figure 27:
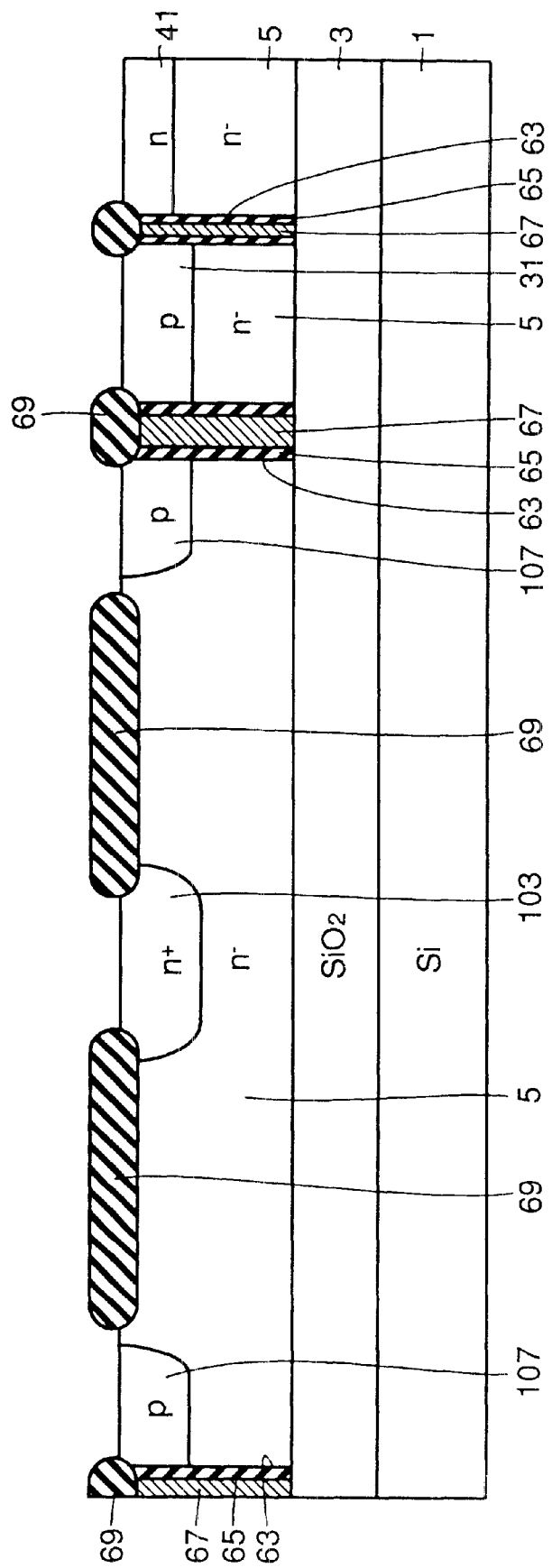

Referring to FIG. 27, field oxide films 69 are selectively formed by an ordinary LOCOS method.

Figure 28:
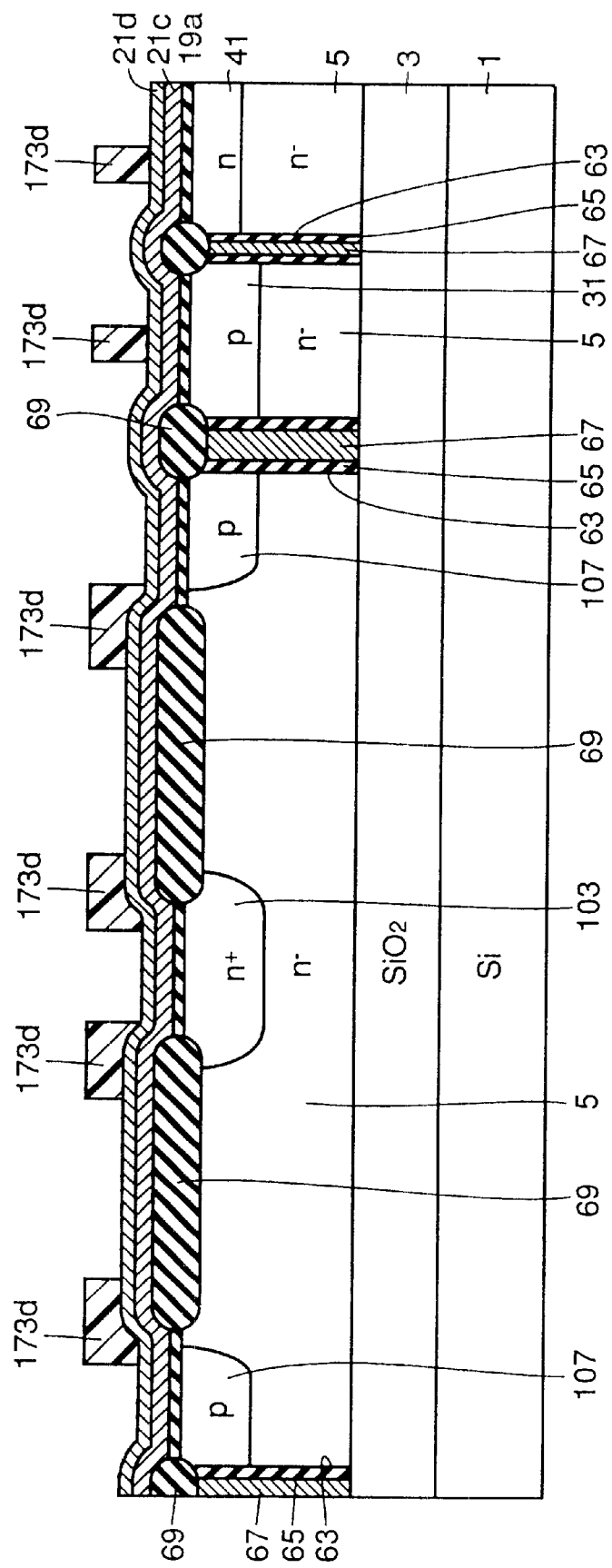

Referring to FIG. 28, after forming gate oxide film 19a, doped polycrystalline silicon layer 21c is deposited, and tungsten silicide layer 21d is formed by sputtering. Then, a resist pattern 173d having an intended configuration is formed on tungsten silicide layer 21d. Using resist pattern 173d as a mask, tungsten silicide layer 21d, doped polycrystalline silicon layer 21c and gate oxide film 19a are successively etched. Thereafter, resist pattern 173d is removed.

Figure 29:
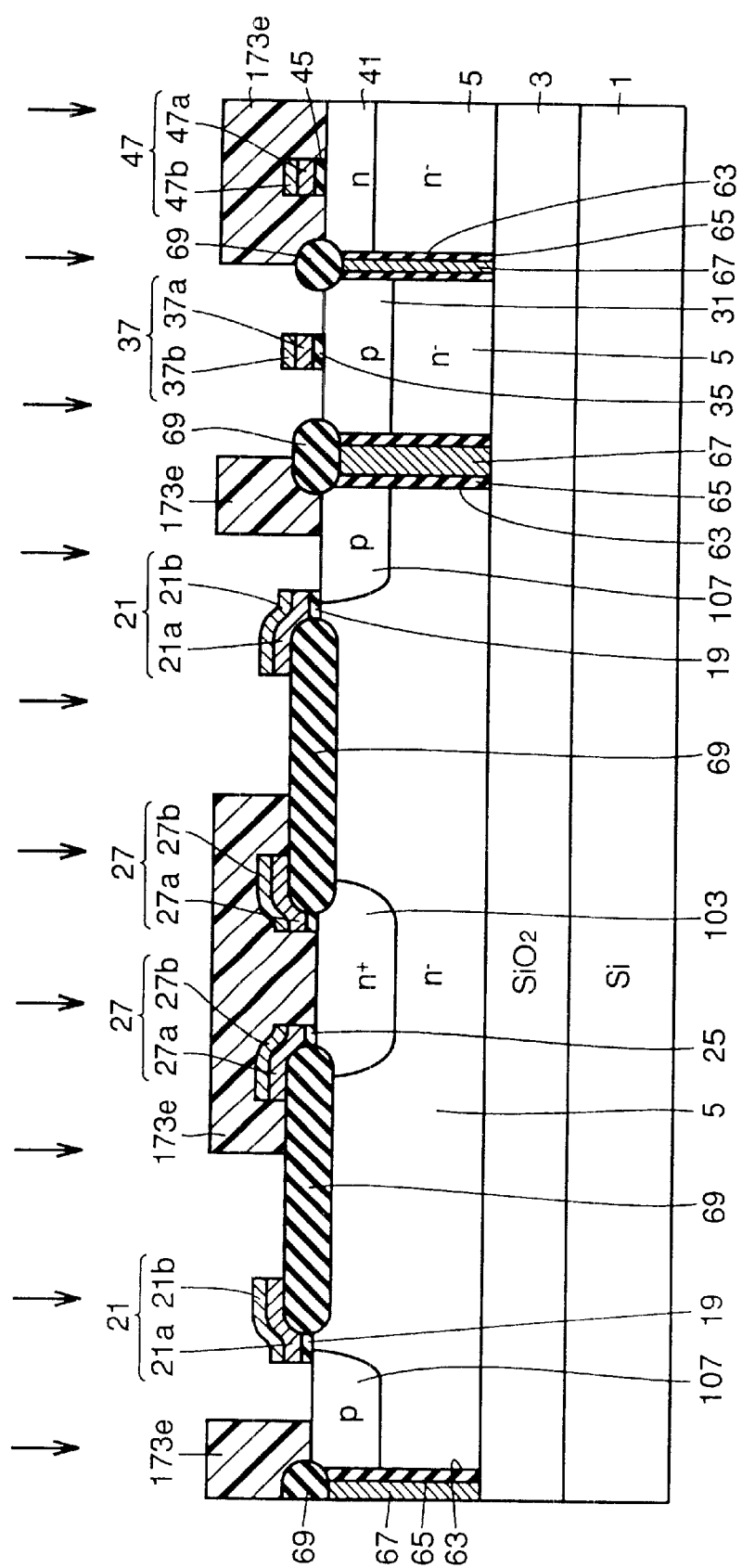

Referring to FIG. 29, the above etching forms respective gate oxide films 19, 25, 35 and 45, and also forms gate electrode layers 21, 37 and 47 as well as field plate layer 27. Thereafter, a resist pattern 173e is formed on intended regions. Using resist pattern 173e as a mask, phosphorus is ion-implanted. This forms n-type lightly doped regions (not shown). Thereafter, resist pattern 173e is removed.

Figure 30:
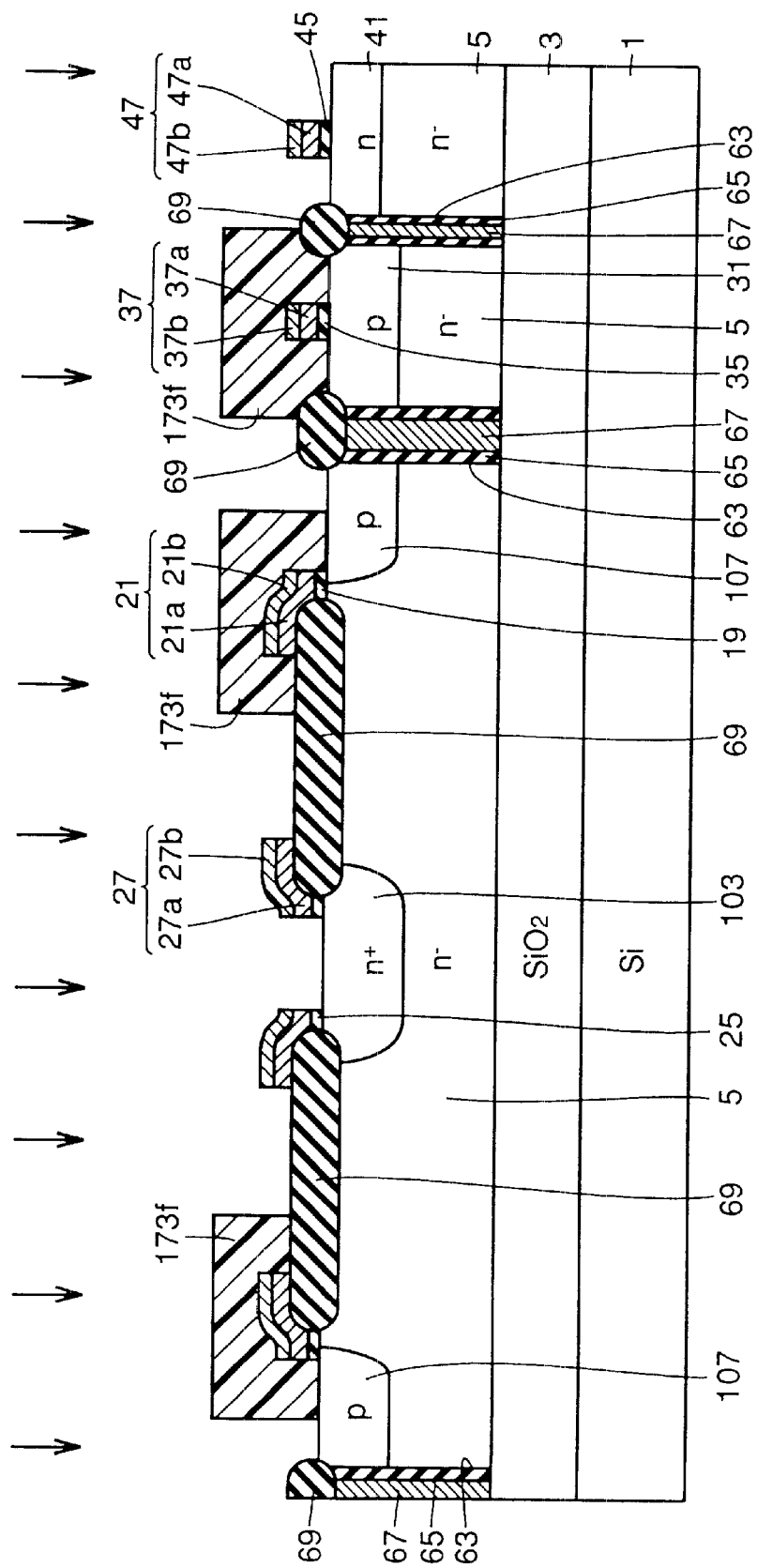

Referring to FIG. 30, a resist pattern 173f is formed on intended regions. Using resist pattern 173f as a mask, $BF_2$ is ion-implanted. This forms p-type lightly doped regions (not shown). Thereafter, resist pattern 173f is removed.

Figure 31:
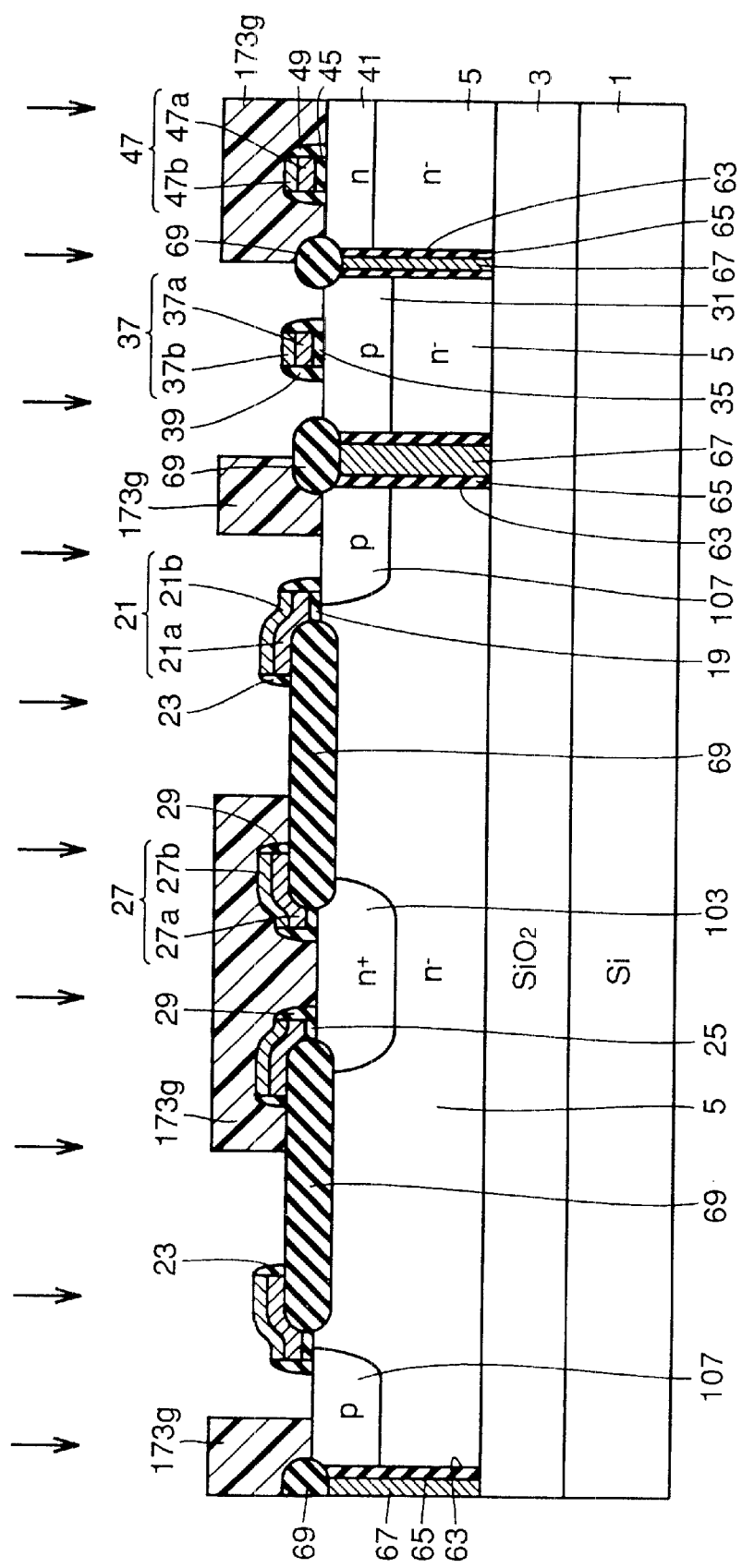

Referring to FIG. 31, an oxide film having a film thickness of 250 nm is deposited on the whole surface, and then anisotropic etching is effected on the oxide film. This forms side wall oxide films 23, 29, 39 and 49 remaining at the side walls of gate electrodes 21, 37, 47 and field plate layer 27, respectively. Thereafter, a resist pattern 173g is formed on intended regions. Arsenic is ion-implanted using resist pattern 173g as well as the respective gate electrode layers, side wall oxide films and others as a mask. This forms n-type heavily doped regions (not shown). Thereafter, resist pattern 173g is removed.

Figure 32:
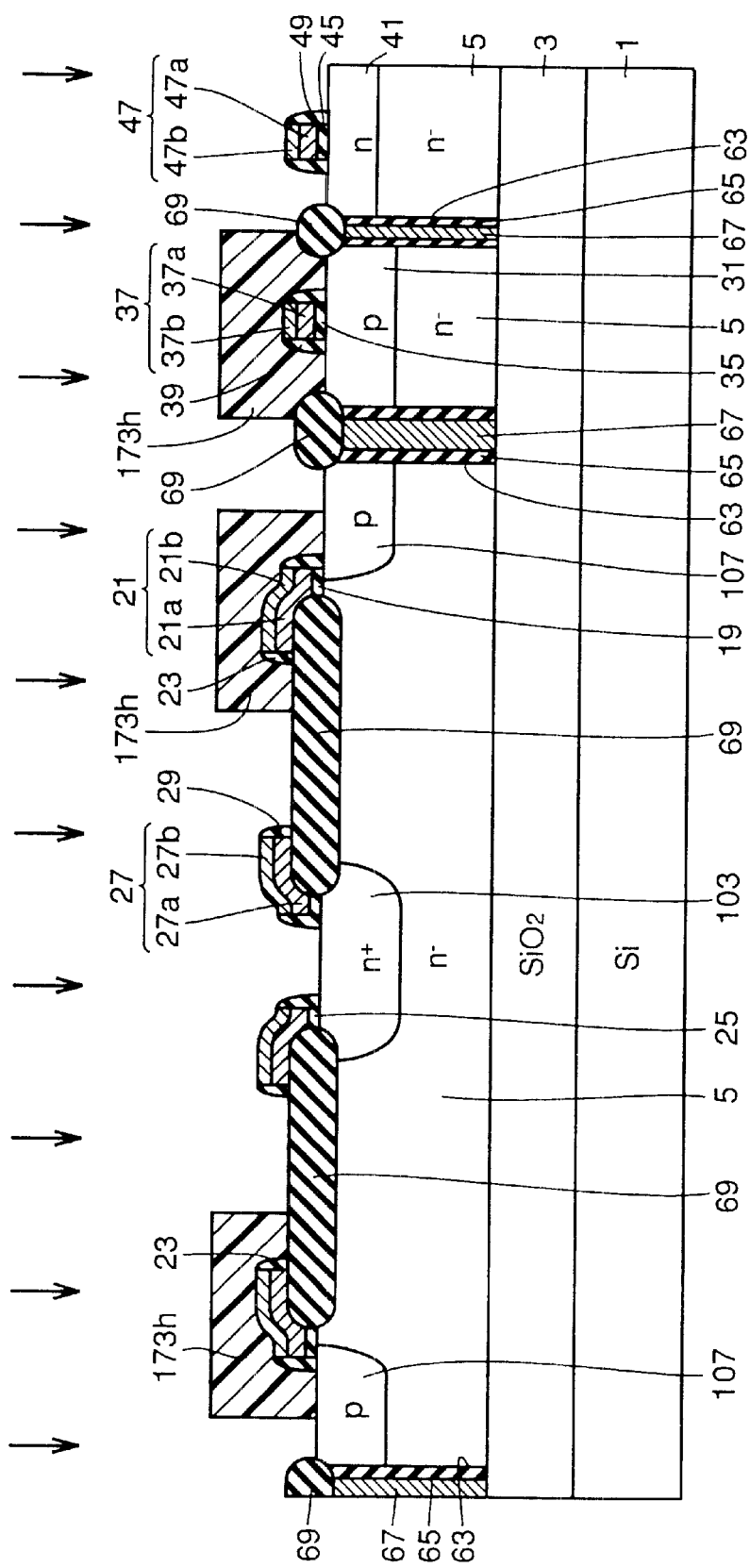

Referring to FIG. 32, a resist pattern 173h is formed on intended regions. $BF_2$ is ion-implanted using resist pattern 173h as well as the respective gate electrode layers, side wall oxide films and others as a mask. This forms p-type heavily doped regions (not shown). After removing resist pattern 173h, thermal processing is performed.

Figure 33:
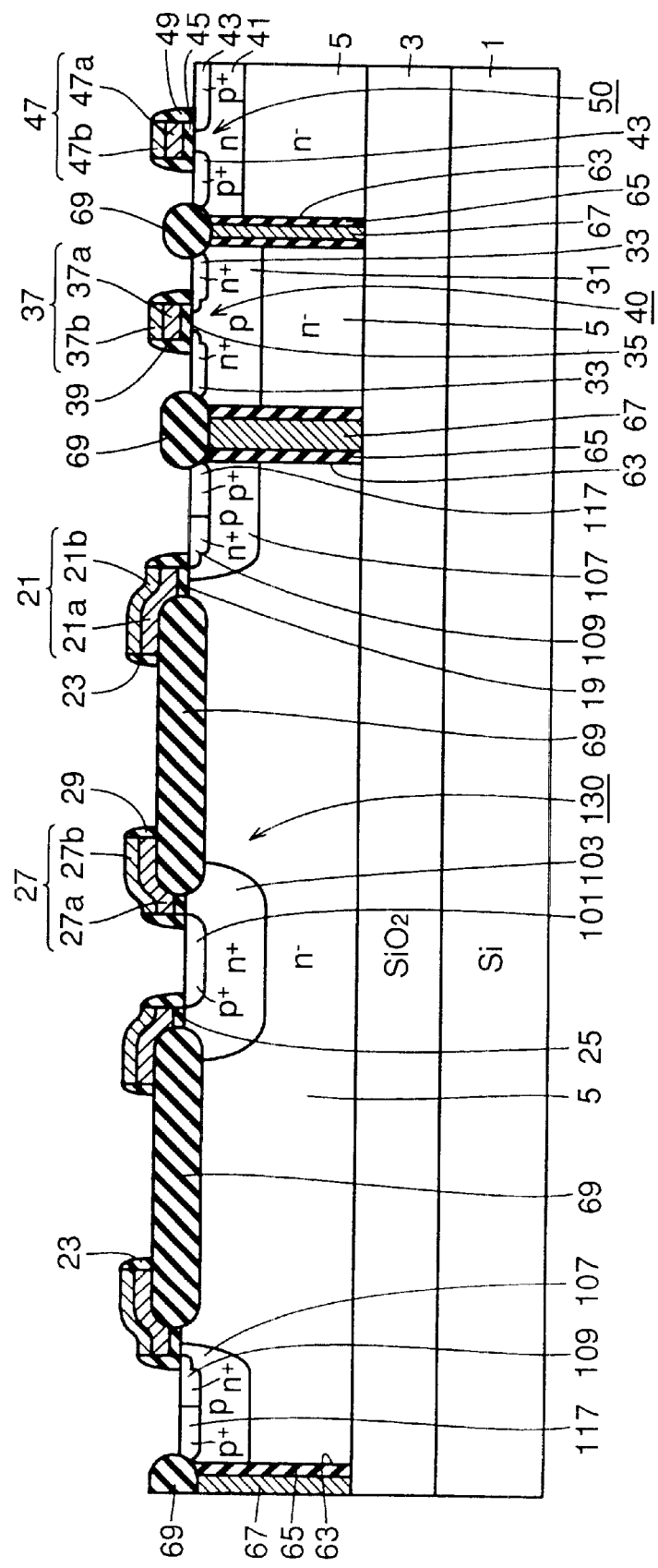

Referring to FIG. 33, the above thermal processing activates impurity implanted into the source/drain layers. This forms p+ drain layer 101, n+ source layer 109, heavily doped n-type layer 117, paired n-type source/drain layers 33 and paired p+ source/drain layers 43.

Figure 34:
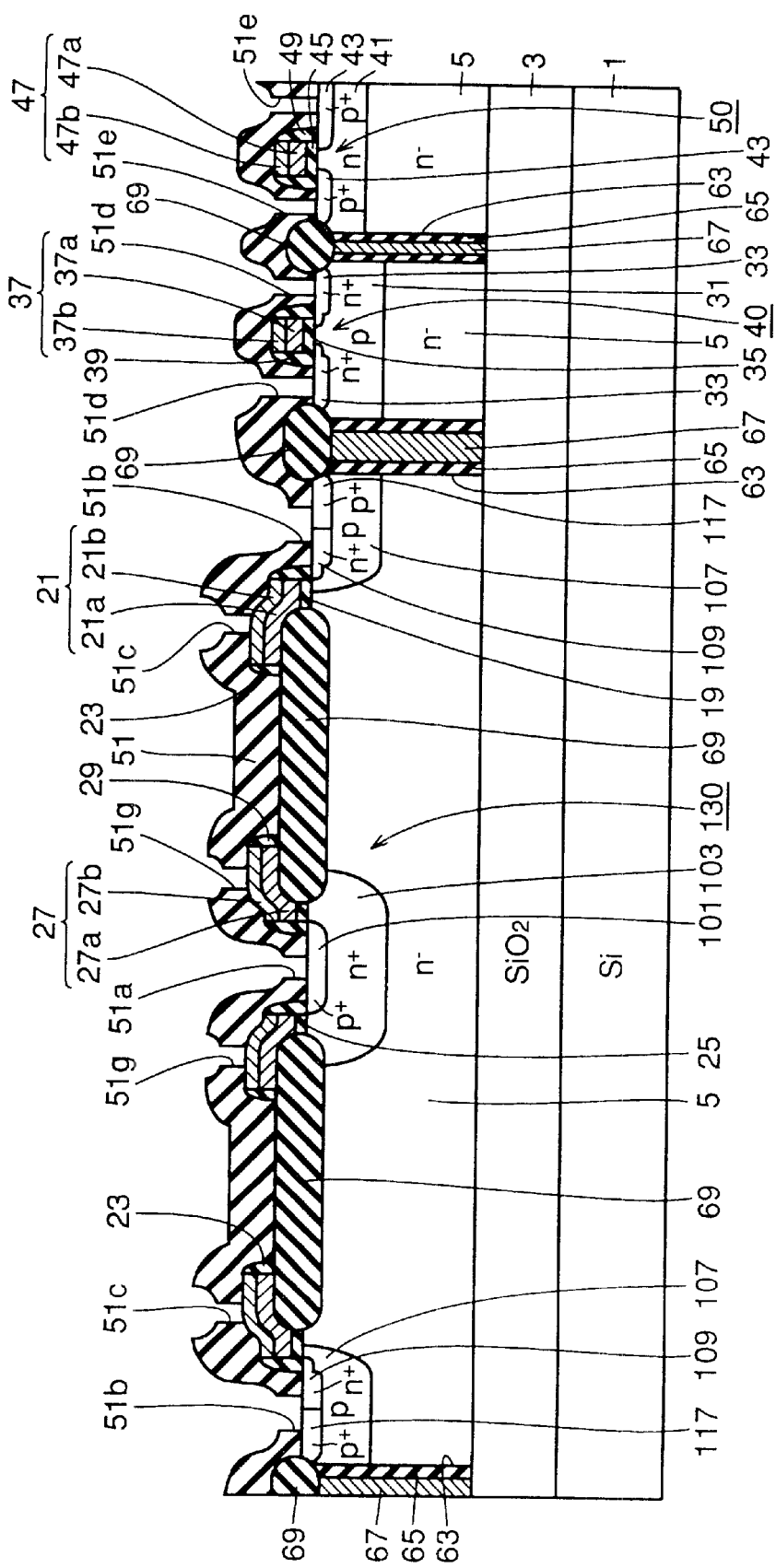

Referring to FIG. 34, first interlayer insulating layer 51 is deposited on the whole surface, and through holes 51a, 51b, 51c, 51d, 51e and 51g are formed.

Figure 35:
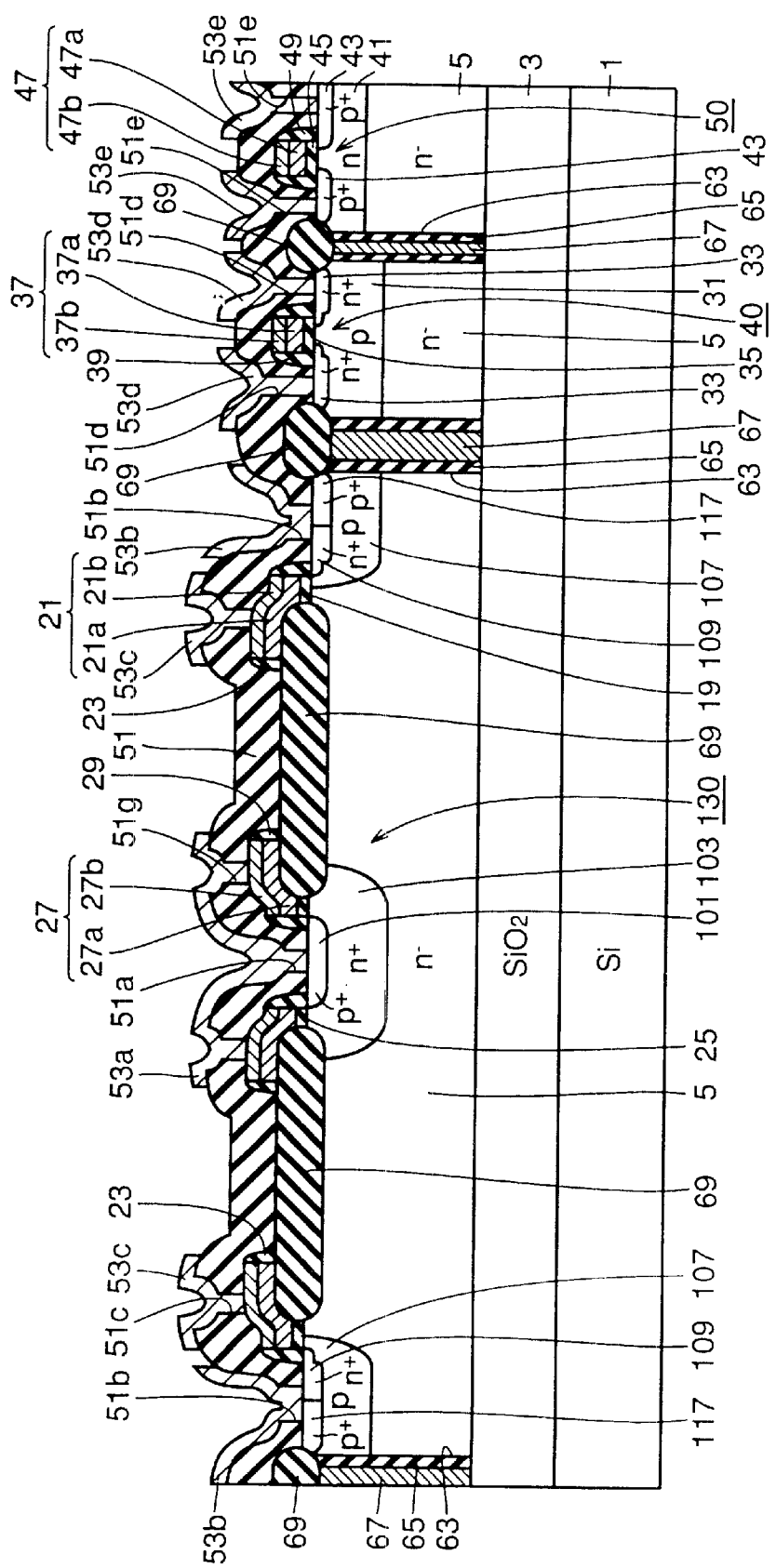

Referring to FIG. 35, processing is performed to form first interconnection layers 53a, 53b, 53c, 53d and 53e which are electrically connected to underlying layers through the corresponding through holes.

Figure 36:
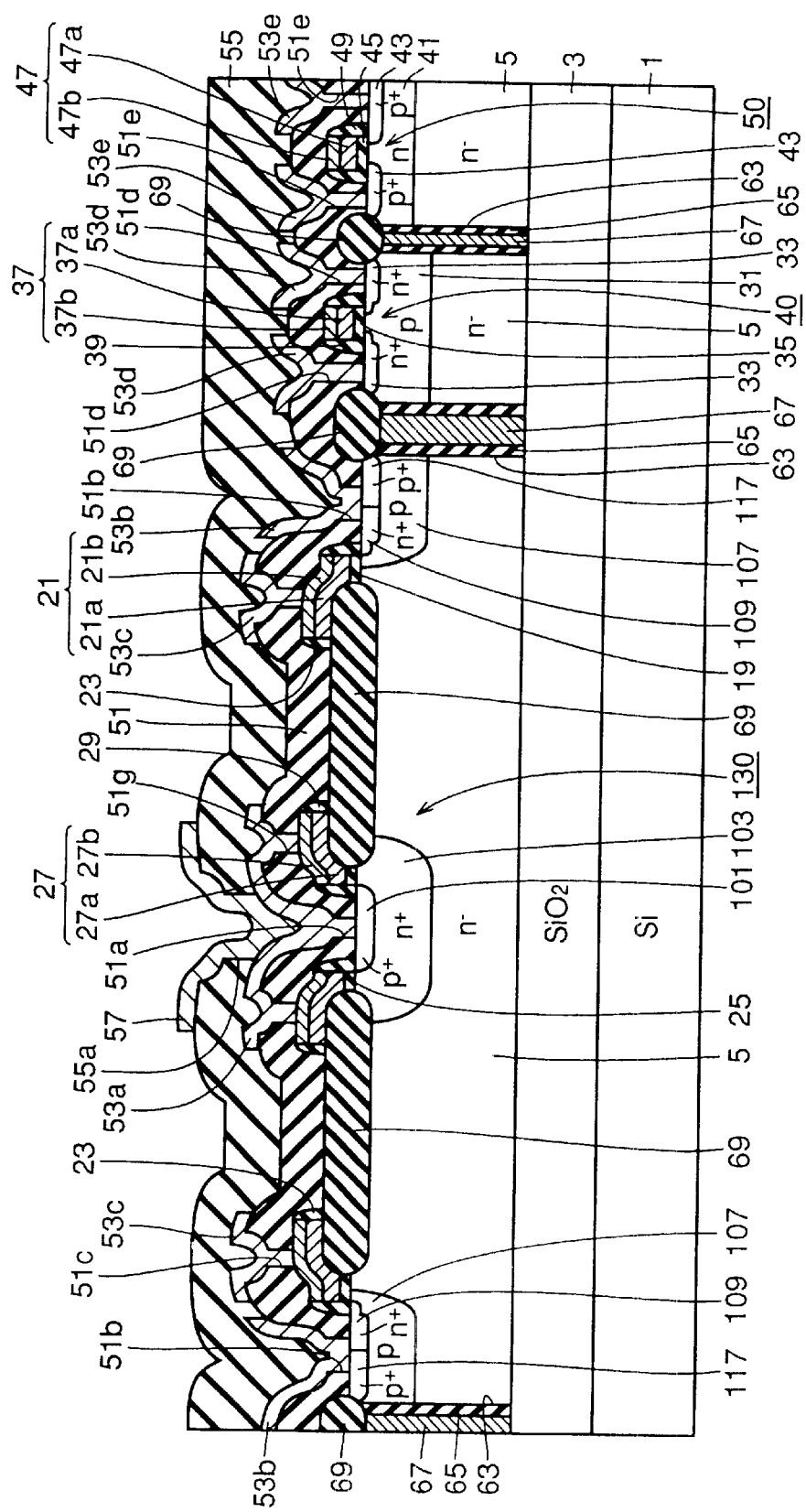

Referring to FIG. 36, second interlayer insulating layer 55 is deposited over the first interconnection layers. Through hole 55a is formed at second interlayer insulating layer 55. A processing is performed to form second interconnection layer 57 electrically connected to the first interconnection layer through through hole 55a.

Thereafter, third interlayer insulating layer 59 is formed, contact hole 59a is formed at interlayer insulating layer 59, and third interconnection layer 61 which is electrically connected to the second interconnection layer through contact hole 59a is formed, so that the semiconductor device shown in FIG. 19 is completed.

Through the steps described above, the n-ch IGBT and the CMOS transistor are formed on the same substrate.

In the present embodiment, the device has such a structure in that n+ source layer 109 surrounds the periphery of p+ drain layer 101 (source electrode surround drain structure) as shown particularly in FIG. 20. Further, in the n-ch IGBT for high resistance, in order to provide high resistance and to cause modulation in conductivity, it is necessary to provide a high resistance n type base layer 5 between p$^+$ drain layer 10 and n$^+$ source layer 109. Since the high resistance n type base layer 5 is necessary in the source electrode surround drain structure as described above, in the source electrode surround drain structure, the peripheral length of n$^+$ source layer 109 opposing to the p$^+$ drain layer 101 becomes longer than the structure in which the drain layer surrounds the periphery of the source layer. Accordingly, the amount of electrons introduced is increased, resulting in increased drive current.

In this embodiment, the n-ch IGBT is electrically isolated from another element by trench isolation. Therefore, it is possible to prevent flow of a current from n$^+$ source layer 109 toward substrate 1, even in the structure in which n$^+$ source layer 109 is located radially outside p$^+$ drain layer 101 and is disposed near trench 63 for trench isolation. Therefore, it is not necessary to dispose trench 63 for trench isolation at a radially outer position remote from n$^+$ source layer 109.

As described above, the semiconductor device of this embodiment can have a high current drive capacity and is suitable to high integration.

This embodiment employs the multilayer interconnection structure, whereby the source leading interconnection layer 53b and drain leading interconnection layer 61 are formed on different insulating layers. Therefore, source leading interconnection layer 53b and drain leading interconnection layer 61 are not short-circuited even in the structure in which source leading interconnection layer 53b is disposed around the entire circumference of n$^+$ source layer 109.

Source leading interconnection layer 53b is in contact with the surface of n$^+$ source layer 109 around the entire circumference of n$^+$ source layer 109. Therefore, a large contact area can be ensured between n$^+$ source layer 109 and source leading interconnection layer 53b, and thus a source contact resistance can be small.

Source leading interconnection layer 53b may be made of a material of a small resistance such as aluminum. Thereby, a current can be supplied to the entire circumference of n$^+$ source layer 109 through source leading interconnection layer 53b of a low resistance. Therefore, the resistance can be smaller than that in the case where the current is supplied to the entire circumference of n$^+$ source layer 109 via n$^+$ source layer 109 having a relatively high resistance.

Simulation was performed for determining drain current I$_D$—drain voltage V$_D$ characteristics with various values of a distance between source and drain (S-D) in a lateral n-ch IGBT. This simulation will now be described below.

Figure 37:
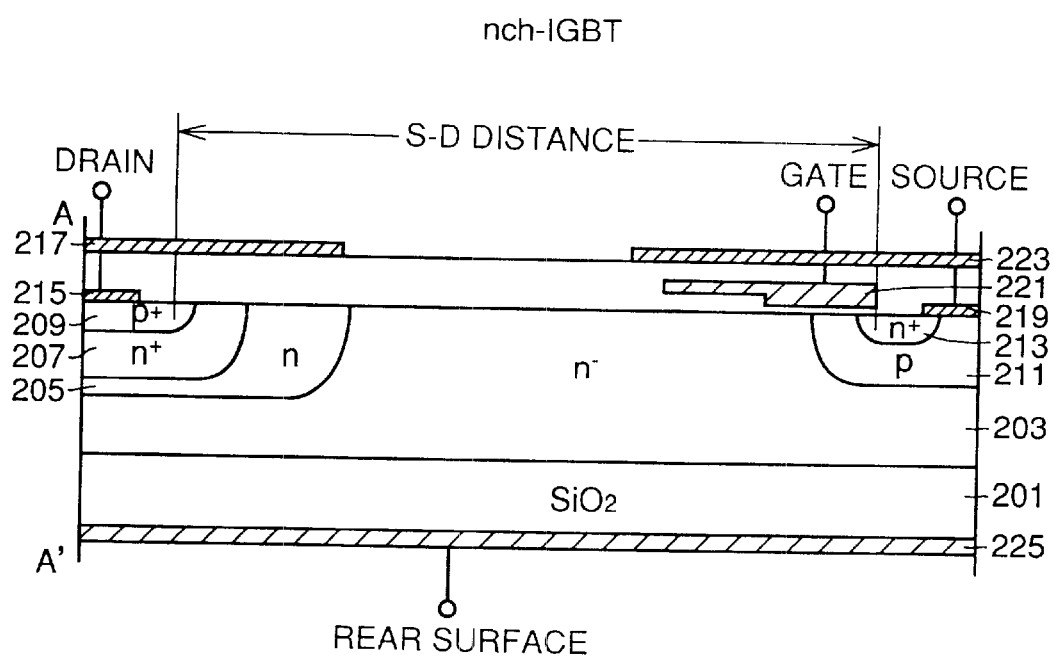
FIG. 37 is a schematic cross section showing a simulated structure of an n-ch IGBT.
Figure 38:
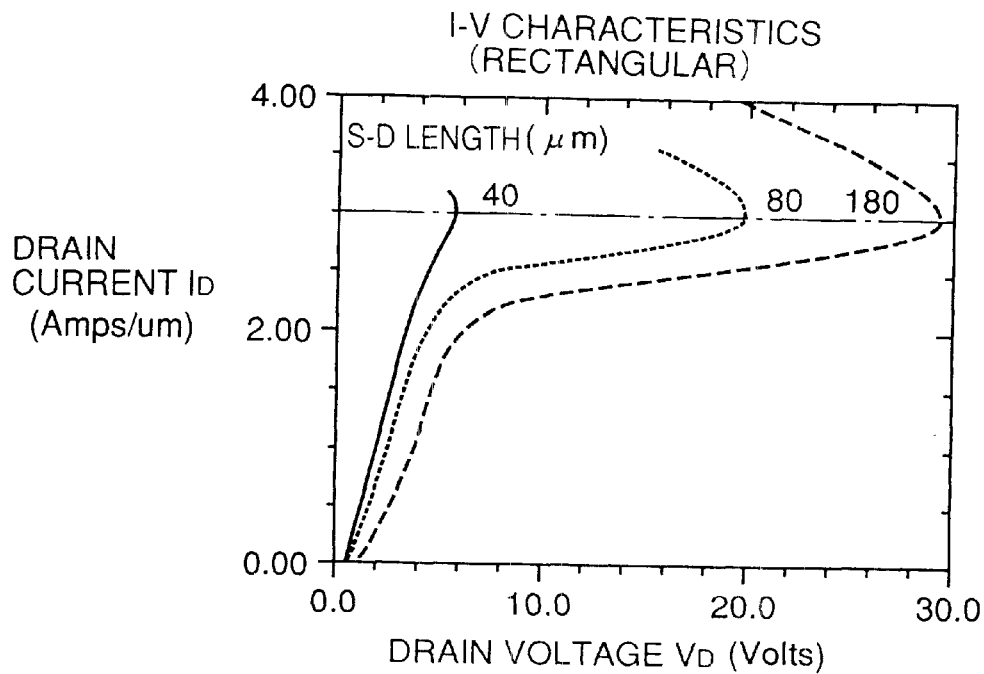
FIG. 38 shows I–V characteristics of an n-ch IGBT having a stripe structure.

FIG. 38 shows I$_D$-V$_D$ characteristics of the cross sectional structure having the depth of 1 μm (rectangle) of FIG. 37, with S-D distance changed to 40, 80 and 180 μm. The gate voltage is 5V.

Referring to FIG. 38, it can be seen that the on-current I$_D$ monotonously decreases in accordance with increase of the S-D distance in an ordinary rectangle structure.

Figure 39:
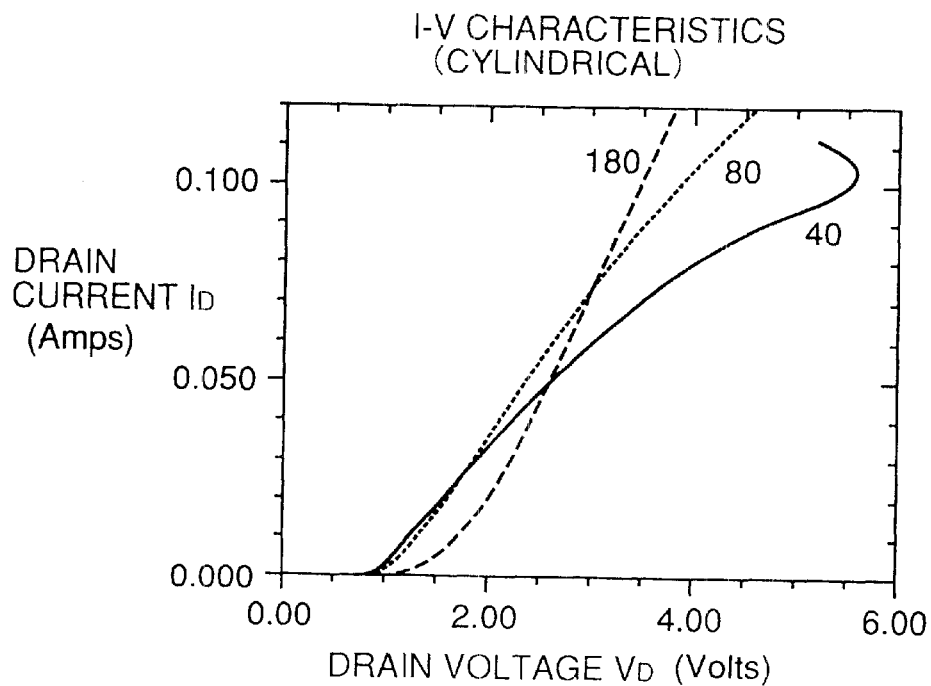
FIG. 39 shows I–V characteristics of an n-ch IGBT having a cylindrical structure.

FIG. 39 shows I$_D$-V$_D$ characteristics of a device structure (cylindrical structure) formed by rotation or revolution of the sectional structure in FIG. 37 around line A—A', which corresponds to the source electrode surround drain structure of the invention.

Referring to FIG. 39, in a range of small drain voltage V$_D$, a longer S-D distance causes smaller on-current I$_D$.

Meanwhile, in a range of a large drain voltage V$_D$, a longer S-D distance causes a larger on-current I$_D$.

The reason for this can be consider as follows. When drain voltage V$_D$ is small, the S-D resistance (a resistance between source and drain) increases in accordance with increase of the S-D distance, so that a longer S-D distance causes a smaller on-current I$_D$. When drain voltage V$_D$ is large, the circumferential length of source region 109 increases in accordance with increase of S-D distance L$_1$ as shown in FIG. 20, so that an electron introduction efficiency increases, and thus the current drive capacity is improved. As a result, on-current I$_D$ can be increased by increasing the S-D distance in accordance with increase of the drain voltage.

The latch-up in n-ch IGBT occurs when a product of the resistance of the p-type base layer immediately under the n$^+$ source layer 109 shown in FIG. 19 and the hole current flowing through p-type base layer 107 immediately under the n$^+$ source layer 109 during operation of IGBT exceeds 0.7V. Accordingly, by increasing the S-D distance, the source circumferential length is increased, and thus the resistance of the p-type base layer is reduced, so that the resistance the p-type base layer decreases, and the resistance against the latch-up is improved.

It can be understood from the results of simulation described above that, in the source electrode surround drain structure of this embodiment, the resistance against the latch-up can be improved by increasing the S-D distance without reducing the on-current (drive current).

An n-ch MOS transistor having a high breakdown voltage can be accomplished by replacing p$^+$ drain layer 101 in the semiconductor device of this embodiment with an n$^+$ drain layer. The embodiment has been described in connection with the method of manufacturing the n-ch IGBT and the CMOS transistor on the same substrate. By setting polarities of the respective portions to opposite polarities in the above structure, respectively, p-ch IGBT and CMOS transistor can be formed on the same substrate.

Embodiment 3

Figure 40:
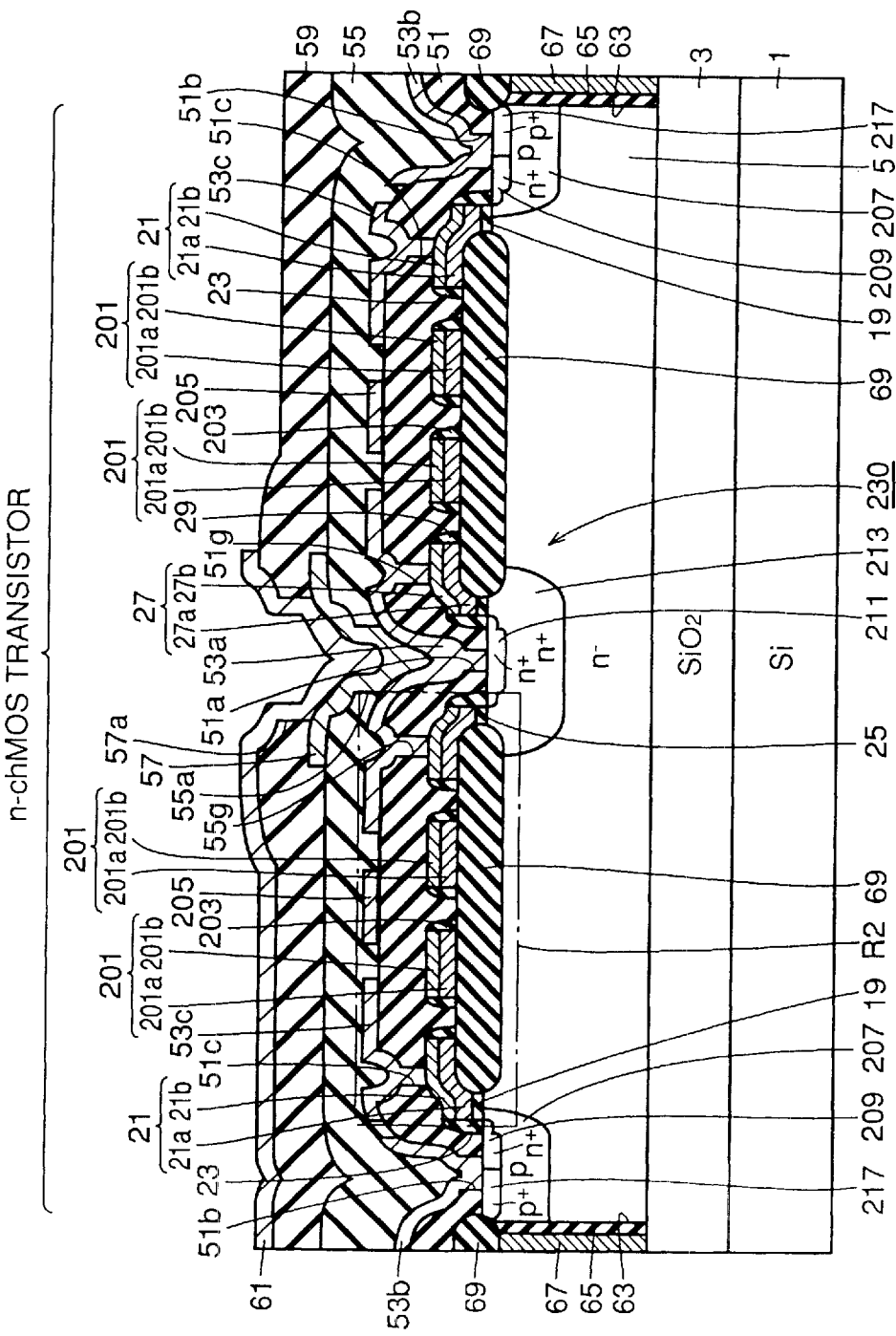
FIG. 40 is a cross section schematically showing a structure of a semiconductor device of an embodiment 3 of the invention.
Figure 41:
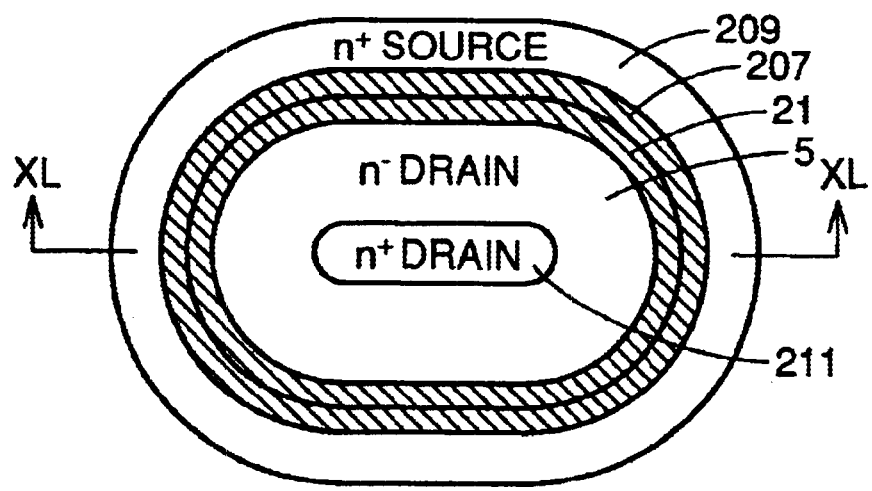
FIG. 41 shows a planar layout of a drain layer and a source layer in an n-ch MOS transistor of the embodiment 3 of the invention.

FIG. 40 shows a section taken along line XL–XL in FIG. 41.

Figure 42:
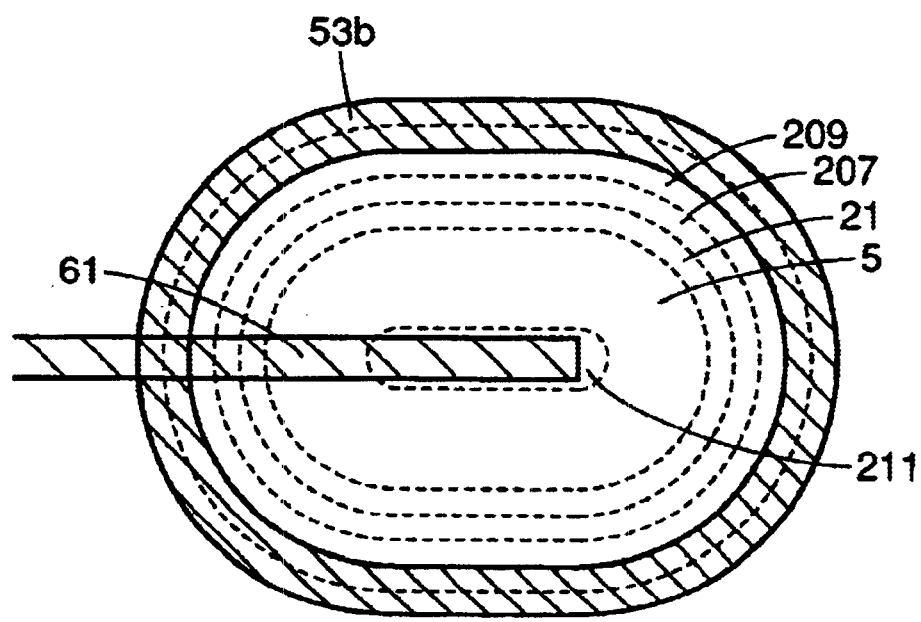
FIG. 42 shows a planar layout showing a drain leading interconnection layer and a source leading interconnection layer together with the structure in FIG. 41.

Referring to FIGS. 40 to 42, this embodiment provides a semiconductor device of a structure, in which the capacity-coupling type multilayer field plate already discussed as the prior art is applied to the lateral n-ch MOS transistor having a high breakdown voltage of the invention. On the surface of silicon substrate 1, there is formed high resistance n-type base layer 5 with insulating layer 3 made of, e.g., a silicon oxide film therebetween. High resistance n-type base layer 5 is electrically isolated from an element around the same by trench isolation formed of trench 63. Trench 63 is arranged, e.g., in an elliptical planar form surrounding a region for forming an n-ch MOS transistor.

N-ch MOS transistor 230 has an n$^+$ source layer 209, an n$^+$ drain layer 211, an n-type buffer layer 213, gate oxide film 19 and gate electrode 27.

N$^+$ source layer 209 is formed in a region of a p-type base layer 207 formed at the surface of high resistance n-type base layer 5, and is adjacent to a heavily doped n-type layer 217. N$^+$ drain layer 211 is formed at n-type buffer layer 213 formed at the surface of high resistance n-type base layer 5. Gate electrode layer 21 is formed on p-type base layer 207 and high resistance n-type base layer 5 with gate oxide film 19 therebetween. Gate electrode layer 21 is formed of a multilayer structure including doped polycrystalline silicon layer 21a and tungsten silicide layer 21b. Side wall oxide film 23 is formed at the side wall of gate electrode layer 21.

Referring particularly to FIG. 41, n⁺ source layer 209 surrounds the periphery of n⁺ drain layer 211, and has, for example, an elliptical planar form. Gate electrode layer 21 is located radially inside n⁺ source layer 209, and has an elliptical planar form extending along n⁺ source layer 209. Thereby, the channel region of this n-ch MOS transistor 230 is formed having a shape of an elliptical ring inside the inner periphery of n⁺ source layer 209.

Field oxide film 69 having, e.g., an elliptical planar form is formed at the surface of high resistance n-type base layer 5 between n⁺ source layer 209 and n⁺ drain layer 211. A plurality of conductive layers 201, each of which is made from the same layer as gate electrode layer 21, are formed on field oxide film 69. Conductive layers 201 form a lower layer of a capacity-coupling type multilayer field plate.

Side wall oxide films 203 are formed at the side walls of conductive layers 201. First interlayer insulating layer 51 is formed to cover n-ch MOS transistor 230. First interlayer insulating layer 51 is provided with through holes 51a, 51b, 51c and 51g. There is formed first interconnection layer 53a which is electrically connected to n⁺ drain layer 211 through through hole 51a and is also electrically connected to conductive layer 27 through through holes 51g. There is also formed first interconnection layer 53b which is electrically connected to n⁺ source layer 209 and heavily doped p-type layer 217 through through hole 51b. Further, there is formed first interconnection layer 53c which is electrically connected to gate electrode layer 21 through through hole 51c.

Between first interconnection layers 53a and 53c, there is formed a conductive layer 205 which is made from the same layers as them and forms a capacitor together with conductive layer 201 at the lower level. Conductive layer 205 forms an upper layer of the capacity-coupling type multilayer field plate.

Referring to FIG. 42, source leading Interconnection layer 53b has an elliptical planar form and is in contact with the surface of n⁺ source layer 209 around the entire circumference of n⁺ source layer 209. Drain leading interconnection layer 61 extends above source leading interconnection layer 53b with second and third interlayer insulating layers 55 and 59 therebetween, and crosses over source leading interconnection layer 53b in the plan view.

In this embodiment, since conductive layers 201, first interconnection layers 53a and 53c, and conductive layer 205 form the capacity-coupling type multilayer field plate, a potential between source and drain can be stabilized. This will be described below more in detail.

Referring to FIG. 40, Vcc potential is applied to the drain and GND potential is applied to the source when n-ch MOS transistor is operating. When these potentials are applied, a constant potential difference occurs at a lower portion of field oxide film 69 located between n⁺ drain layer 211 and n⁺ source layer 209. In a power element having a high breakdown voltage, an extremely high voltage of 600V is applied to third interconnection layer 61 connected to the drain. When the large voltage is applied to an upper portion between the source and drain, the potential between the source and drain may not be stable during operation of n-ch MOS transistor 230.

Figure 43:
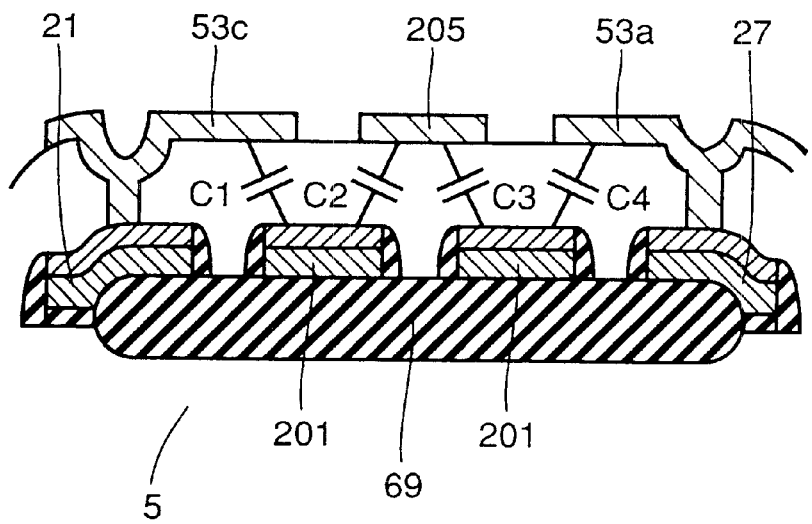
FIG. 43 is a fragmentary cross section showing, on an enlarged scale, a region R2 in FIG. 40.

In view of the above, this embodiment is provided with the capacity-coupling type multilayer field plate. FIG. 43 is a fragmentary cross section showing, on an enlarged scale, the field plate portion (region R2) in FIG. 40.

Figure 44:
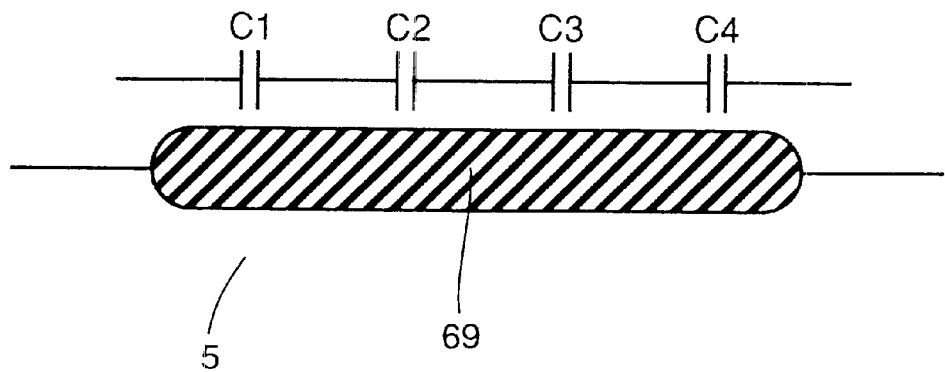
FIG. 44 schematically shows formation of a capacity on a field oxide film.

Referring to FIG. 43, when predetermined potentials are applied to the source and drain during operation of the n-ch MOS transistor, capacitors are formed by conductive layers 201 and 205 forming the field plate. Thereby, electric charges are accumulated between the conductive layers, and capacities C1, C2, C3 and C4 are formed. Capacities C1, C2, C3 and.C4 thus formed are connected together in series on field oxide film 69 as shown in FIG. 44.

Owing to formation of the capacities at the upper portion of field oxide film 69, the upper and lower portions of field oxide film 69 are set to the substantially equal potential during operation of the n-ch MOS transistor. Since the portion immediately above field oxide film 69 is set to the substantially equal potential as its lower portion, it is possible to suppress an influence on the lower portion of field oxide film 69 by a high voltage, which may be applied to third interconnection layer 61, and thus the potential between the source and drain can be stable.

In this embodiment, n⁺ source layer 209 surrounds the periphery of n⁺ drain layer 211. Therefore, the current drive capacity can be improved by a reason similar to that already described in connection with the embodiment 1.

In this embodiment, n-ch MOS transistor 230 is electrically isolated from another element by the trench isolation formed of trench 63. Therefore, the embodiment can provide the semiconductor device which is suitable to high integration by a reason similar to that already described in connection with the embodiment 1.

As described above, this embodiment can provide the semiconductor device which has a large current drive capacity and is suitable to high integration.

Owing to use of the multilayer interconnection structure, first interconnection layer 53b forming the source leading interconnection layer and third interconnection layer 61 forming the drain leading interconnection layer are formed on different insulating layers. Therefore, even in the structure in which source leading interconnection layer 53b is in contact with the surface of n⁺ source layer 209 around the entire circumference of n⁺ source layer 209, electrical isolation can be ensured between source leading interconnection layer 53b and drain leading interconnection layer 61.

Source leading interconnection layer 53b is in contact with the surface of n⁺ source layer 209 around the entire circumference of n⁺ source layer 209. Therefore, by a reason similar to that already described in connection with the embodiment 1, the source contact resistance can be reduced, and the resistance in the operation of supplying a current to the entire circumference of source region can also be reduced.

Embodiment 4

Figure 45:
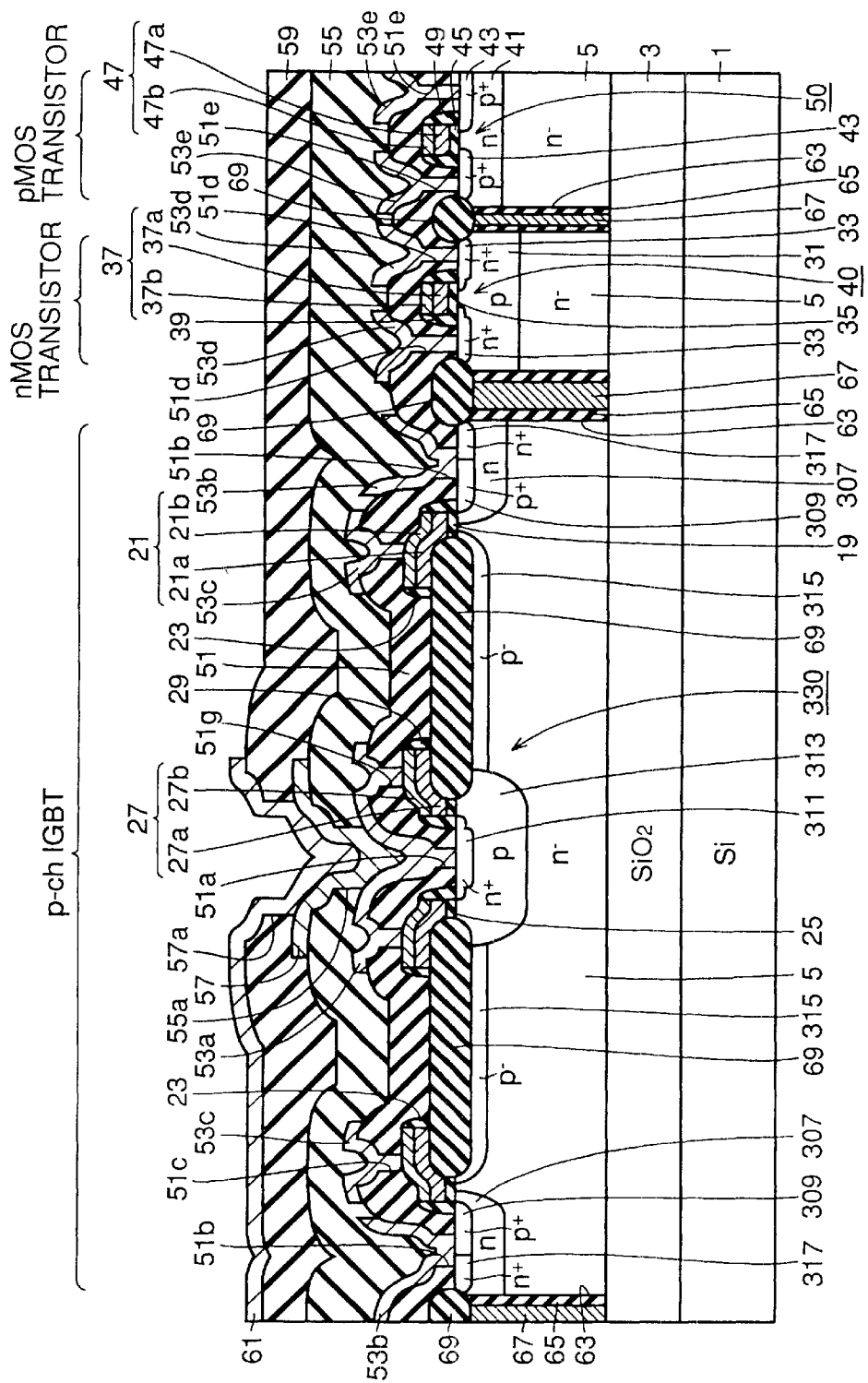
FIG. 45 is a cross section schematically showing a structure of a semiconductor device of an embodiment 4 of the invention.

FIG. 45 to be referred to below shows a section taken along line XLV–XLV in FIG. 46.

Figure 46:
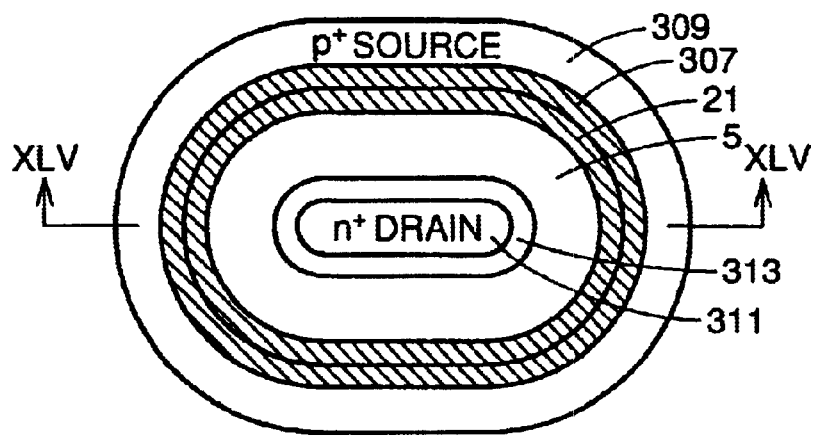
FIG. 46 shows a planar layout of a source layer and a drain layer in a p-ch IGBT of the embodiment 4 of the invention.
Figure 47:
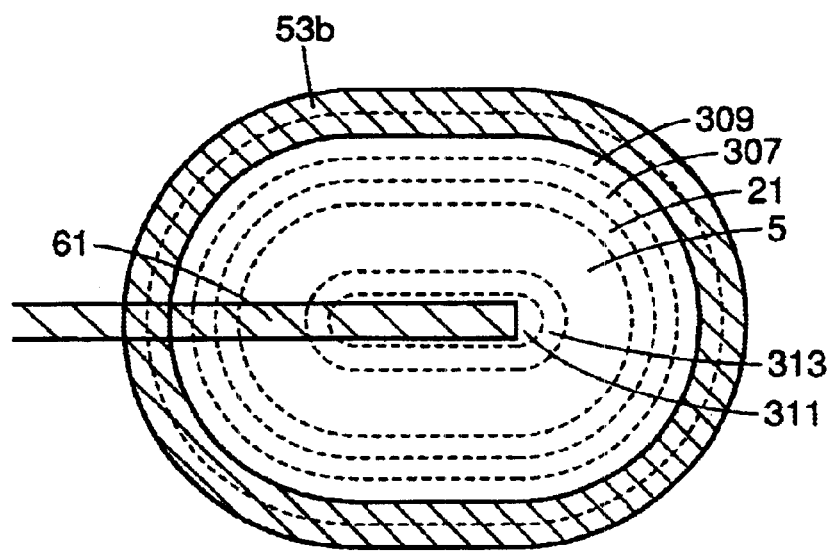
FIG. 47 shows a planar layout showing a drain leading interconnection layer and a source leading interconnection layer together with the structure in FIG. 46.

Referring to FIGS. 45–47, there is formed high resistance n-type base layer 5 on silicon substrate 1 with insulating layer 3 made of, e.g., a silicon oxide film therebetween. High resistance n-type base layer 5 is electrically divided into p-ch IGBT, nMOS transistor and PMOS transistor by trench isolation formed of trenches 63.

P-ch IGBT has a p⁺ source layer 309, an n-type base layer 307, an n⁺ drain layer 311, a p-type buffer layer 313, a p⁻ drain layer 315, gate oxide film 19 and gate electrode layer 21.

P⁺ source layer 309 is formed in a region of an n-type base layer 307 formed at the surface of high resistance n-type base layer 5, and is adjacent to a heavily doped n-type layer 317. N⁺ drain layer 311 is formed at a region of p-type buffer layer 313 formed at the surface of high resistance n-type base layer 5. P drain layer 315 is electrically connected to p-type buffer layer 313, is spaced from p$^+$ source layer 309 and is formed immediately under the field oxide film 69.

Gate electrode layer 21 is formed on portions of high resistance n-type base layer 5 and n-type base layer 307 located between p$^+$ source layer 309 and p$^-$ drain layer 315 with gate oxide film 19 therebetween. Gate electrode layer 21 is formed of a two-layer structure including doped polycrystalline silicon layer 21a and tungsten silicide layer 21b.

Referring particularly to FIG. 46, p$^+$ source layer 309 surrounds the periphery of n$^+$ drain layer 311, and has, for example, an elliptical planar form.

Structures other than the above are substantially the same as those of the embodiment 1 shown in FIG. 1. Similar members and portions bear the same reference numbers, and will not be described below.

In a method of manufacturing the p-ch IGBT of this embodiment, p-type impurity ions may be selectively implanted into a region for forming p$^-$ drain layer 315 prior to formation of field oxide film 69, whereby p$^-$ drain layer 315 can be formed simultaneously with formation of field oxide film 69 by the LOCOS method.

In this embodiment, p$^+$ source layer 309 surrounds the periphery of n$^+$ drain layer 311. Therefore, the current drive capacity can be improved as already described in connection with the embodiment 2.

The p-ch IGBT is electrically isolated from other elements such as a CMOS transistor by the trench isolation formed of trenches 63. Therefore, as already described in connection with the embodiment 1, the trench isolation formed of trenches 63 can ensure a sufficient breakdown voltage even when p$^+$ source layer 309 is set to a higher voltage with respect to silicon substrate 1, so that an area of the isolation region can be reduced.

As described above, the embodiment can provide a semiconductor device which has a large current drive capacity and is suitable to high integration.

Since first interconnection layer 53b forming the source leading interconnection layer and third interconnection layer 61 forming the drain leading interconnection layer are formed on different insulating layers. Therefore, even in the structure in which source leading interconnection layer 53b has an elliptical planar form extending along p$^+$ source layer 309 as shown particularly in FIG. 47, electrical isolation can be sufficiently ensured between source leading interconnection layer 53b and drain leading interconnection layer 61.

Source leading interconnection layer 53b is in contact with the surface of p$^+$ source layer 309 around the entire circumference of p$^+$ source layer 309. Therefore, a large contact area can be ensured between p$^+$ source layer 309 and source leading interconnection layer 53b, and a source contact resistance can be reduced.

Source leading interconnection layer 53b may be made of a material of a small resistance such as aluminum. Thereby, a current can be supplied to the entire circumference of p$^+$ source layer 309 through source leading interconnection layer 53b of a low resistance. Therefore, the resistance can be smaller than that in the case where the current is supplied to the entire circumference of p$^+$ source layer 309 via p$^+$ source layer 309 having a relatively high resistance.

Embodiment 5

Figure 48:
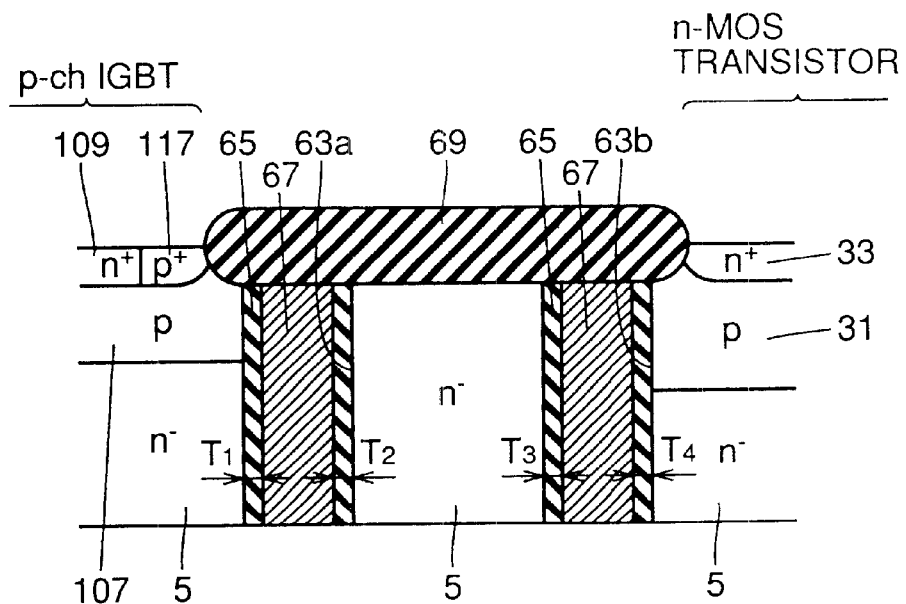
FIG. 48 is a fragmentary cross section showing a structure including a plurality of trenches for trench isolation.

The number of trenches 63 which surround power devices such as an n-ch IGBT in the embodiment 2 shown in FIG. 19 may be set to a value corresponding to portions in which breakdown voltage is to be ensured. For example, region R1 shown in FIG. 19 may be provided with two trenches for surrounding a region at which an n-ch IGBT is to be formed as shown in FIG. 48. By provision of a plurality of grooves, the breakdown voltage can be improved without increasing a stress applied to the silicon layer. This will be described below more in detail.

In region R1 shown in FIG. 19, the breakdown voltage which can be ensured by the trench isolation depends on the film thickness of oxide film 65 formed at the side wall of trench 63. Therefore, a larger thickness of oxide film 65 is preferable when only the breakdown voltage is taken into consideration. However, a thermal expansion coefficient of a silicon oxide film is significantly different from that of silicon. Therefore, if the film thickness of each oxide film 65 were excessively large, a stress would be applied to the silicon substrate at a later thermal processing step.

In this embodiment, owing to provision of a plurality of grooves, a sum $(T_1+T_2+T_3+T_4)$ of film thicknesses of silicon oxide films 65 can be increased while maintaining film thicknesses $T_1$ and $T_4$ of silicon oxide films 65 faced to the silicon layers, at which elements are to be formed, at predetermined values. Since film thicknesses $T_1$ and $T_4$ of silicon oxide films 65 faced to the silicon layers at which elements are to be formed are maintained at predetermined values, it is possible to suppress increase of the stress applied to the silicon layers at which elements are to be formed. Since the sum of thicknesses of silicon oxide films 65 can be larger than that in the case where only one trench is employed, it is possible to increase the breakdown voltage which can be ensured. Owing to provision of the plurality of trenches 63a and 63b, the breakdown voltage can be improved without increasing the stress applied to the silicon layer.

Figure 49:
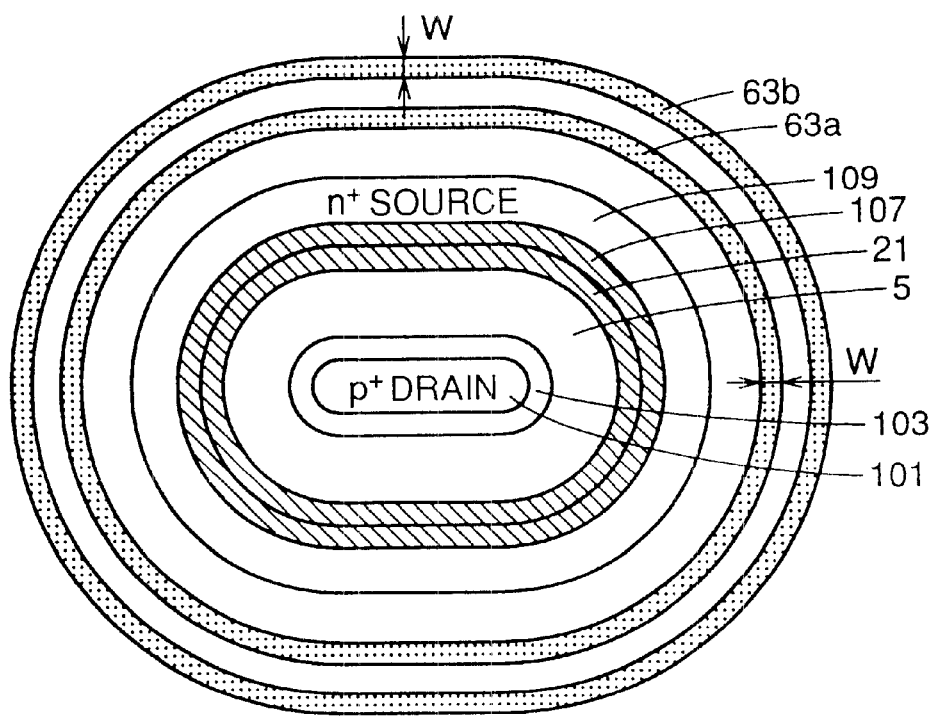
FIG. 49 is a schematic plan showing a trench for trench isolation having a constant width and surrounding an element.

It is desired that a planar configuration of the trench is annular as shown in FIG. 49, and in other words, it has round corners and a constant trench width W. Owing to the configuration that the trenches 63a and 63b have a constant width W through their entire lengths, the characteristics for filling trenches with polycrystalline silicon can be improved.

Figure 50:
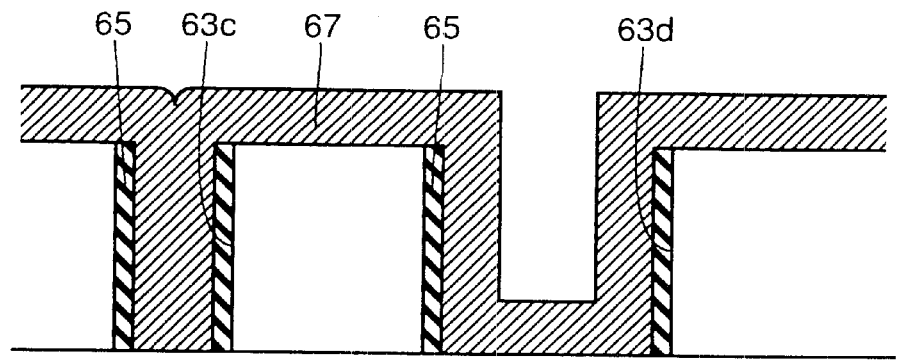
FIGS. 50 and 51 show steps of forming filler layers in apertures of different widths.
Figure 51:
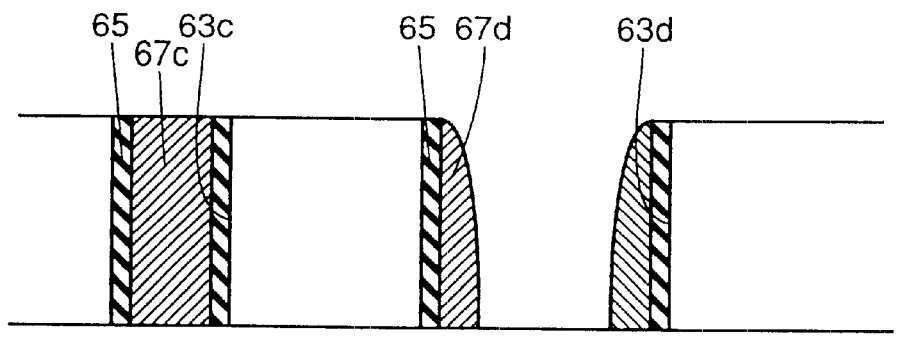

Referring to FIG. 50, in the case where there are provided a narrow trench and a wide groove, polycrystalline silicon layer 67 may not fully fill wide trench 63d, although polycrystalline silicon layer 67 can fully fill narrow trench 63c. In this state, if etchback is effected on the whole surface of polycrystalline silicon layer 67, wide trench 63d cannot be fully filled with polycrystalline silicon layer 67d as shown in FIG. 51.

If the widths W of the trenches are not constant, the portion having a large trench width W may not be sufficiently filled with the polycrystalline silicon layer. If the trench is not completely filled with the polycrystalline silicon layer as described above, the trench isolation breakdown voltage cannot be ensured sufficiently.

Meanwhile, in the case where all trenches 63a and 63b have the constant width, as is done in this embodiment, the characteristics for filling the trenches with the polycrystalline silicon layer are improved, and a large trench isolation breakdown voltage can be ensured.

Trenches 63a and 63b may be filled with oxide silicon instead of polycrystalline silicon. The trenches can be filled with oxide silicon in such a manner that a silicon oxide film having portions filling the trenches is deposited on the entire surface, and then etchback is effected on the whole surface of the silicon oxide film.

For leaving the filler layers only in the grooves, a CMP (Chemical Mechanical Polishing) method may be employed instead of etchback.

Embodiment 6

Figure 52:
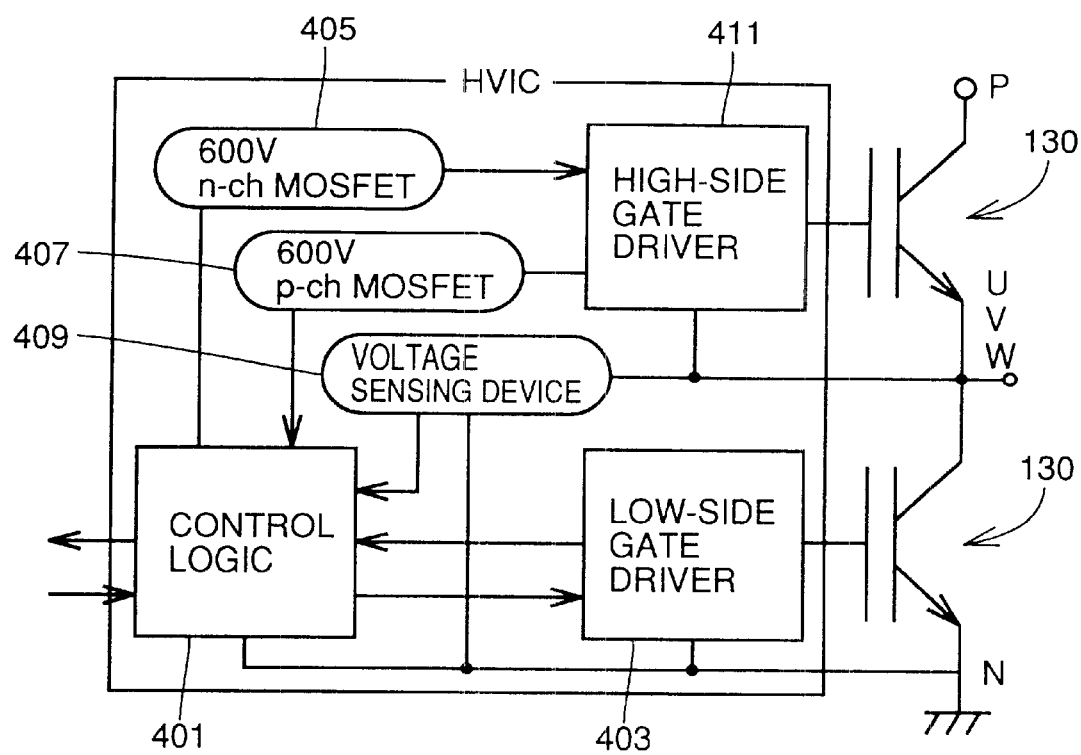
FIG. 52 is a block diagram showing a structure using a p-ch MOS transistor as a level shift.

For example, p-ch MOS transistor is used as a level shift at a high side in a bridge circuit which is formed of an n-ch IGBT 130 shown in FIG. 52. In this case, when p-ch MOS transistor is turned off, potentials of the p⁺ source layer and the gate electrode layer rise from 0 to a positive high voltage, although the substrate potential and the n⁺ drain potential remain at 0V.

In the structure in which the source electrode surround drain structure of the invention is applied to the p-ch power device including the p-ch MOS transistor which is used as described above, a deletion layer extends from the n⁺ drain (collector) side toward the source side, so that the potential cannot be stable at the side wall of trench for trench isolation located near the source.

Figure 53:
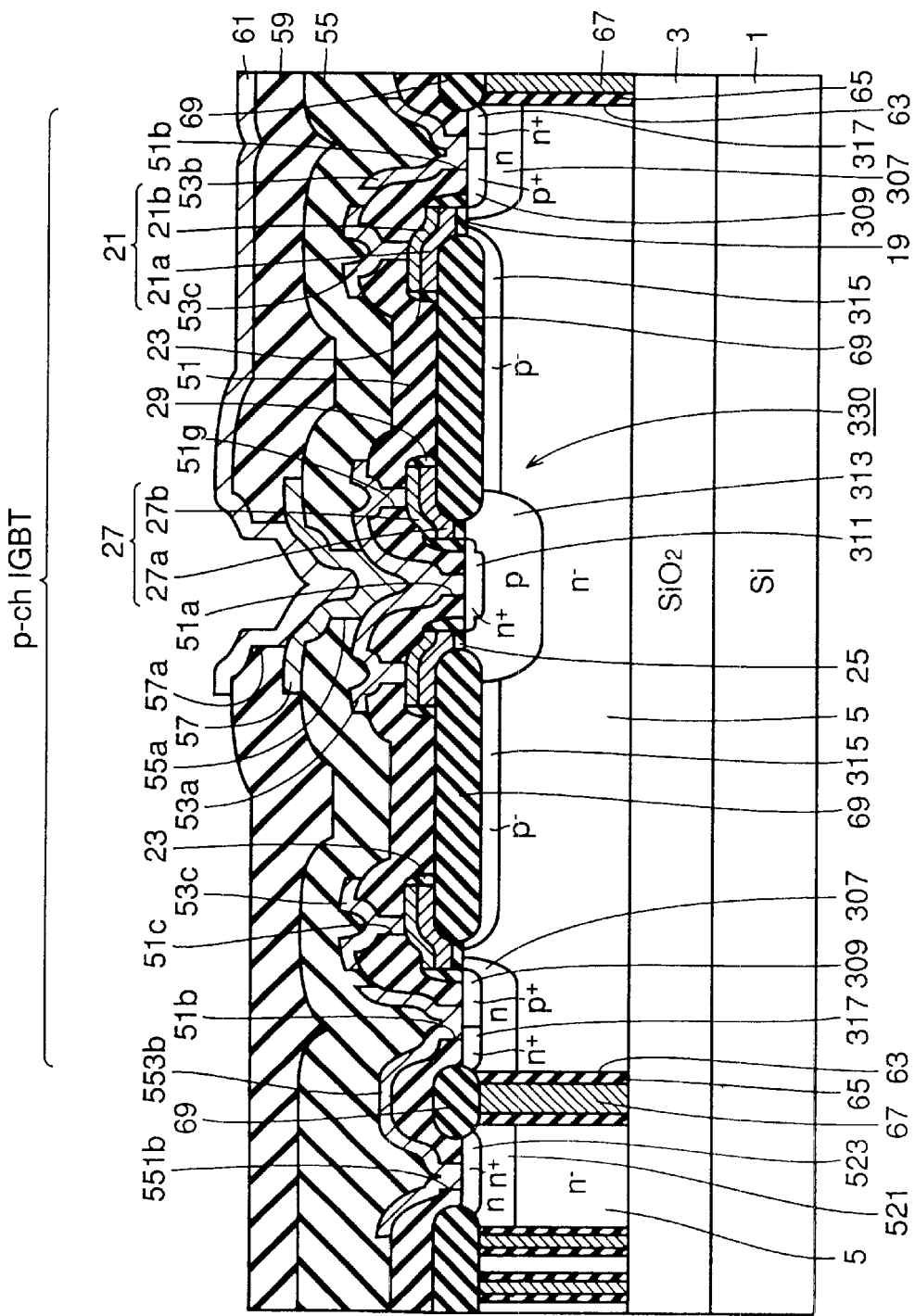
FIG. 53 is a cross section schematically showing a structure of a semiconductor device of an embodiment 6 of the invention.

Accordingly, as shown in FIG. 53, there is provided an isolation region which surrounds p-ch power device with trench isolation therebetween, and the isolation region is set to a potential equal to the source potential, whereby the potential at the side wall of trench can be stable. More specifically, as shown in FIG. 53, an isolation region, which is formed of a layered structure including high resistance n-type layer 5, an n-type layer 521 and a heavily doped n-type layer 523, is disposed around the p-ch IGBT with the trench isolation formed of trench 63 therebetween. Heavily doped n-type layer 523 in this isolation region and p⁺ source layer 309 in the p-ch IGBT are electrically connected together via a common first interconnection layer 553b.

The above structure can stabilize the potential at the side wall of trench 63 in a shielded form. In this specification and claims, interconnection layer 553b is called a shield electrode.

Embodiment 7

Figure 54:
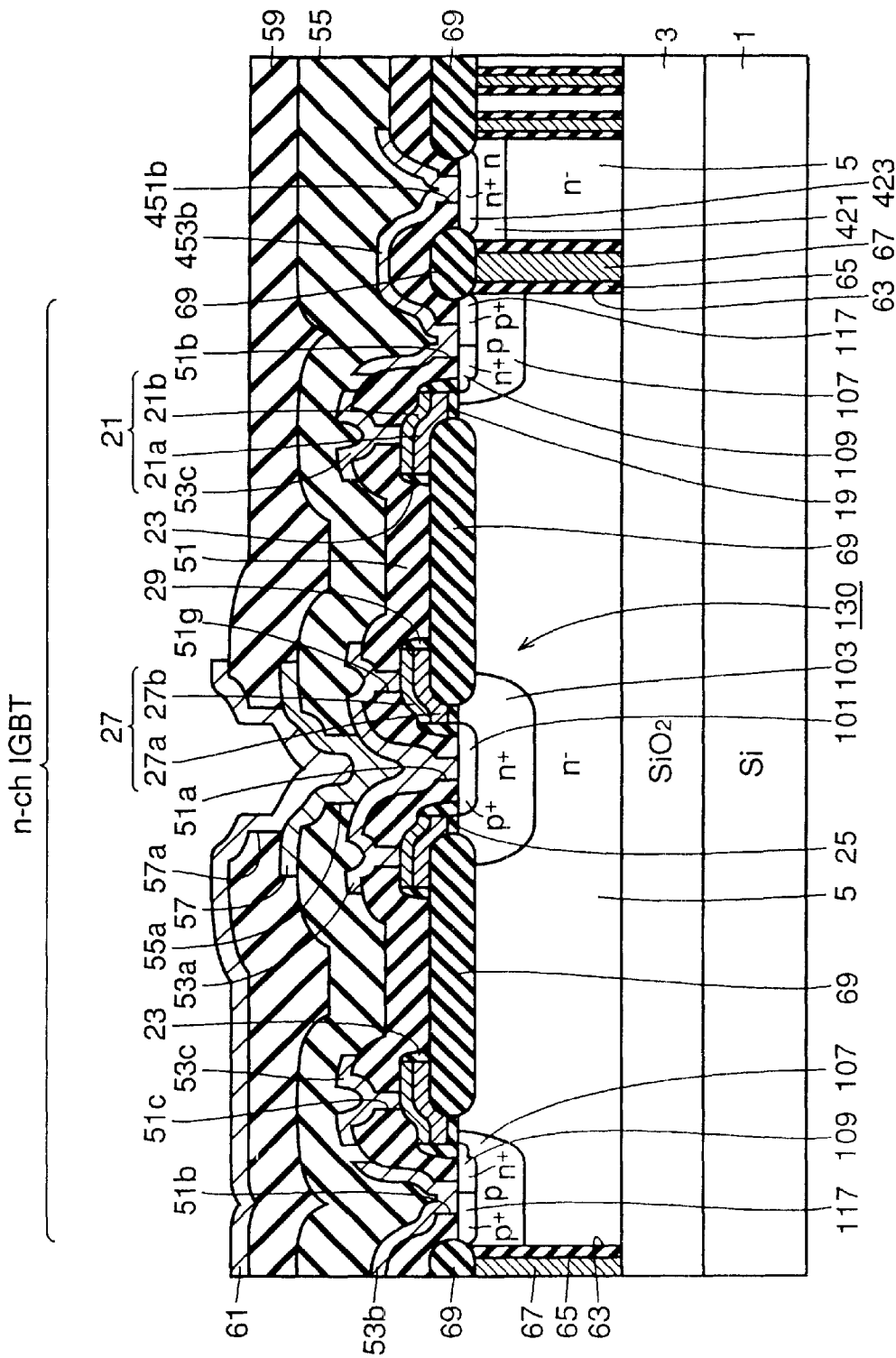
FIG. 54 is a cross section schematically showing a structure of a semiconductor device of an embodiment 7 of the invention.

Isolation regions 5, 521 and 523 as well as shield electrode 553b which are set to the potential equal to that of the source region in the embodiment 6 may be used not only in the p-ch power device but also in n-ch power element such as an n-ch IGBT shown in FIG. 54.

Referring to FIG. 54, an isolation region, which is formed of a layered structure including high resistance n-type layer 5, n-type layer 421 and heavily doped n-type layer 423, is disposed around a region for forming the n-ch IGBT with trench isolation formed of trench 63 therebetween. Heavily doped n-type layer 423 in this isolation region and n⁺ source layer 109 in the n-ch IGBT are set to an equal potential by shield electrode 453b.

Owing to the above structure, the potential of the side wall of trench 63 can be stabilized in a shielded form similarly to the embodiment 6.

Embodiment 8

Figure 55:
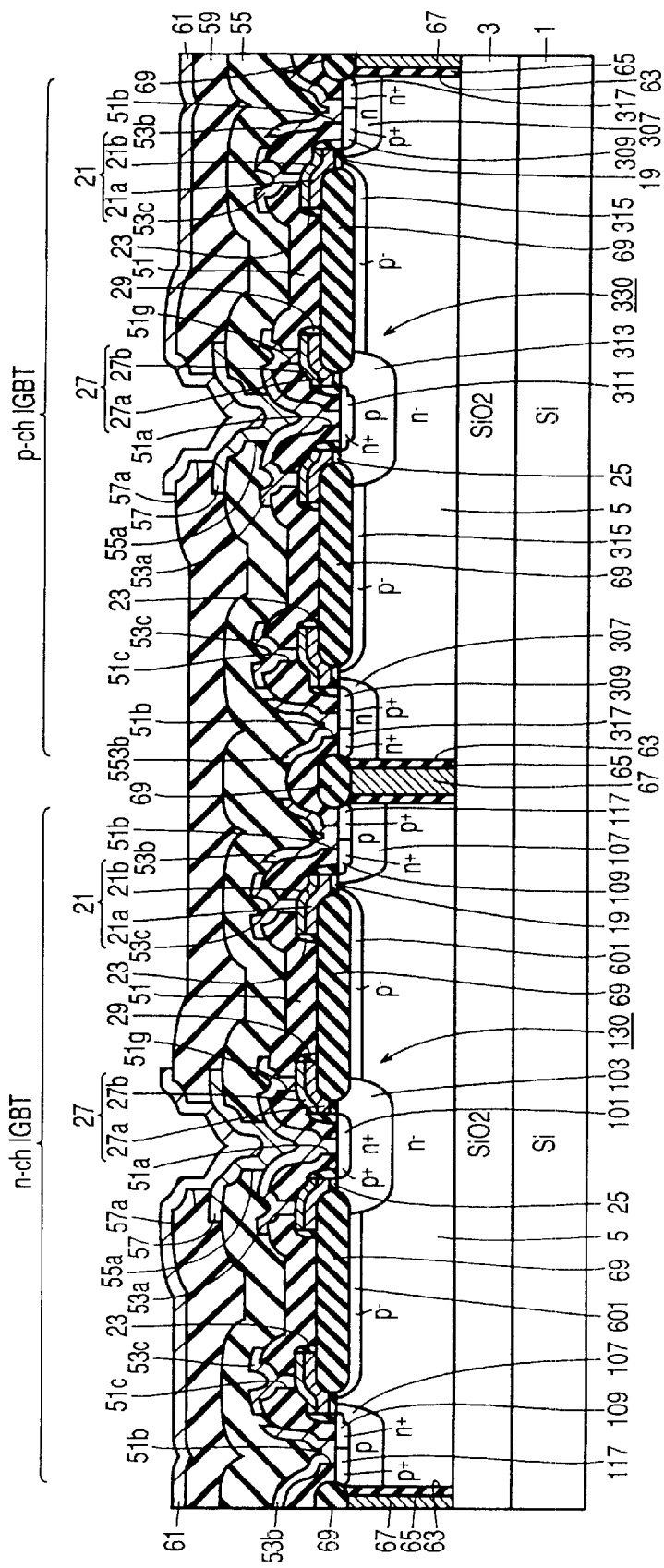
FIG. 55 is a cross section schematically showing a structure of a semiconductor device of an embodiment 8 of the invention.

Referring to FIG. 55, this embodiment provides a structure in which a lateral p-ch IGBT and a lateral n-ch IGBT are formed at a common n-type laminated SOI substrate. In this structure, it is desirable to provide at a position immediately under field oxide film 69 a p⁻ top layer 601, which is adjacent to n-type buffer layer 103 and is opposed to n⁺ source layer 109 with a predetermined distance therebetween.

Structures other than the above are similar to those already described. More specifically, structures of the n-ch IGBT are similar to those shown in FIG. 19, and structures of the p-ch IGBT are similar to those shown in FIG. 45. Similar portions and parts bear the same reference numbers, and will not be described below.

Figure 56:
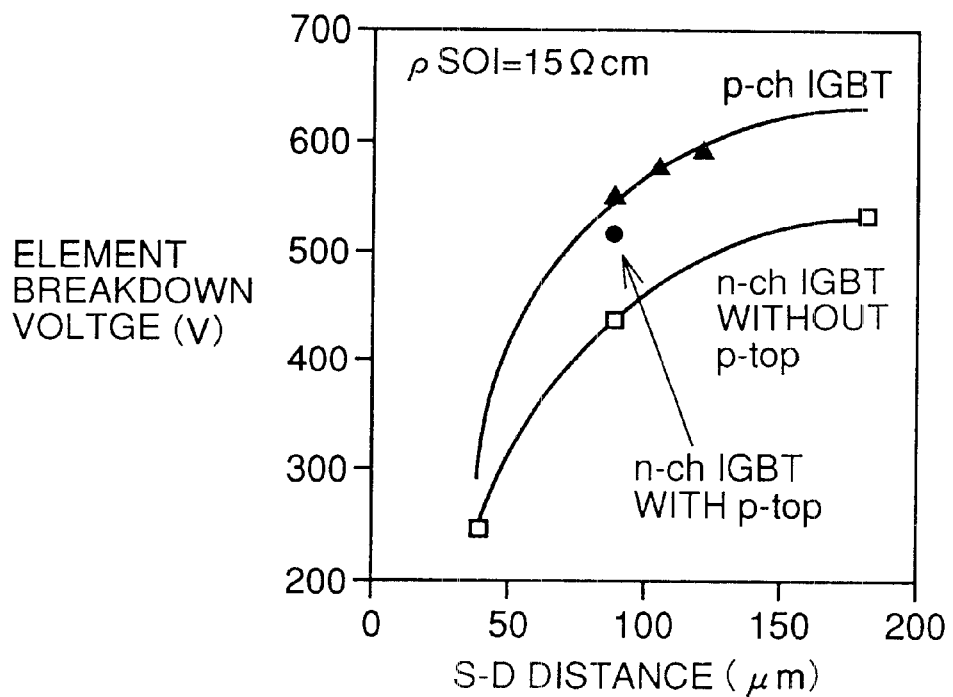
FIG. 56 is a graph showing a breakdown voltage of various IGBTs depending on a source/drain distance of the same.

In this embodiment, since the n-ch IGBT is provided with p⁻ top layer 601 immediately under the field oxide film, high and substantially equal element breakdown voltages can be achieved in p-ch and n-ch IGBTs as shown in FIG. 56 by setting concentrations of p⁻ drain layer 315 of p-ch IGBT and p⁻ top layer 601 of n-ch IGBT to values that cause complete depletion when a high voltage is applied thereto in the off state.

Embodiment 9

Figure 57:
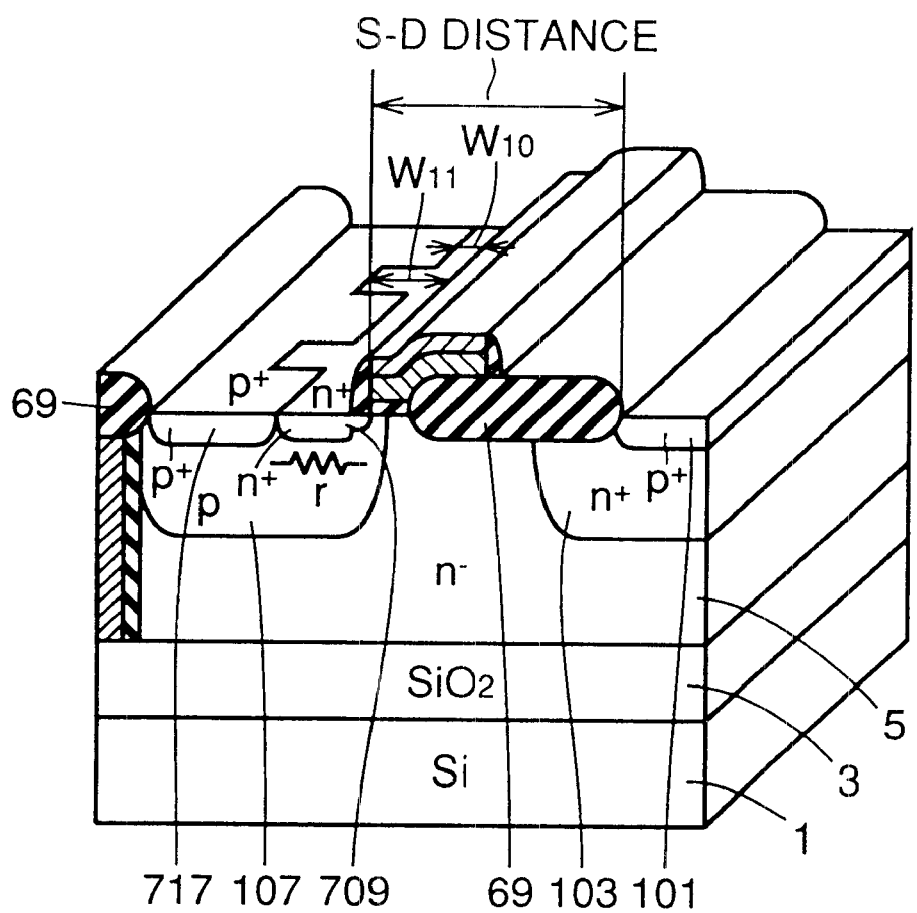
FIG. 57 is a perspective view schematically showing a sectional structure of a semiconductor device of an embodiment 9 of the invention.

Referring to FIG. 57, an n-ch IGBT is provided with n⁺ source layer 709 and a heavily doped p-type layer 717 which form a junction of a comb-like configuration in a plan view.

As already described in connection with embodiment 2, p-base resistance is a factor determining a latch-up form. Therefore, the comb-like configuration of the junction between n⁺ source layer 709 and heavily doped p-type layer 717 lowers a p-base resistance r locally at a portion immediately under the n⁺ source layer as shown in FIG. 57. More specifically, at a portion where junction portion of n⁺ source layer 709 and heavily doped p type layer 717 protrudes (enters) toward n⁺ source layer 709, n⁺ source layer 709 comes to have smaller width $W_{10}$. Since width $W_{10}$ of n⁺ source layer 709 is small, p-base resistance r at this portion is low. Therefore, this structure can improve the latch-up form.

Portions of n⁺ source layer 709 having a large width $W_{11}$ is required for ensuring contact with the source leading electrode layer.

Embodiment 10

Figure 58:
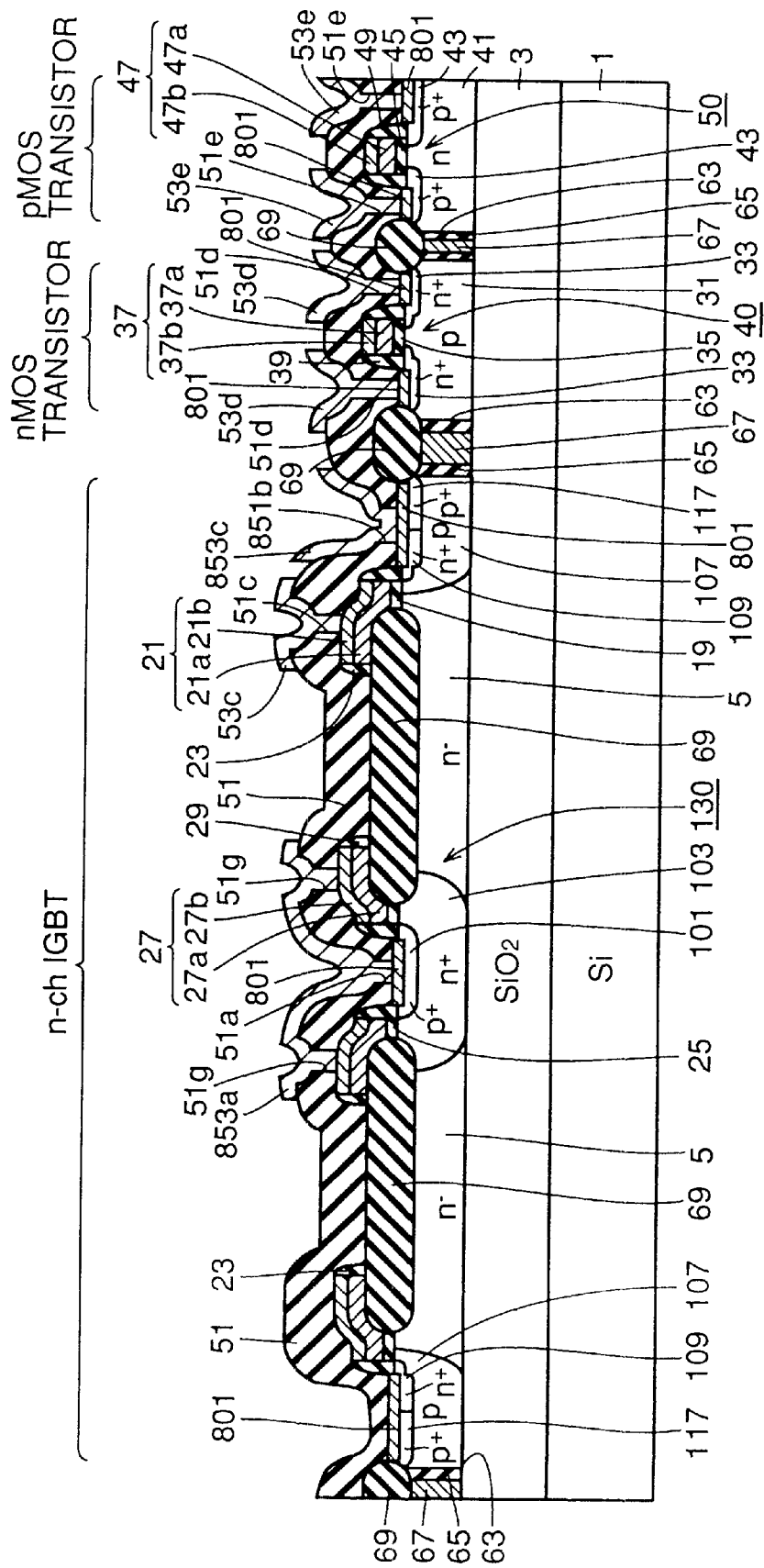
FIG. 58 is a cross section schematically showing a structure of a semiconductor device of an embodiment 10 of the invention.

Referring to FIG. 58, this embodiment provides a structure in which a lateral n-ch IGBT is arranged together with a CMOS transistor. In this embodiment, silicidation occurs at surfaces of n⁺ source layer 109, heavily doped p-type layer 117, p⁺ drain layer 101, source/drain layers 33 of nMOS transistor and source/drain layers 43 of pMOS transistor, so that silicide layers 801 are formed at these surfaces.

By silicidation of the surface of n⁺ source layer 109, the sheet resistance of p⁺ source layer 109 can be reduced. Thereby, a current can be supplied to the entire circumference of n⁺ source layer 109 via silicide layer 801 with a small resistance. Therefore, a source leading interconnection layer 853c is not required to be in contact with the surface of n⁺ source layer 109 through the entire circumference of n⁺ source layer 109, but is required only to be in contact with a portion of the surface of n⁺ source layer 109.

Since source leading interconnection layer 813c is not required to have an elliptical form, source leading interconnection layer 853c and drain leading interconnection layer 813a are not short-circuited even in the structure in which these layers are formed on the same insulating layer.

N-type buffer layer 103, p-type base layer 107, p-type well layer 31 and n-type well layer 41 may be extended to insulating layer 3 made of a silicon oxide film. Even in this case, this power device operates in the same manner.

Embodiment 11

Figure 59:
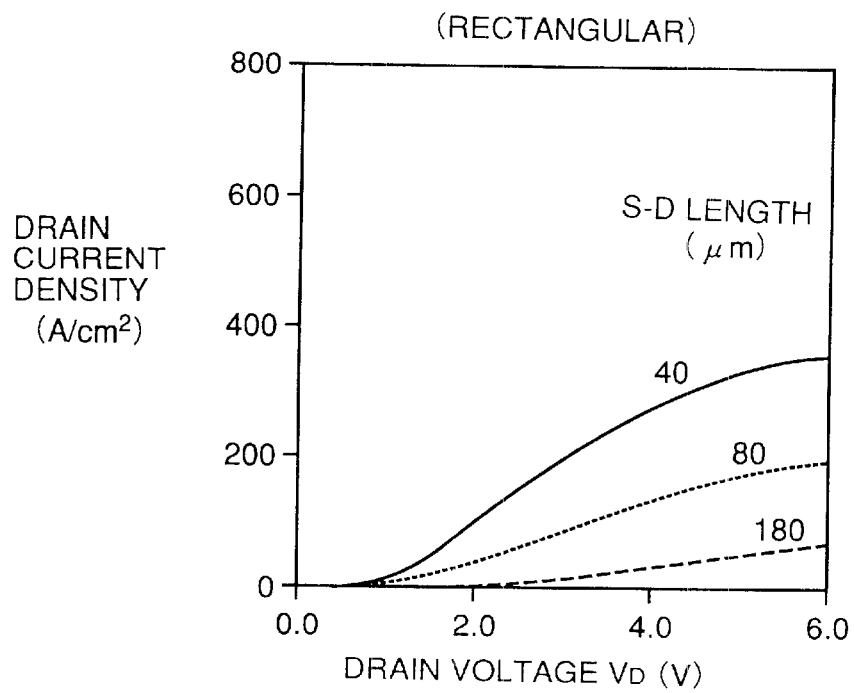
FIG. 59 shows relation between the ground voltage of an n-ch IGBT having a rectangle structure and a drain current density.
Figure 60:
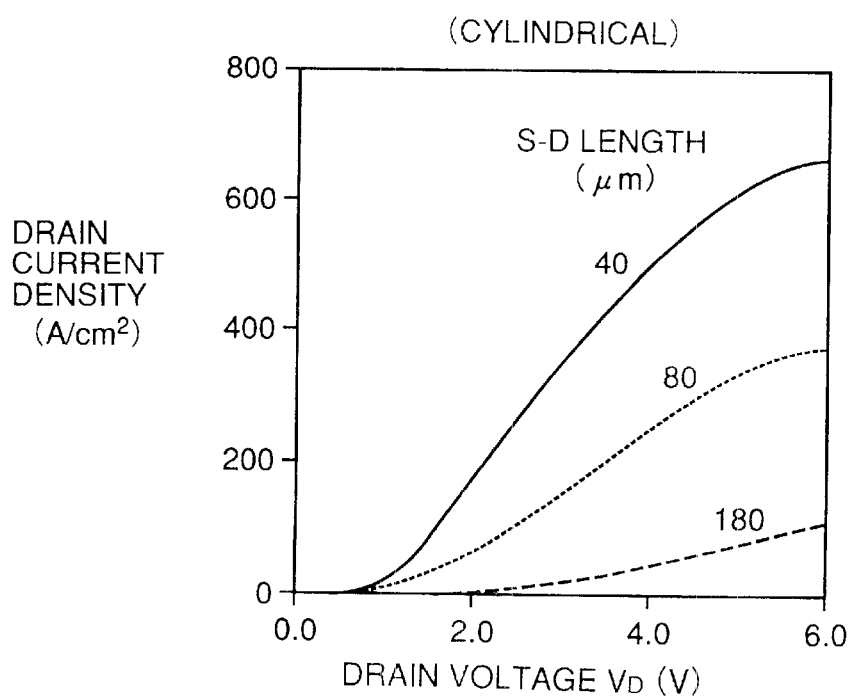
FIG. 60 shows relation between the drain voltage of an N-ch IGBT having a cylindrical structure and the drain current density.

FIGS. 59 and 60 represent results of simulation of the drain current appeared on the abscissa of the graphs shown in FIGS. 38 and 39 in the equivalent of current density (the value obtained by dividing the drain current by planar occupation area of n-ch IGBT).

Referring to FIGS. 59 and 60, from the results of simulation, it was found that given the same S-D distance, higher drain current density can be obtained by the cylindrical structure, than the rectangular structure. More specifically, if the surface shape of the drain of n-ch IGBT is approximately circular and the surface shape of the first region surrounding the drain region is an approximately circular region (that means the inner periphery and the outer periphery define the ring approximately circular), highest drain current density can be obtained, and a optimal structure allowing improved latch up capability can be obtained.

From the results of simulation described above, in order to increase the drain current density and to improve latch up capability, a structure may be used in which planer shape of the unit cell of the n-ch IGBT has a cylindrical structure and the unit cells are developed as an array. An example of such a structure in which the unit cells are developed as an array will be described as Embodiment 11, in the following.

Figure 61:
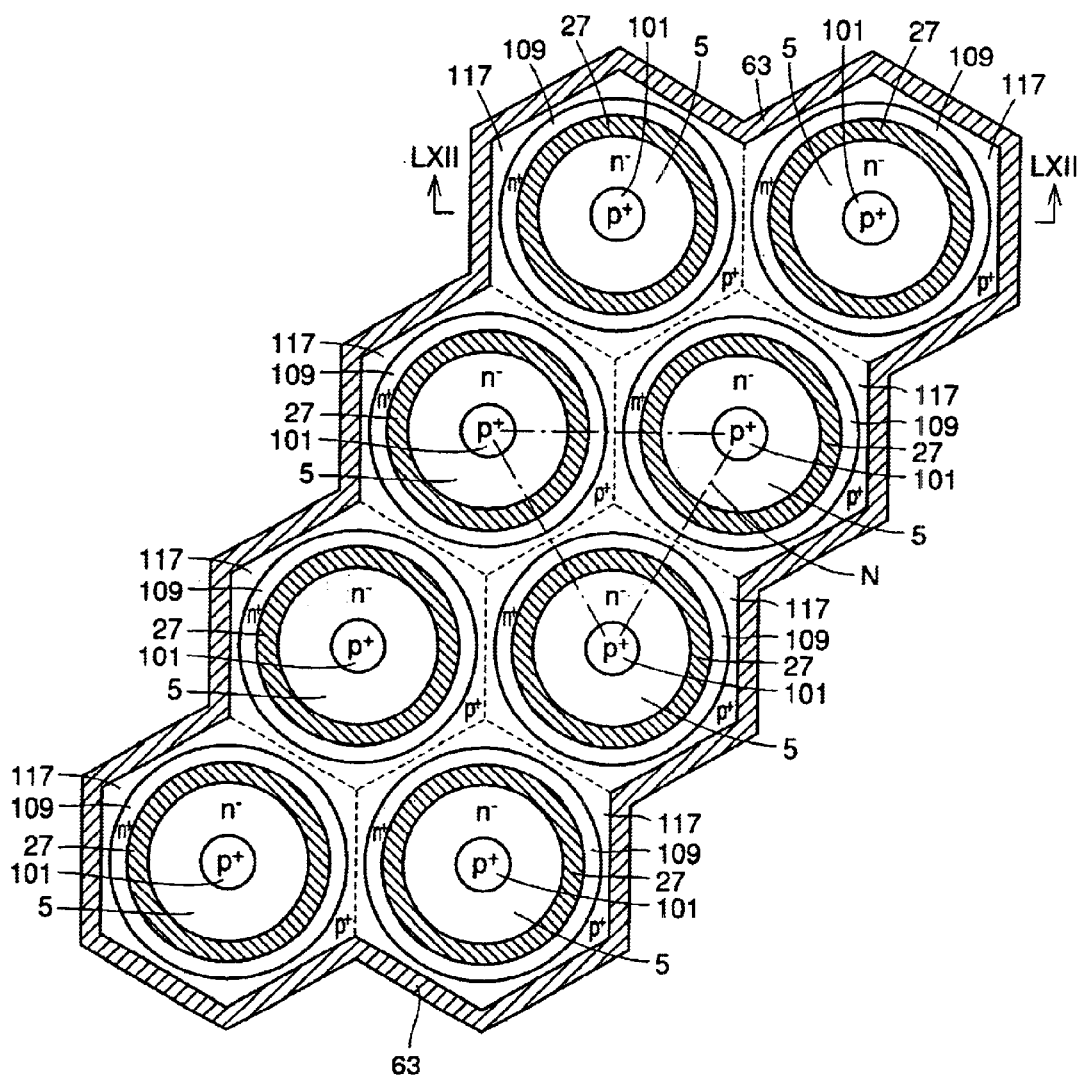
FIG. 61 is a schematic plan view showing unit cells arranged in a honeycomb.

FIG. 61 is a planar layout schematically showing the structure of the semiconductor device in accordance with Embodiment 11. Referring to FIG. 61, unit cells having the above described cylindrical structure are arranged in a hypothetical hexagonal planar region, and hence respective unit cells can be packed dense in a honeycomb without any area wasted. The honeycomb planar layout, in other words, is an arrangement in which centers of p$^+$ drain regions 101 of mutually adjacent three unit cells having cylindrical structures positioned at vertexes of an approximately equalateral triangle N.

Figure 62:
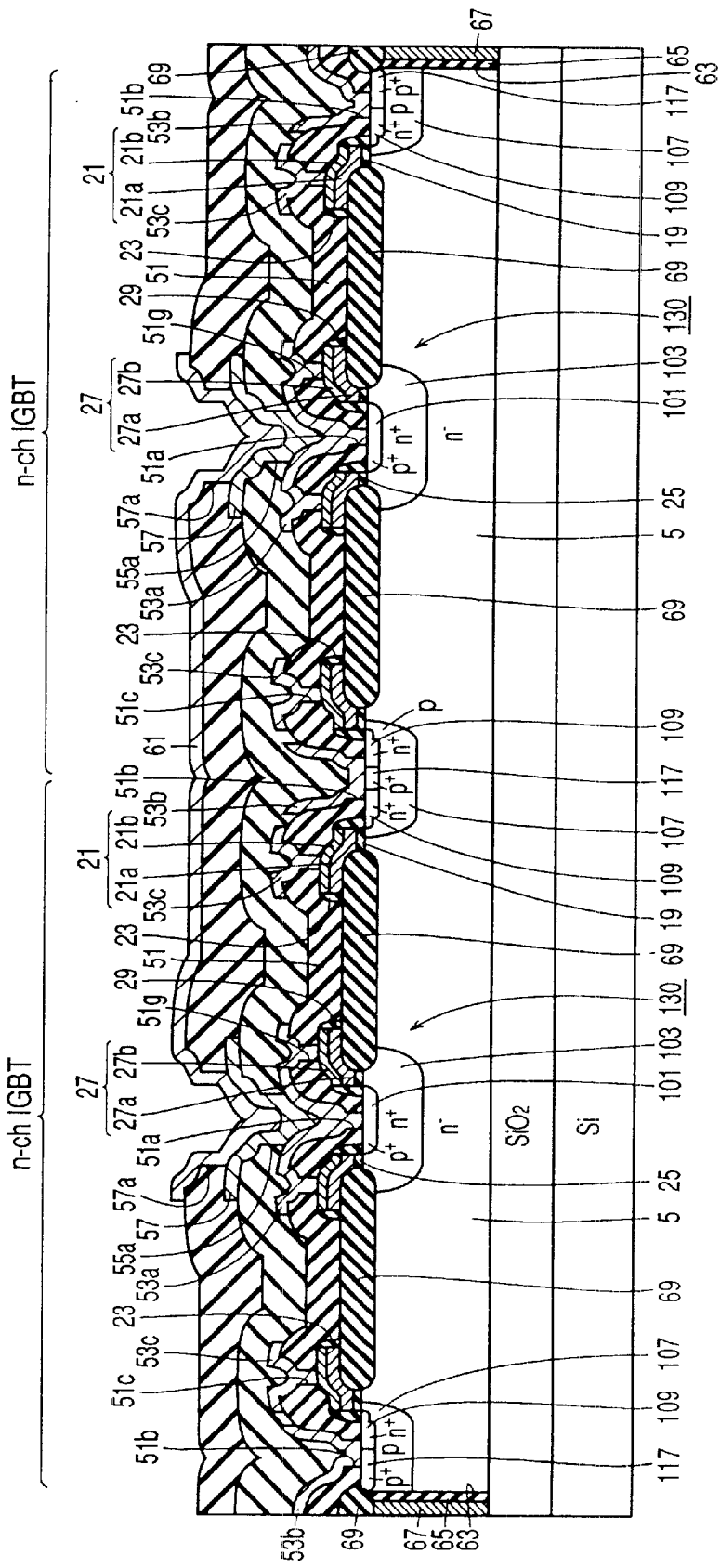
FIG. 62 is a schematic cross section taken along the line LXII–LXII of FIG. 61.

FIG. 62 is a schematic cross section taken along the line LXII–LXII of FIG. 61. Referring to FIGS. 61 and 62, in this embodiment, the separation by the trench is not cell from cell, and the cell array as a whole is separated by the trench. In other words, the trench 63 is formed along the outer periphery of the cell array developed in a honeycomb. Therefore, there is not a trench 63 between adjacent n-ch IGBTS, and p type layer 117 having high concentration is shared by the unit cells.

Further, p$^+$ drain region, gate electrode layer, and n$^+$ source region of each unit cell are connected to each other by a metal interconnection or the like (not shown).

Other than those described above, the structure is similar to the arrangement shown in FIG. 19 in which n-ch IGBTs are arranged adjacent to each other. Therefore, corresponding portions are denoted by the same reference characters and description thereof is not repeated.

Figure 63:
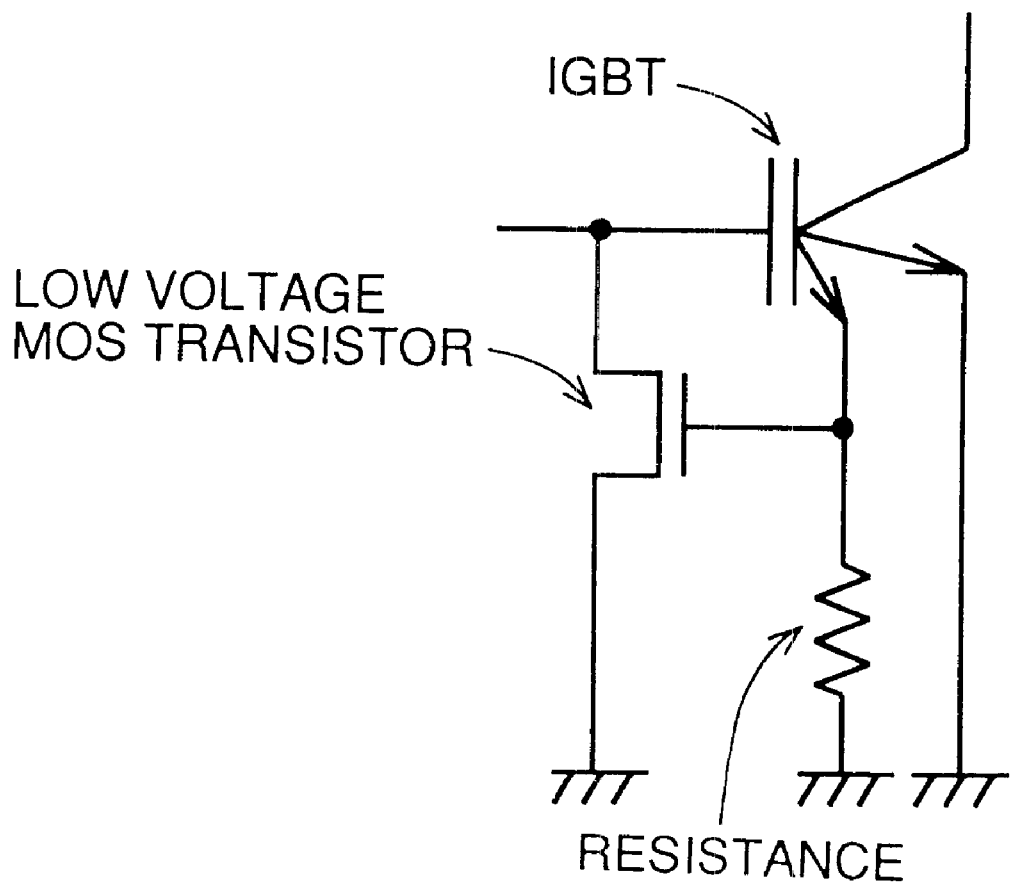
FIG. 63 is a circuit diagram of a real time clamp circuit by excessive current detection.

Here, the IGBT used for the real time clump circuit by excessive current detection may have multiple sources as shown in FIG. 63, with one source being provided with a resistance. By setting the product of the excessive current and the resistance to be the threshold voltage of the MOS transistor in case an excessive current flows, it becomes possible to set the gate electrode of the IGBT immediately to the source potential, thus it becomes possible to prevent breakdown of the IGBT. When the IGBT is to be used for such application, the structure is not limited to the one shown in FIGS. 61 and 62, and trench separation of unit cell from unit cell may be provided, as will be described in the following.

Figure 64:
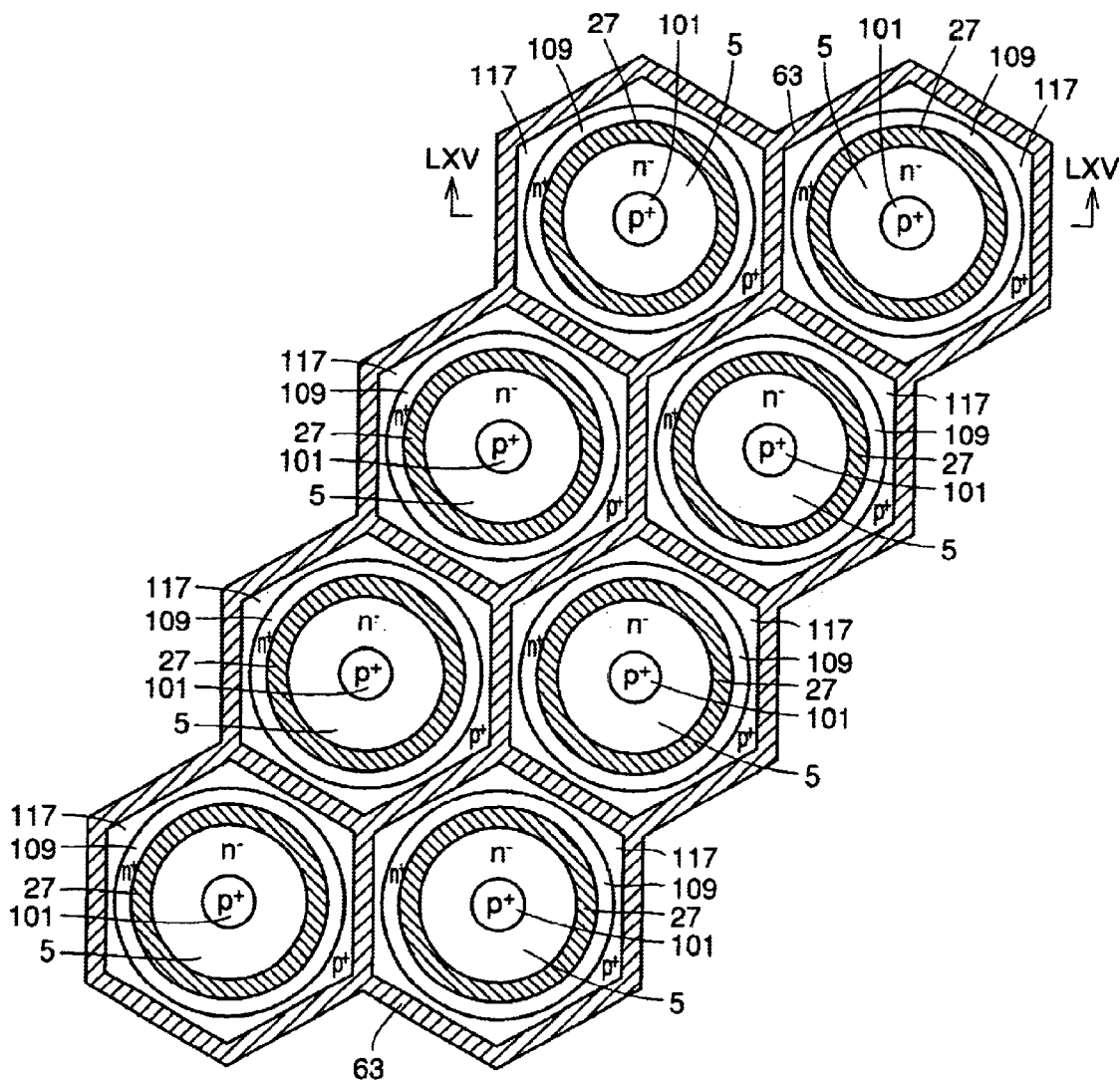
FIG. 64 is a schematic plan view showing unit cells arranged in a honeycomb and unit cells are isolated from each other by a trench.
Figure 65:
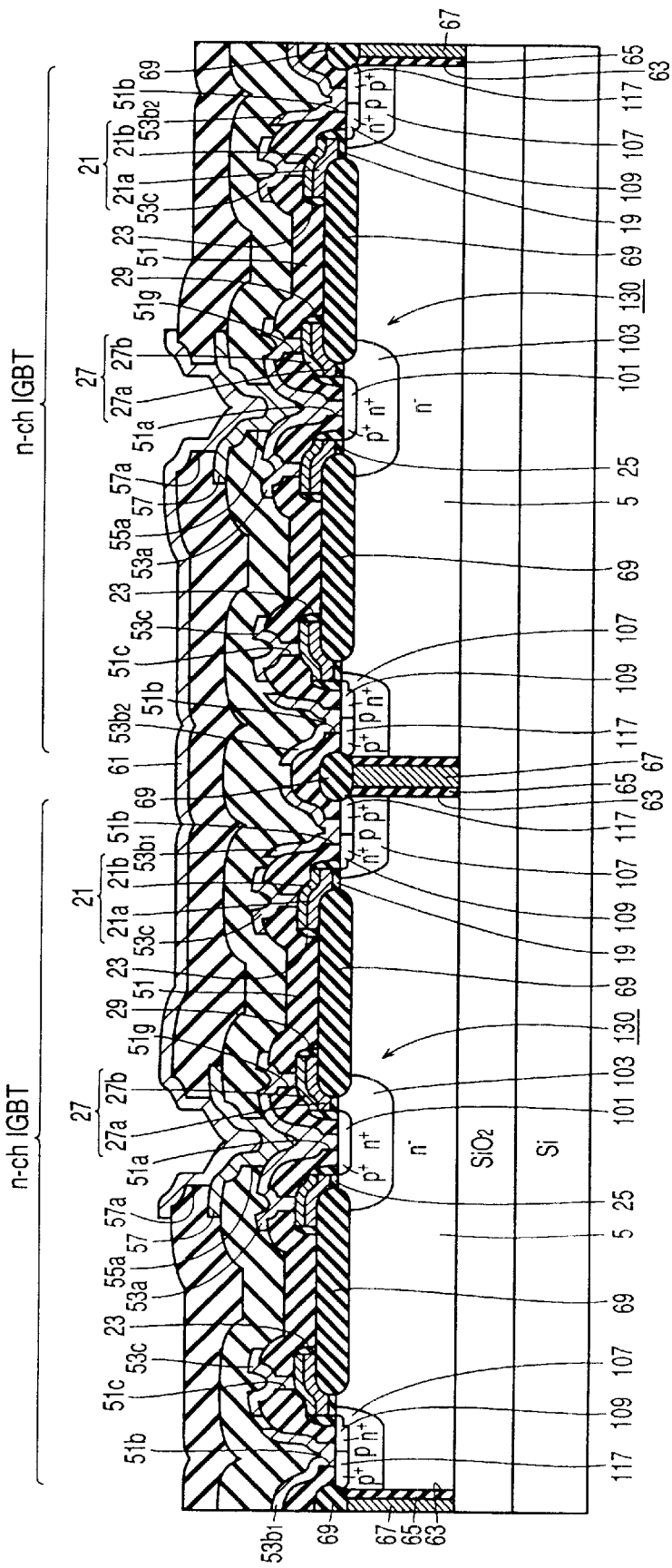
FIG. 65 is a schematic cross section taken along the lines LXV–LXV of FIG. 63.

FIG. 64 is a planar layout showing the structure in which unit cells are separated from each other by the trench. FIG. 65 is a schematic cross section taken along the line LXV- -LXV of FIG. 64.

Referring to FIGS. 64 and 65, unit cells are separated from each other by the trench. Therefore, not only in the outer periphery of the cell array but also between adjacent n-ch IGBT, there is at least one trench 63. Here, the source leading interconnection layers 53$b_1$ and 53$b_2$ provided in each n-ch IGBT are separated for the IGBT used for detecting excessive current and the IGBT not used for the detection. In other words, source leading interconnection layer 53$b_1$ and source leading interconnection layer 53$b_2$ are electrically insulated from each other. Separation of the source leading interconnection layers 53$b_1$ and 53$b_2$ is effective in minimizing current by the voltage effect of the resistance.

Here, the gate electrode layers 21, and p$^+$ drain region 101, of adjacent n-ch IGBTs are electrically connected.

Other than these points, the structure is approximately similar to the one described with reference to FIGS. 61 and 62. Therefore, corresponding portions are denoted by the same reference character and description thereof is not repeated.

Embodiment 12

Figure 66:
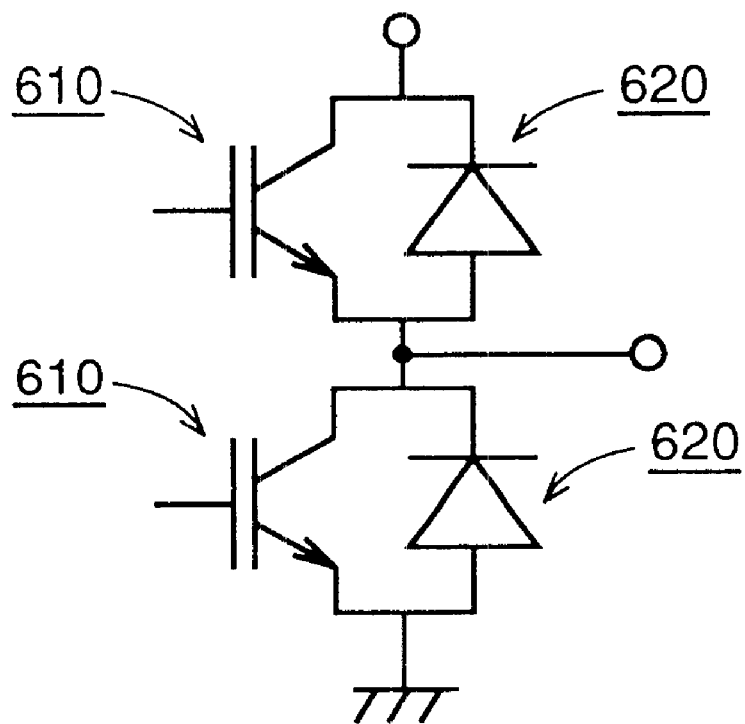
FIG. 66 is a schematic diagram showing a half bridge circuit.
Figure 67:
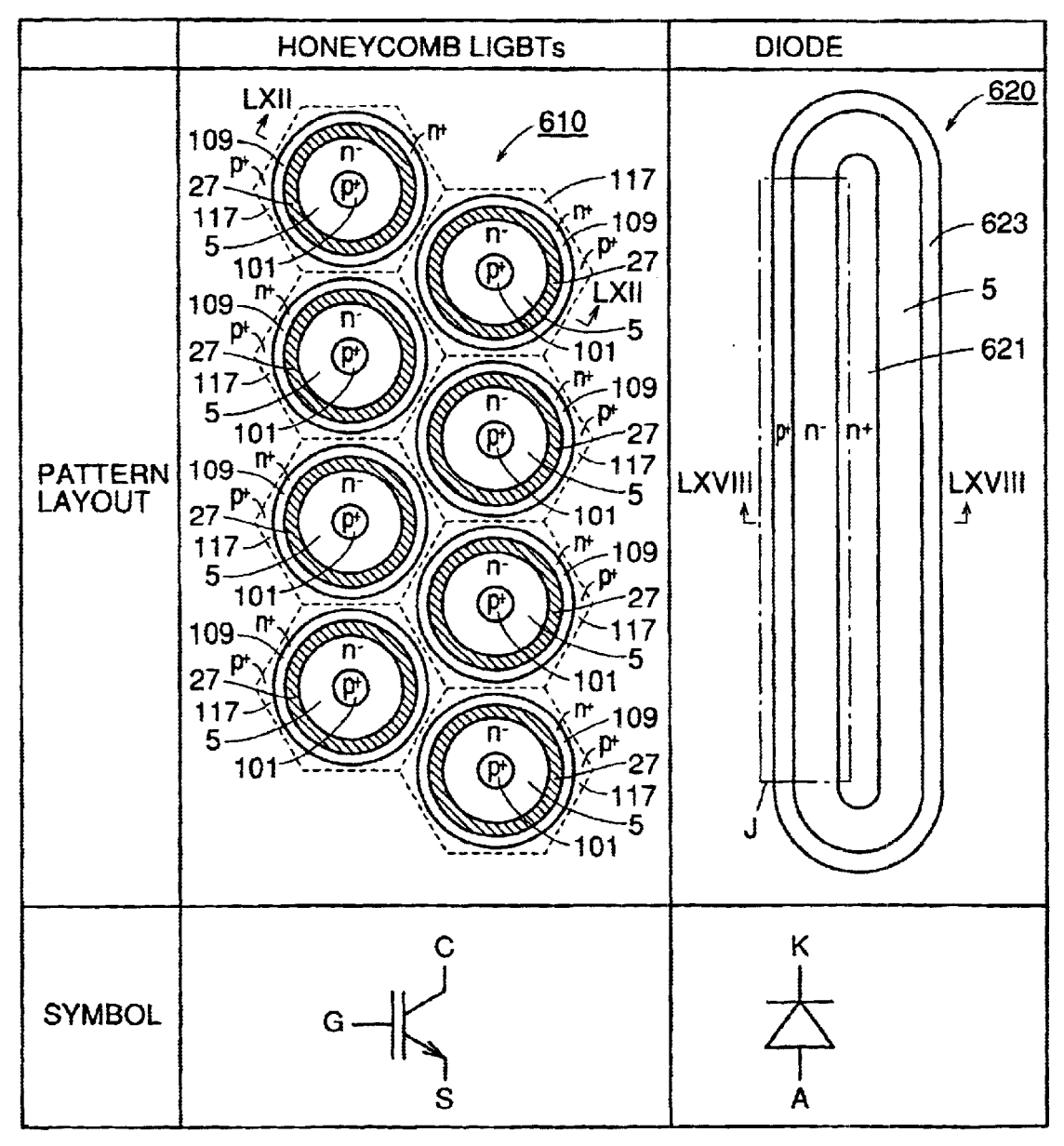

The half bridge circuit such as shown in FIG. 66 includes an IGBT 610 and a diode 620. When the IGBT having the above described cylindrical structure is to be used for the IGBT 610 of the half bridge circuit, the cell array developed in a honeycomb, for example, is used as the IGBT 610, a track shaped diode is used as diode 620, for example, as shown in FIG. 67. The structure of the diode constituting the half bridge circuit and the stage of connection of the interconnection will be described.

Figure 68:
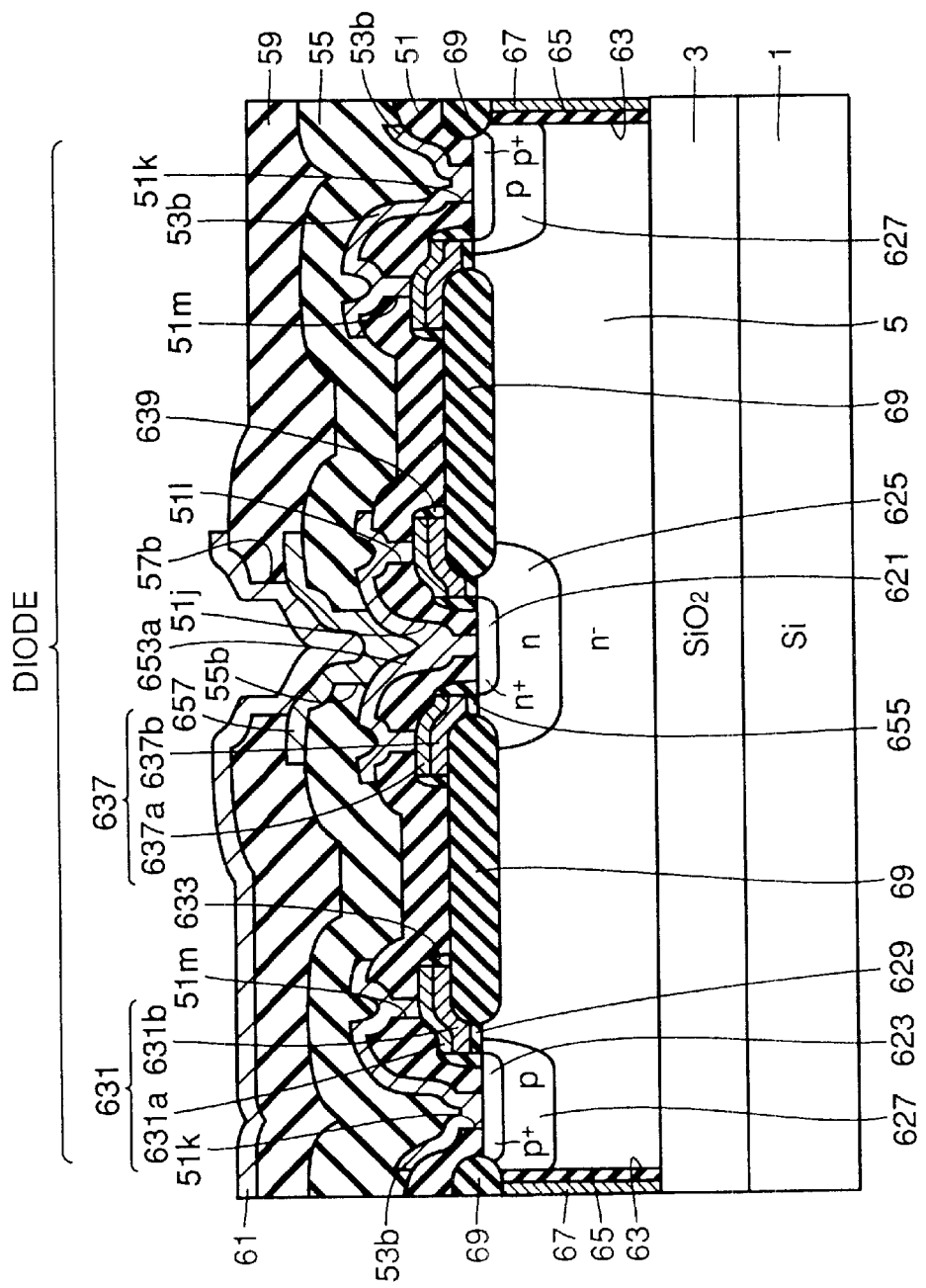
FIG. 68 is a schematic cross section of the diode taken along the line LXVIII–LXVIII of FIG. 67.
Figure 69:
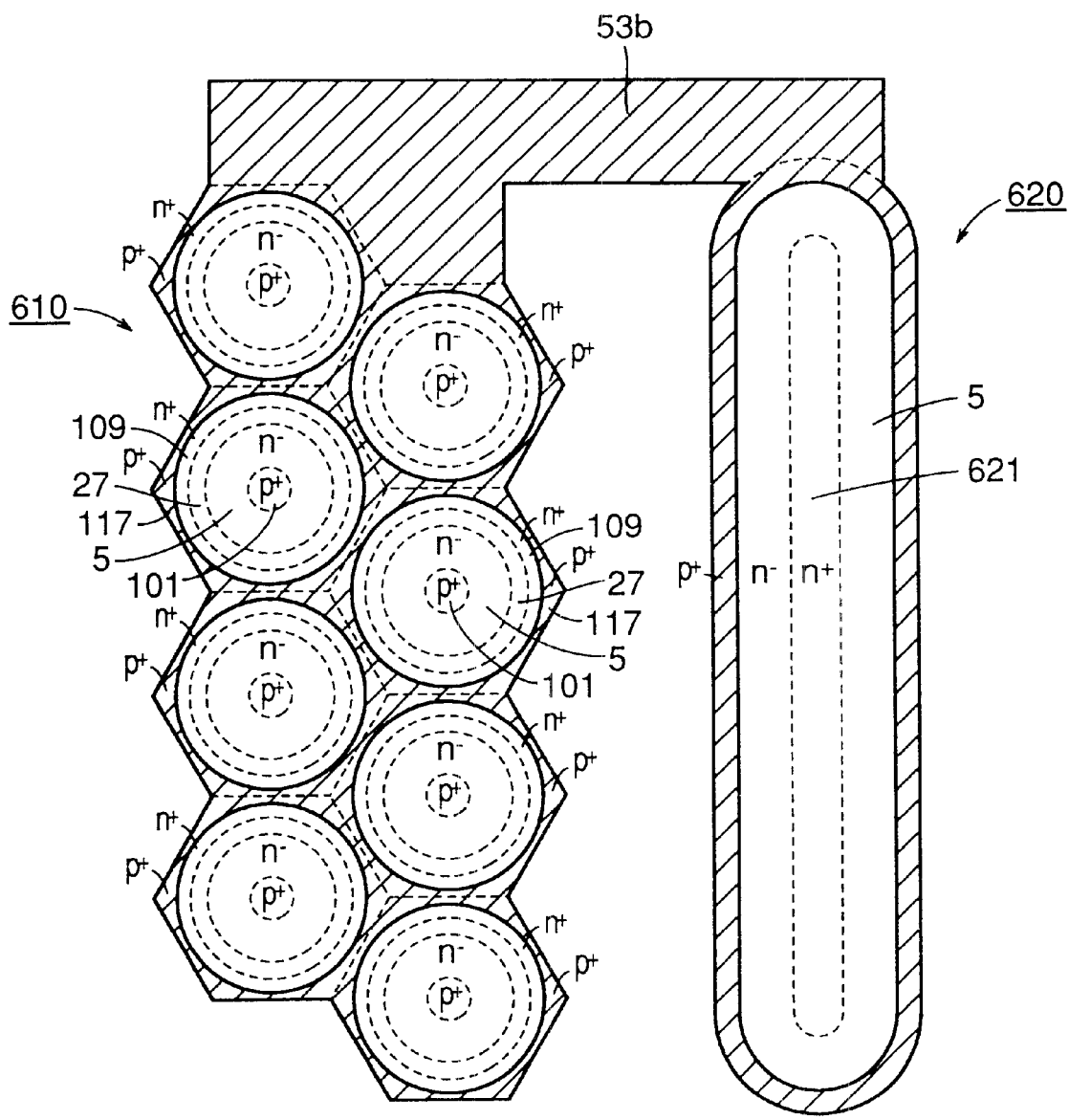
FIG. 69 is a schematic plan view showing the structure of a first stage of an interconnection layer connecting the IGBT and the diode used in the half bridge circuit.
Figure 70:
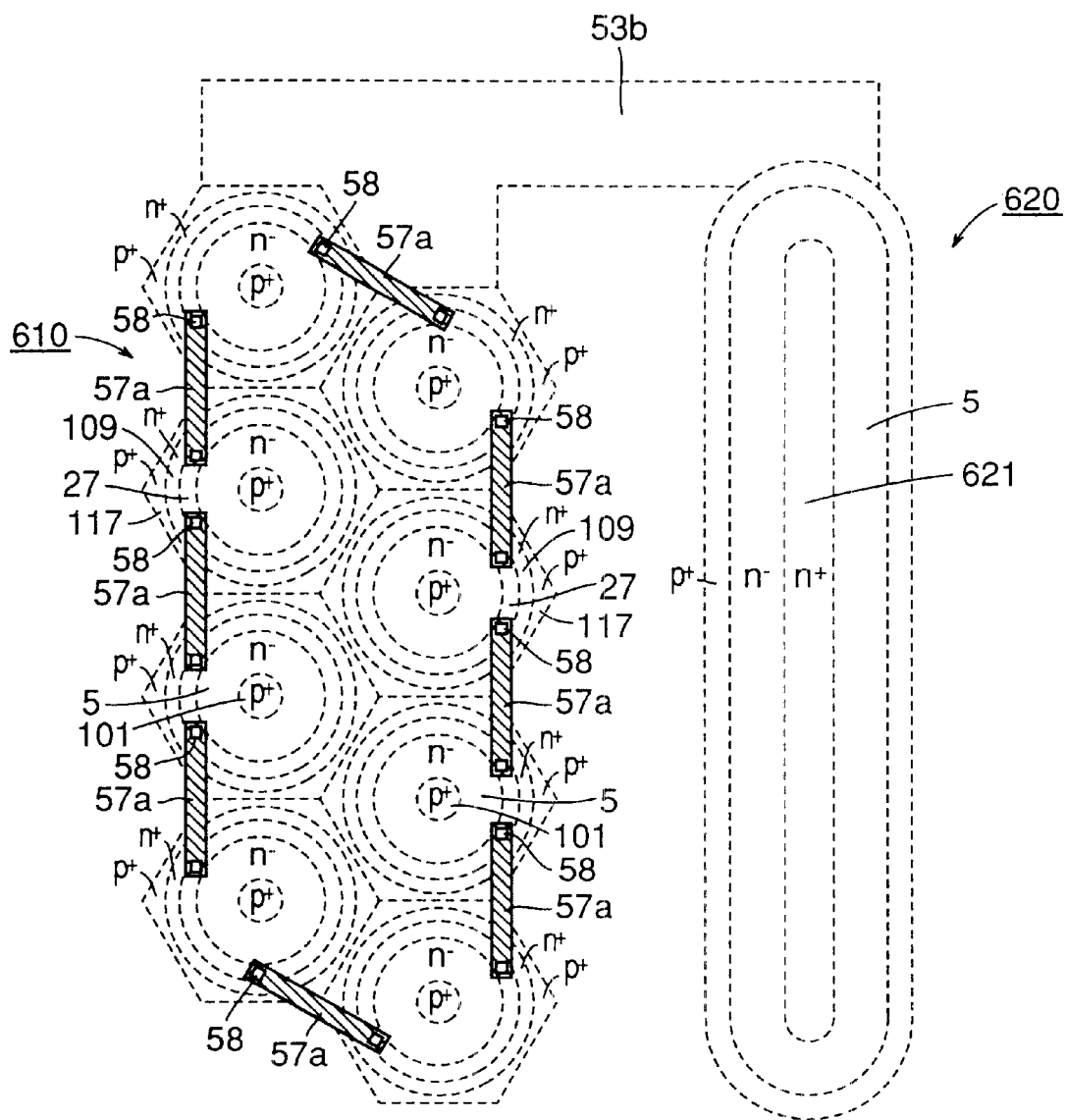
FIG. 70 is a schematic plan view showing the structure of a second stage of the interconnection layer for connecting the IGBT and the diode used in the half bridge circuit.
Figure 71:
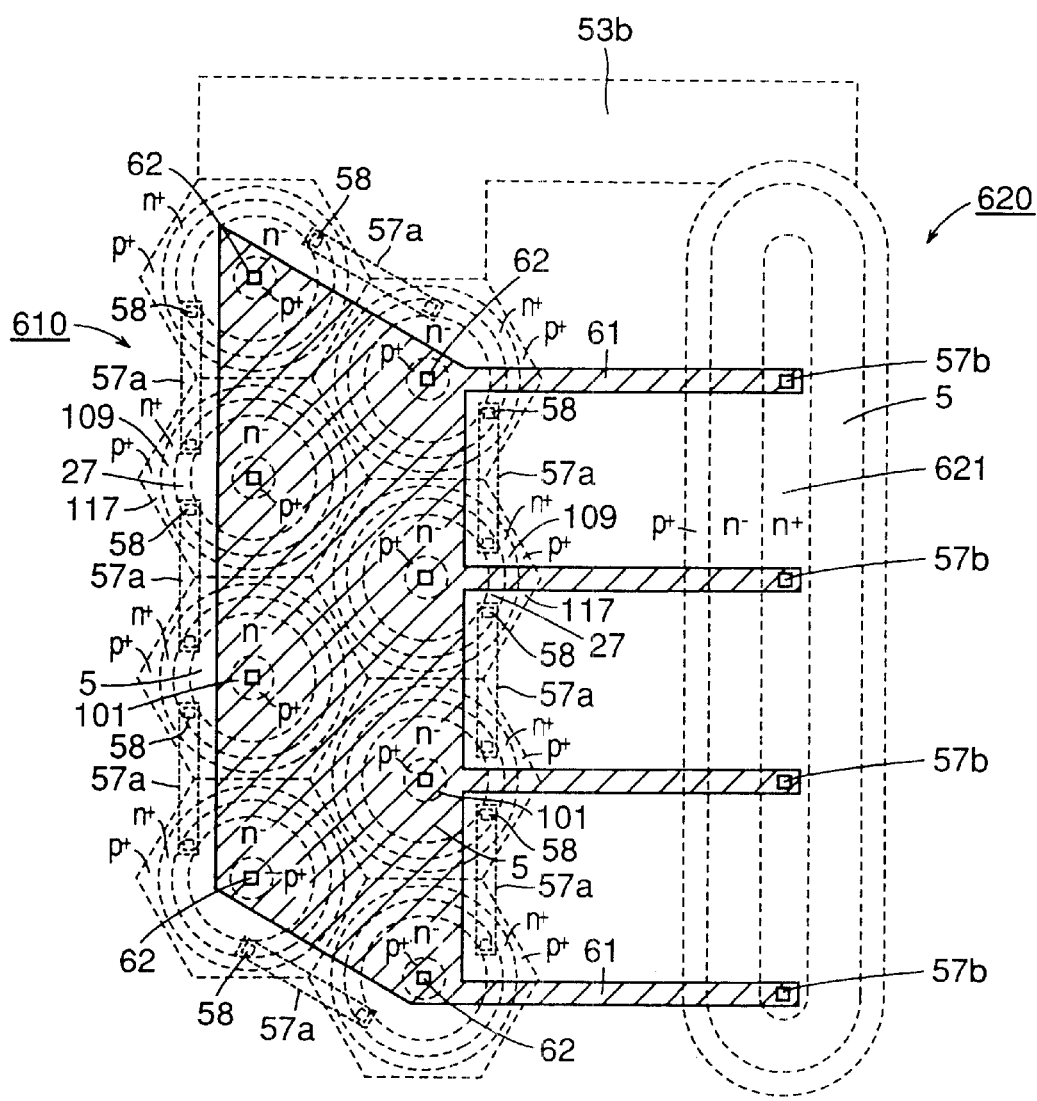
FIG. 71 is a schematic plan view showing the structure of the third stage of the interconnection layer connecting the IGBT and the diode used in the half bridge circuit.

FIG. 68 is a schematic cross section taken along the line LXVIII–LXVIII of the diode shown in FIG. 67. FIGS. 69 to 71 are schematic plan views showing the arrangement of interconnections connecting the IGBT and the diode, in three stages starting from the lower layer.

Referring to FIGS. 67 and 68, high resistance n type base layer 5 is formed on the surface of silicon substrate 1, with an insulating film 3, for example, of silicon oxide film interposed. The diode formation region of the high resistance n type base layer 5 is electrically separated from other element formation regions by trench separation of trench 63.

Diode 620 has an n$^+$ cathode layer 621 and a p$^+$ anode layer 623. The n$^+$ cathode layer 621 is formed at the surface of an n type layer 625 formed in the high resistance n type base layer 5. The p$^+$ anode layer 623 is formed at the surface of p type layer 627 formed in the high resistance n type base layer 5.

At the surface of high resistance n type base layer 5, p$^+$ anode layer 623 surrounds the periphery of n$^+$ cathode layer 621, whereby the diode 620 has a track shape. This track shape ensures the portion (region j of FIG. 67) where the pn junction consisting of p$^+$ anode layer 623 and high resistance n type base layer 5 extends linearly at the surface of the semiconductor layer.

On the region of n type layer 625, a conductive layer 637 is formed with an insulating layer 655 interposed. On the surfaces of p type layer 627 and higher resistance n type base layer 5, a conductive layer 631 is formed with an insulating layer 629 interposed. The conductive layers 637 and 631 have two-layered structures including doped polysilicon layers 637a, 631a and tungsten silicide layers 633b, 631b, respectively. On the side walls of conductive layer 637 and 631, side wall oxide films 639 and 633 are formed, respectively.

On the diode formation region, a first interlayer insulating layer 51 is formed. First interconnection layers 653a and 53b are formed to be electrically connected to respective lower layers through contact holes 51j and 51k provided in the first interlayer insulating layer 51. The first interconnection layer 53b is an anode leading interconnection layer.

Mainly referring to FIG. 69, anode leading interconnection layer 53b is formed to be in contact with the surface of p$^+$ anode layer 623 around the entire periphery of the p$^+$ anode layer 623 formed in an elliptical shape. The anode leading interconnection layer 53b is formed integrally with the source leading interconnection layer 53b which is electrically connected to the n$^+$ source layer of the IGBT. In other words, the p$^+$ anode layer 623 of the diode and the n$^+$ source layer of the IGBT are electrically connected.

Mainly referring to FIG. 68, a second interlayer insulating layer 55 is formed on the first interlayer insulating layer to cover the anode leading interconnection layer 53b and the like. A second interconnection layer 657 which is electrically connected to the first interconnection layer 653a through contact hole 55b is formed.

Mainly referring to FIG. 70, in the IGBT formation region, a conductive layer 57a is formed on the second interlayer insulating layer 55. The conductive layer 57a is electrically connected to the gate electrode layer 27 of each unit cell constituting the cell array through contact hole 58.

Mainly referring to FIG. 68, a third interlayer insulating layer 59 is formed on the second interlayer insulating layer 55 to cover the second interconnection layer 657 and conductive layer 57a. In the diode formation regions, a cathode leading interconnection layer 61 is formed on the third interlayer insulating layer 59, to be eclectically connected to n$^+$ cathode layer 621 through contact hole 57b.

Mainly referring to FIG. 71, the cathode leading interconnection layer 61 is formed integrally with the drain leading interconnection layer 61 electrically connected to the p$^+$ drain layer 101 of the IGBT through contact hole 62. Namely, the n$^+$ cathode layer 621 of the diode and the p$^+$ drain layer 101 of the IGBT are electrically connected.

The cross section of the IGBT along the line LXII–LXII of FIG. 67 corresponds to the structure shown in FIG. 62, for example.

Figure 72:
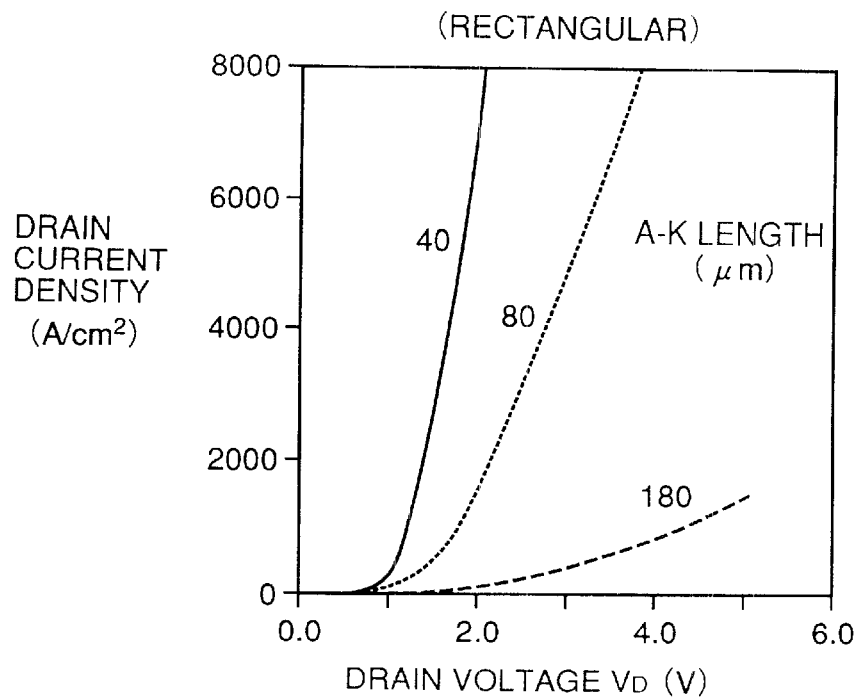
FIG. 72 shows relation between the drain voltage of a diode having a rectangle structure and the drain current density.
Figure 73:
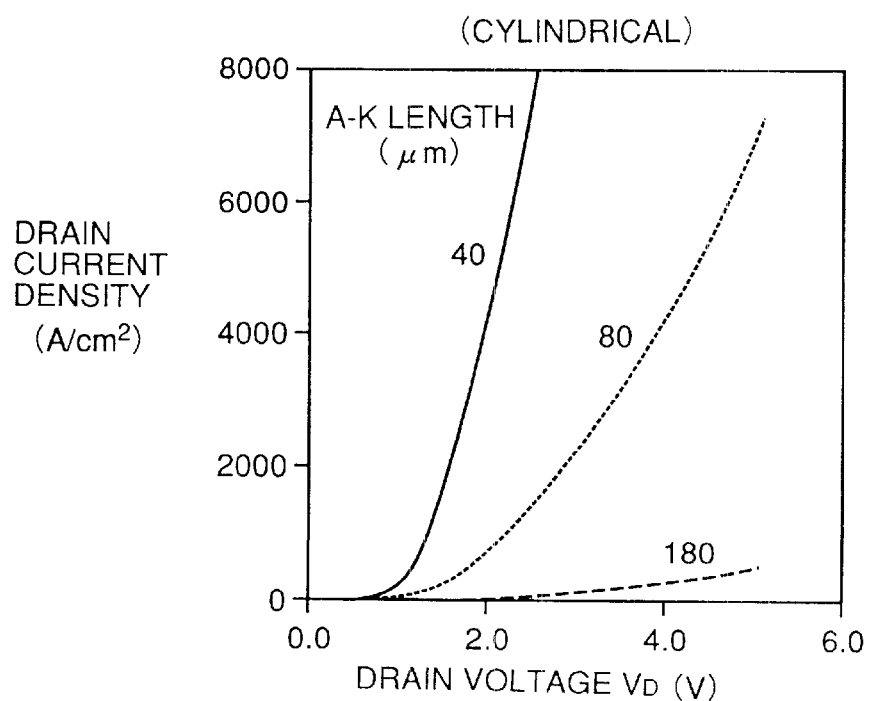
FIG. 73 shows relation between the drain voltage of a diode having a cylindrical structure and the drain current density.

Here, as for the forward (I–V) characteristic of a lateral diode, higher drain current density can be obtained in a rectangle structure than the cylindrical structure, as shown in FIGS. 72 and 73. The reason is as follows.

In the IGBT, the conductivity modulation is determined by a channel current flowing through the channel at the MOS transistor portion. Therefore, in order to increase the drain current density in the IGBT, the cylindrical structure, in which the ratio of the channel area for unit planar occupation area of the IGBT can be set large, is advantageous than the rectangle structure.

However, in a diode, there is not an MOS transistor portion. Therefore, it is not necessary to have a cylindrical structure in order to increase the channel area per planar occupation area of the diode. Further, if a cylindrical structure is used, the contact area between the n$^+$ cathode layer 621 and the cathode region interconnection layer 61 arranged at the center of the cylindrical structure becomes small. Further, the current density flowing in p$^+$ anode layer 627 to n$^+$ cathode layer 621 changes.

Meanwhile, in the rectangular structure, the pn junction of the diode extends linearly at the surface of the semiconductor layer (region J of FIG. 67). Therefore, contact area between n$^+$ cathode layer 621 and cathode leading interconnection layer 64 can be enlarged than in the cylindrical structure. Further, the current density flowing in from the p$^+$ anode layer 627 to n$^+$ cathode layer 621 do not change in region J. Therefore, difference in current density on the anode side and the cathode side is smaller in the rectangle structure than in the cylindrical structure. Therefore, given the same on voltage, larger current can be obtained.

As described above, a diode having a track shape having rectangle portion (surrounded by region J) is more advantageous than the cylindrical structure.

From the foregoing, in the present embodiment, the diode is adapted to have a planer shape of a trench. Therefore, as compared with a diode having a cylindrical structure, a half bridge circuit providing larger current with the same on voltage can be provided.

Embodiment 13

Figure 74:
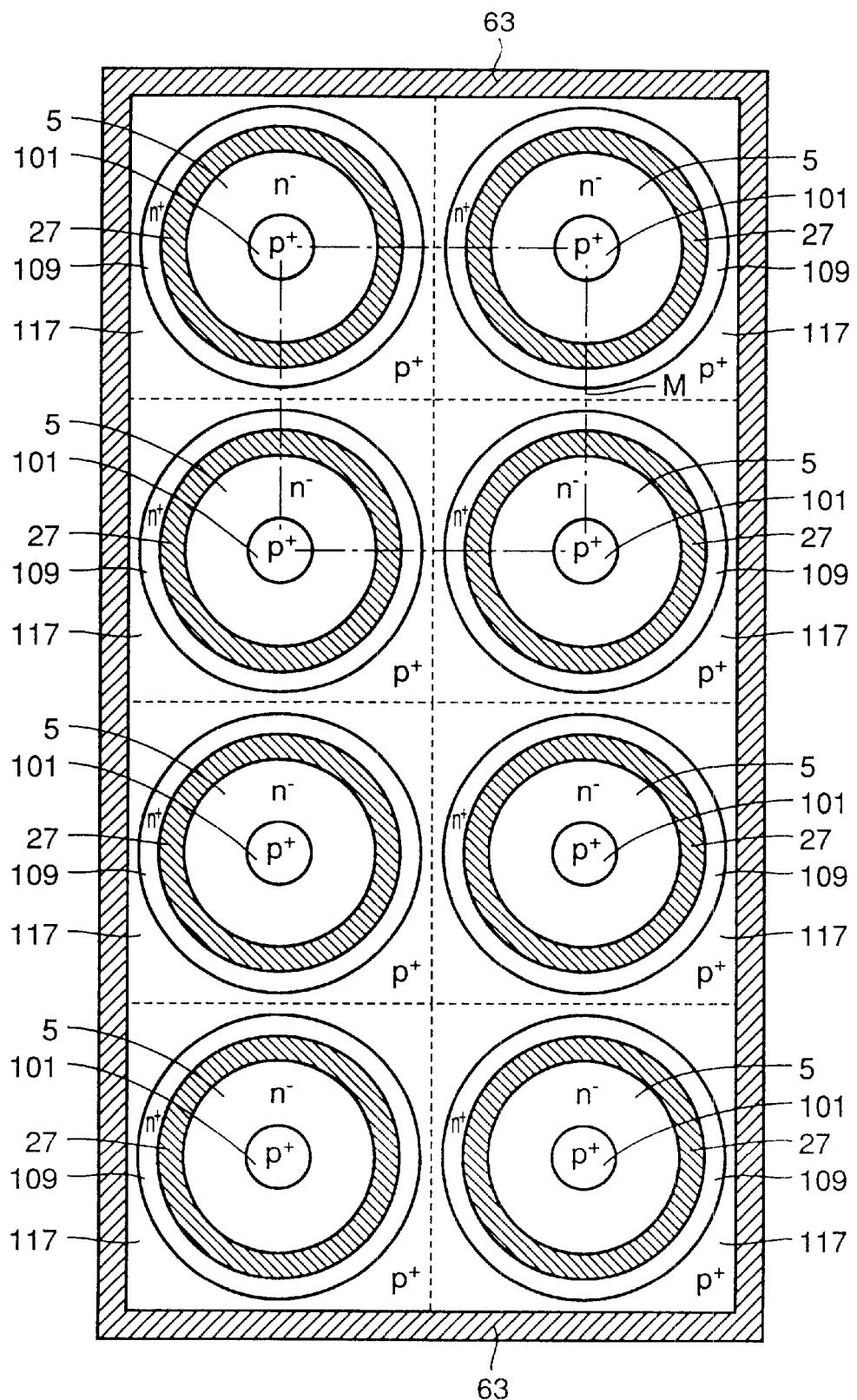
FIG. 74 is a schematic plan view showing an arrangement in which unit cells are arranged in a lattice.

In Embodiment 11, IGBT having a cylindrical structure is positioned in a planer region of a hypothetical regular hexagon, and the regular hexagons are arranged in a honeycomb. However, the planer appearance of the unit cell is not limited to the honeycomb arrangement. The IGBT having the cylindrical structure may be arranged in a square planer region. In this case, a plurality of unit cells are developed in a lattice to provide a cell array, as shown in FIG. 74. The lattice-shaped planer layout structure is, in other words, an arrangement in which the centers of p$^+$ drain regions 101 of four mutually adjacent unit cells having the cylindrical structure are arranged at vertexes of an approximately square N.

When the unit cells are developed in a lattice in this manner, interconnections for connecting the source, drain or trench of each unit cell can be arranged intersecting at a right angle or at 45°. When interconnections intersecting at such angles are to be formed, the amount of data for manufacturing a photomask used for photolithography in forming the interconnections can be reduced as compared with the case where the interconnection layers intersect at 30° or 60°. Therefore, if the unit cells are developed in a lattice as shown in FIG. 74, the time for electronic exposure can be reduced.

In Embodiments 11 to 13, n-ch IGBT has been described. However, the invention is similarly applicable to n-ch IGBTs by inverting the conductivity type of the impurities used, and similar effects can be obtained.

Figure 75:
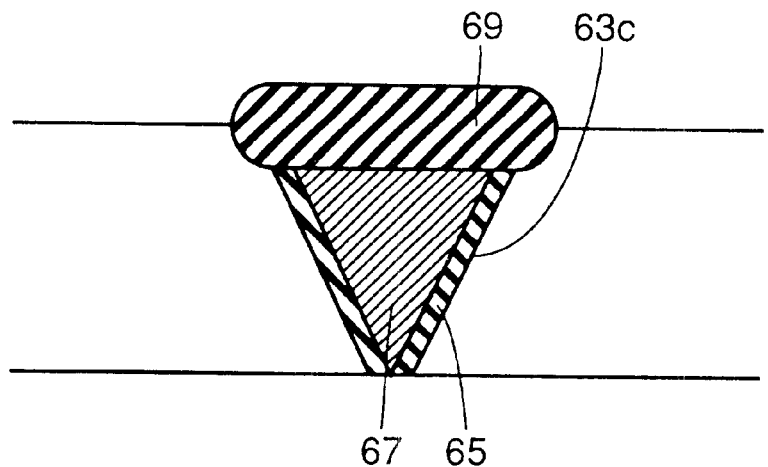
FIG. 75 is a schematic cross section showing a structure including a trench for trench isolation having a V-shaped section.
Figure 76:
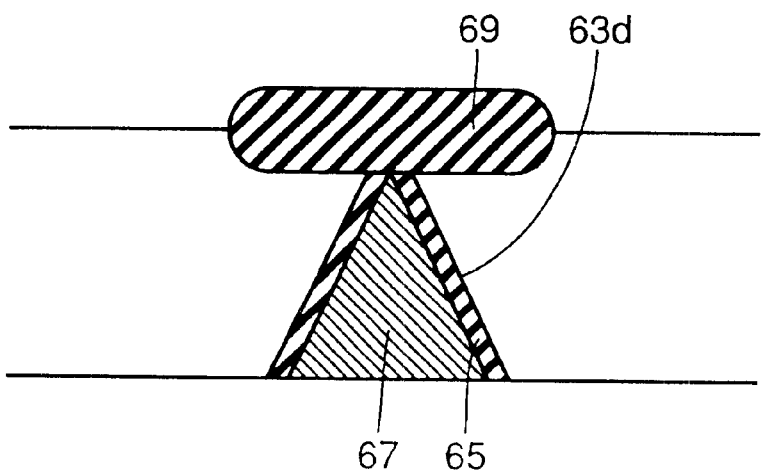
FIG. 76 is a schematic cross section showing a structure including a trench for trench isolation having an inverted V-shaped section.
Figure 77:
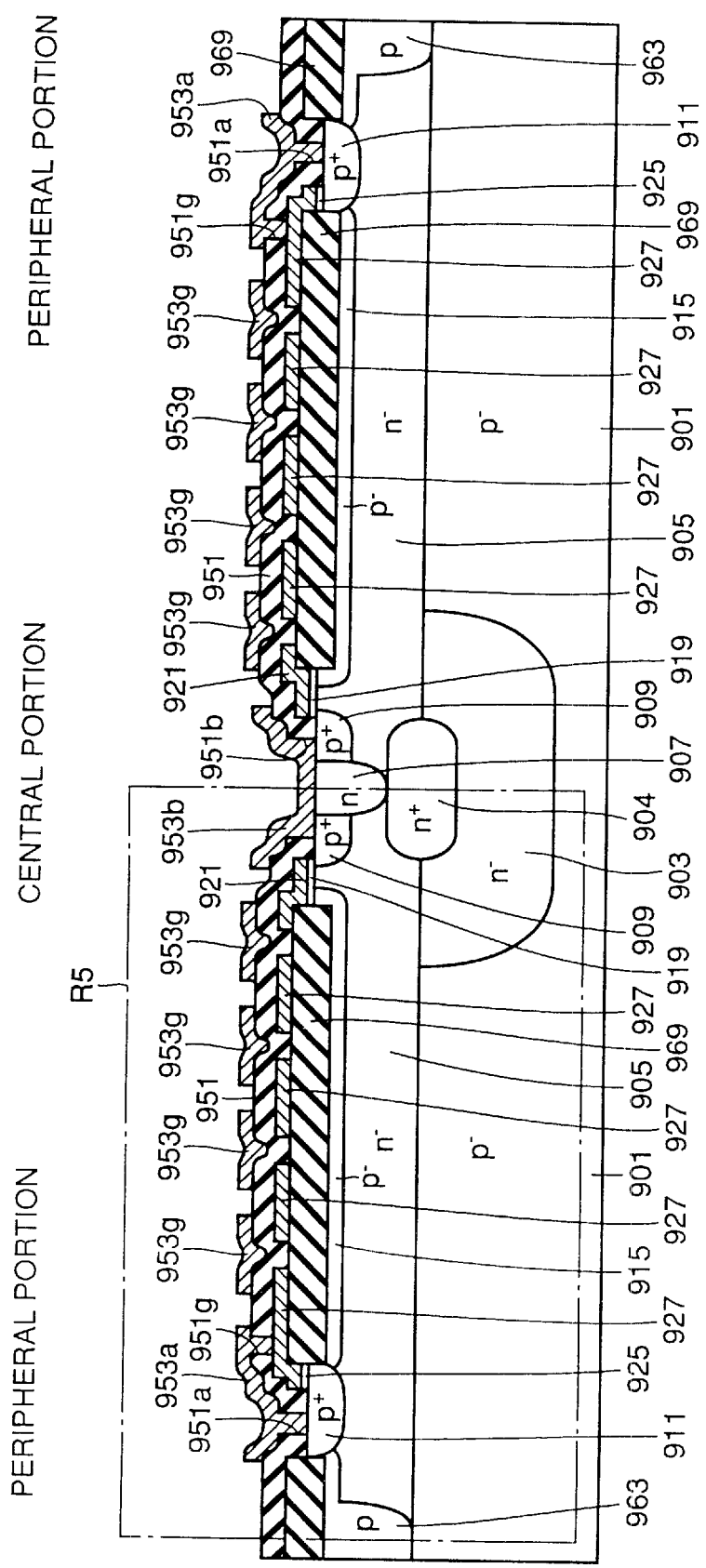
FIG. 77 is a cross section schematically showing a structure of a conventional semiconductor device.
Figure 78:
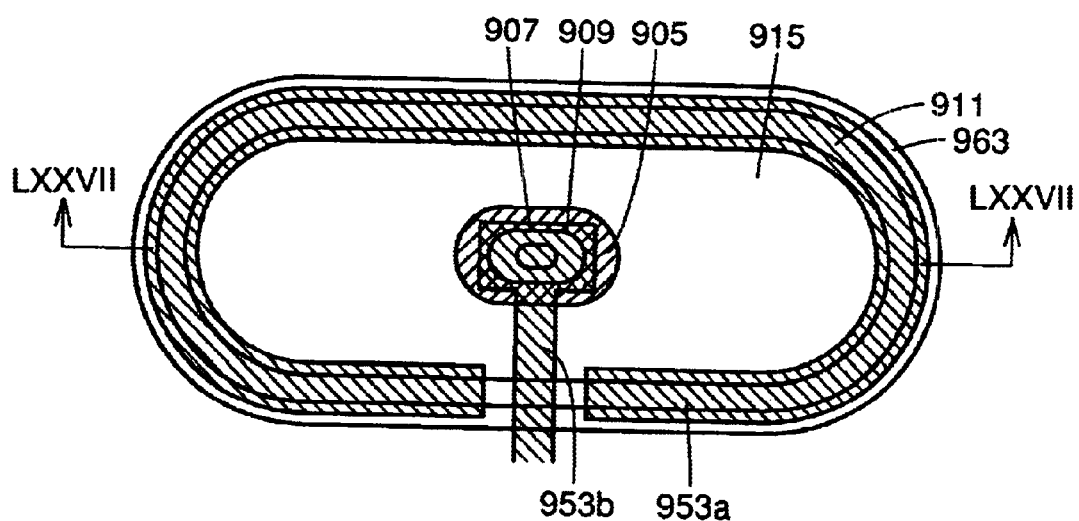
FIG. 78 schematically shows a planar layout of the structure of the conventional semiconductor device.
Figure 79:
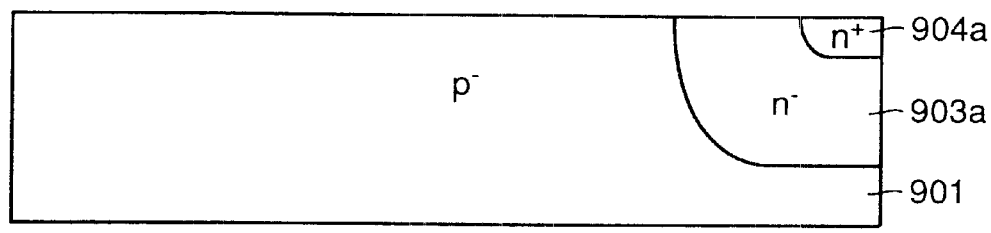
FIGS. 79 to 86 are schematic cross sections showing, in the order of step, a method of manufacturing the conventional semiconductor device.
Figure 80:
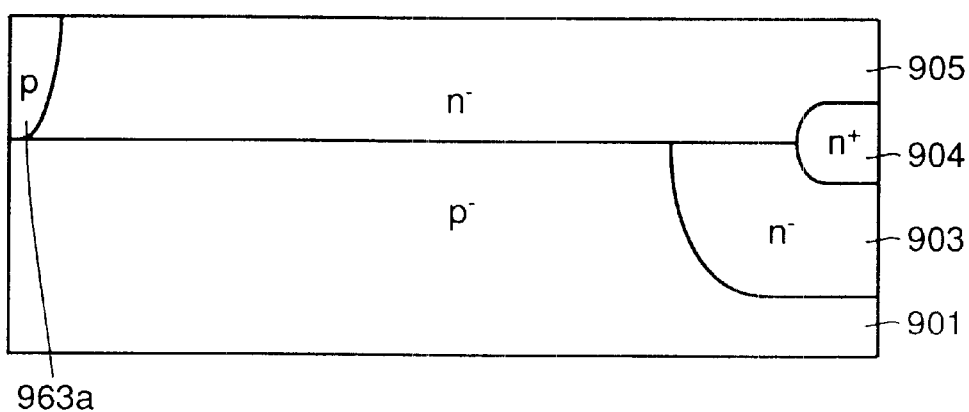
Figure 81:
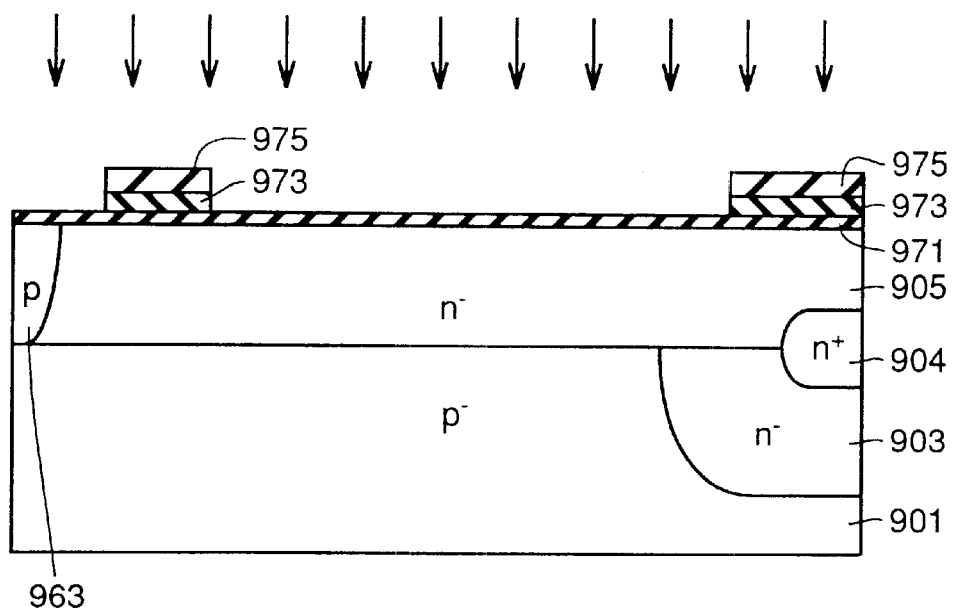
Figure 82:
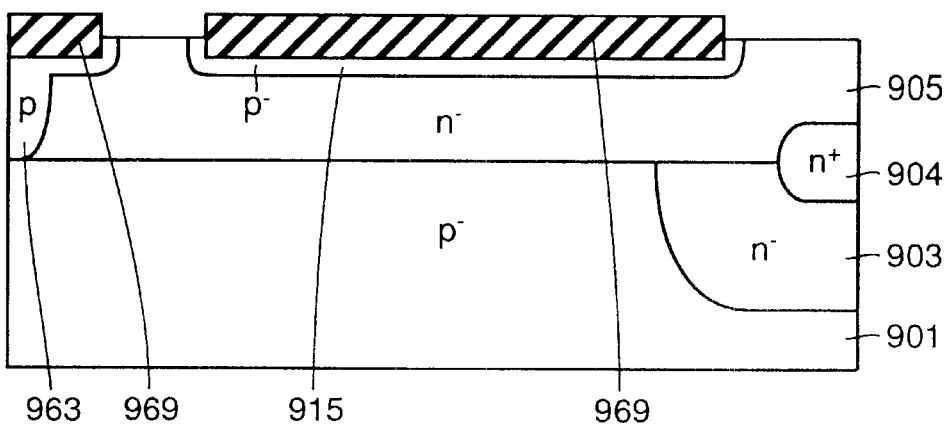
Figure 83:
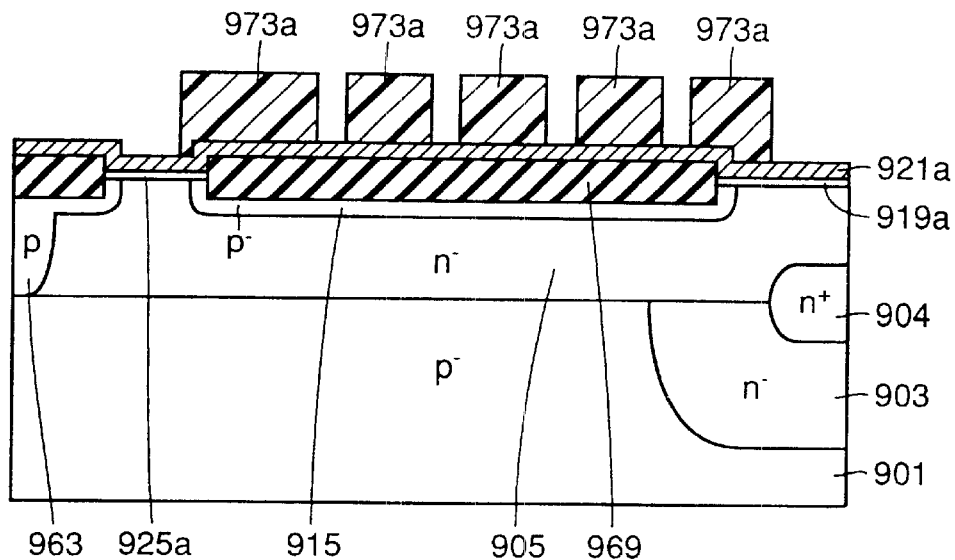
Figure 84:
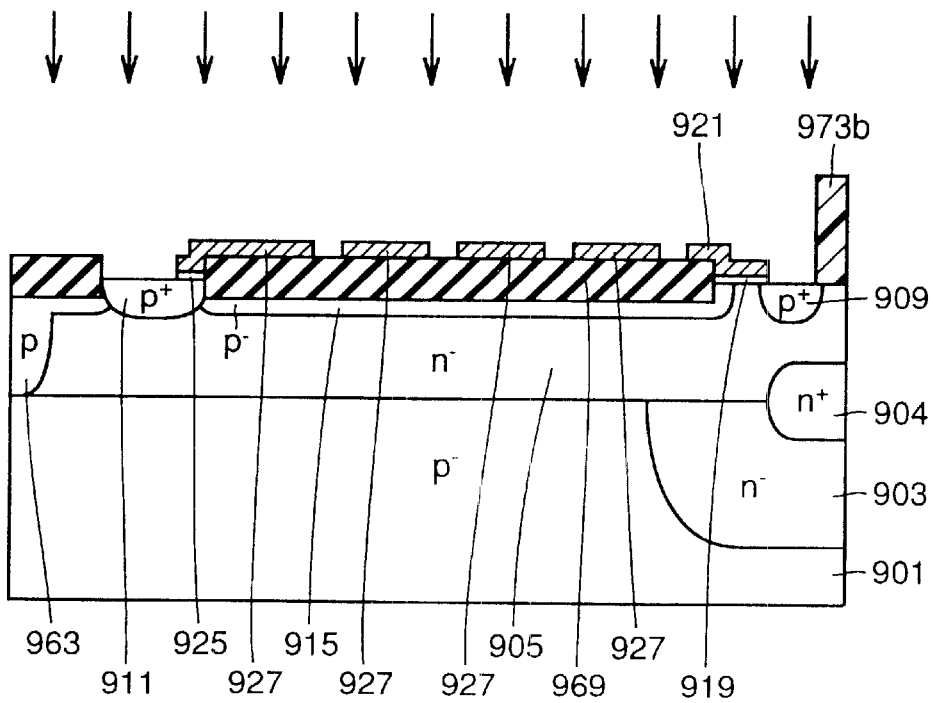
Figure 85:
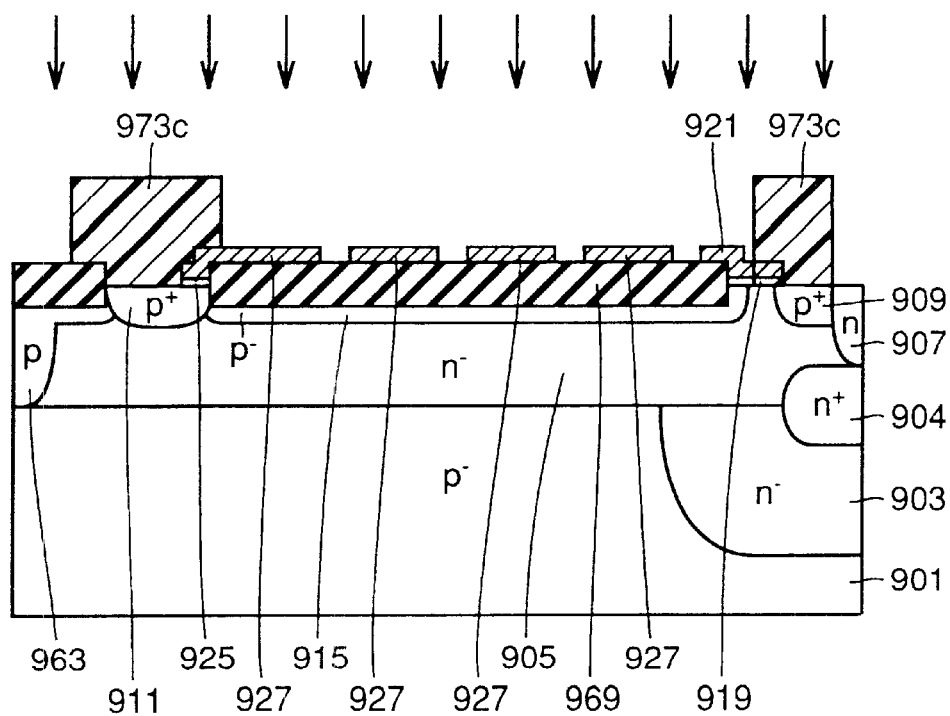
Figure 86:
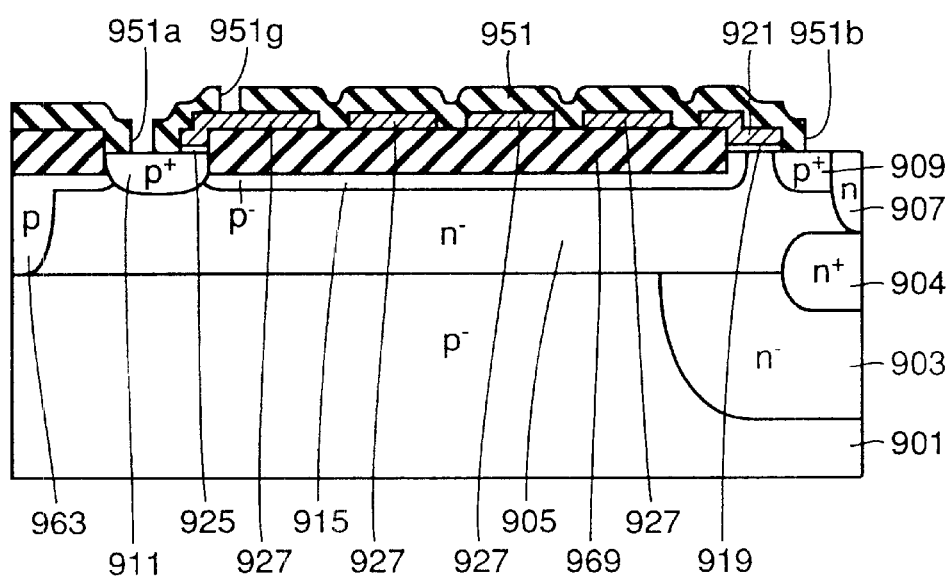
Figure 87:
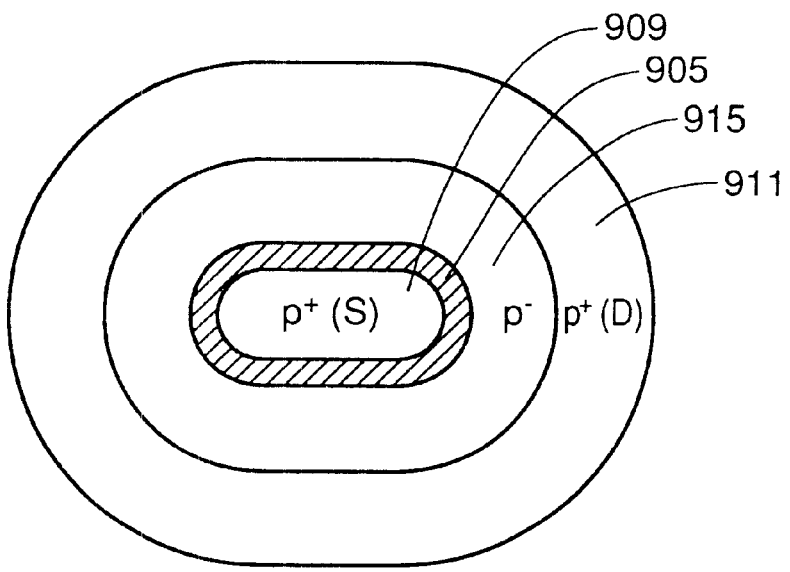
FIG. 87 is a planar layout showing a structure in which a drain layer surrounds a source layer.
Figure 88:
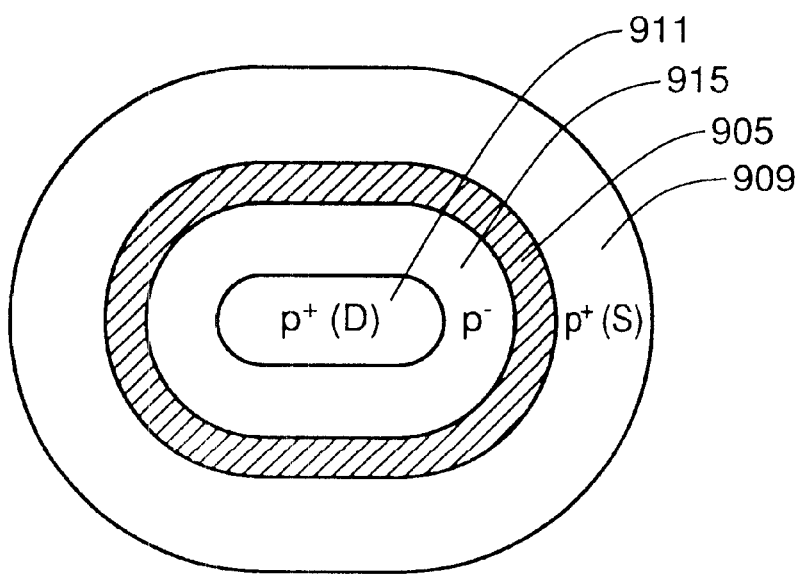
FIG. 88 is a planar layout showing a structure in which a source layer surrounds a drain layer.
Figure 89:
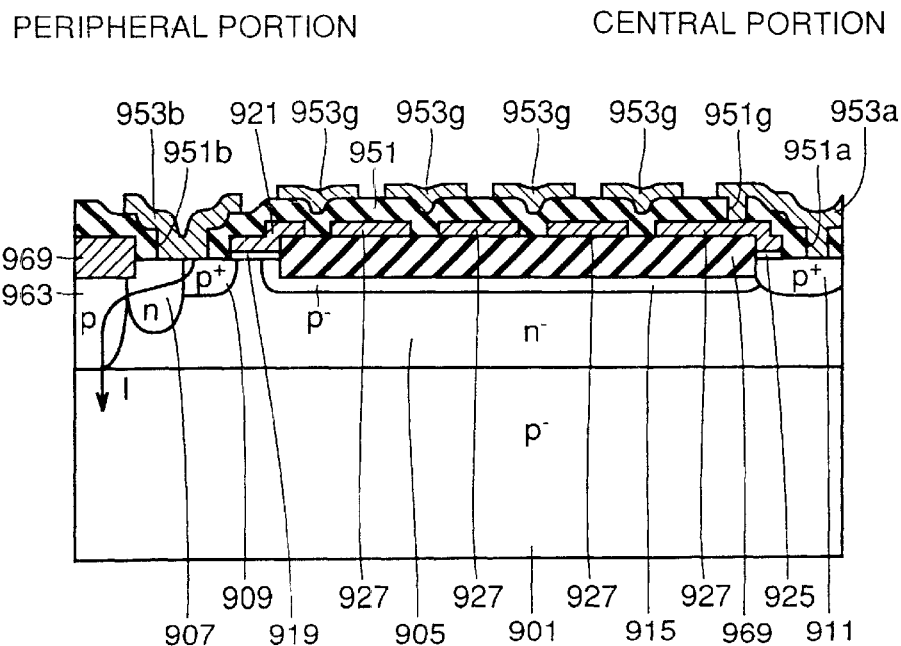
FIG. 89 is a schematic cross section showing a problem of the conventional semiconductor device employing a structure in which a source layer surrounds a drain layer.
Figure 90:
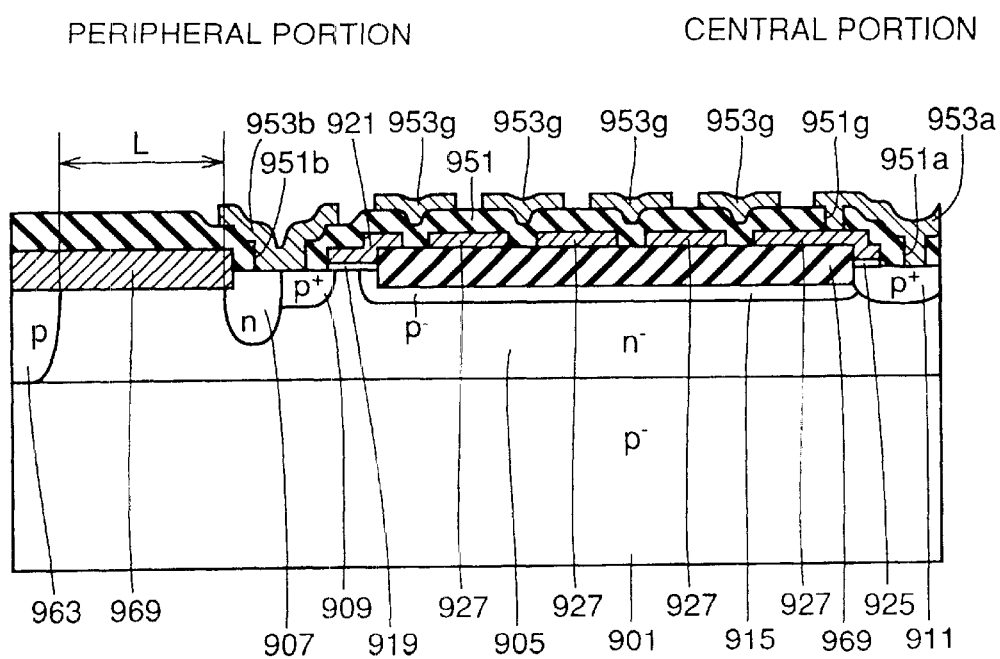
FIG. 90 is a schematic cross section showing a problem of the conventional semiconductor device employing a structure in which a source layer surrounds a drain layer.

Further, the shape of the trench for trench isolation in Embodiments 1 to 13 may be V-shape or inverted V-shape such as shown in FIGS. 75 and 76.

The structure of the present invention can be applied to a bipolar element as well.

As described above, in the semiconductor device of the present invention, the source region surrounds the drain region, and hence current drive ability can be improved. Further, unlike the prior art example in which isolation is provided by pn junction, in the present invention, the insulated gate transistor isolated from other elements by a trench. Therefore, even when a source region is arranged near the isolation region, flow of current from the source region to the semiconductor substrate at the time of operation can be prevented. Therefore, it is not necessary to arrange the trench for isolation away from the source region. Therefore, a semiconductor device having high current driving capability and suitable for higher integration can be obtained.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device, comprising:
   a semiconductor substrate having a main surface; and a semiconductor layer formed on the main surface of said semiconductor substrate with an insulating layer therebetween, and having an element formation region for forming an element having an insulated gate transistor portion and another element formation region for forming another element, wherein
      said semiconductor layer is provided with a trench surrounding at the surface of said semiconductor layer a periphery of said element formation region for electrically isolating said element formation region from said another element formation region,
      said insulated gate transistor has a source region and a drain region spaced from each other and formed at the surface of said semiconductor layer, and
      said source region is located in said element formation region at said surface of said semiconductor layer and surrounds said drain region, the semiconductor device further comprising a source leading interconnection layer electrically connected to said source region, and
   a drain leading interconnection layer electrically connected to said drain region, wherein
      said drain leading interconnection layer extends above said source leading interconnection layer in a direction crossing said source leading interconnection layer and electrically isolated from said source leading interconnection layer.

2. The semiconductor device according to claim 1, further comprising a source leading interconnection layer electrically connected to said source region, wherein said source leading interconnection layer is in contact with the surface of said source region through the entire circumference of said source region.

3. The semiconductor device according to claim 1, wherein a silicide layer is formed at the surface of said source region around the entire circumference of said source region.

4. The semiconductor device according to claim 3, further comprising a source leading interconnection layer electrically connected to said source region, wherein
   said source leading interconnection layer is in contact with only a portion of the surface of said silicide layer.

5. The semiconductor device according to claim 1, wherein said trench surrounds said element formation region with its width kept constant, at said surface of said semiconductor layer.

6. The semiconductor device according to claim 1, wherein said source region has a curved portion having a predetermined curvature radius and surrounding the periphery of said drain region, at said surface of said semiconductor layer.

7. The semiconductor device according to claim 1, further comprising:
   a source leading interconnection layer electrically connected to said source region;
   a drain leading interconnection layer electrically connected to said drain region; and
   a conductive layer formed on a portion of the surface of said semiconductor layer located between said source region and said drain region, and being operable to accumulate capacities between said source leading interconnection layer and said conductive layer and between said drain leading interconnection layer and said conductive layer.

8. The semiconductor device according to claim 1, comprising a first trench and a second trench surrounding the periphery of said element formation region, wherein
   said semiconductor layer has an isolation region located between said first trench and said second trench,
   said isolation region neighboring to said element formation region with said first trench therebetween, electrically isolated from said another element formation region with said second trench therebetween, and electrically connected to said source region of said insulated gate transistor.

9. The semiconductor device according to claim 1, wherein said insulated gate transistor has a p-channel power device and an n-channel power device both formed at the same semiconductor layer and electrically isolated from each other by said trench,
   said p-channel power device and said n-channel power device each has a lightly doped layer located between said source region and said drain region, said lightly doped layer of said p channel power device and said lightly doped layer of said n channel power device have different conductivity types, and
   said lightly doped layer of at least one of said p-channel power device and said n-channel power device is electrically connected to said drain region and has a lower concentration than said drain region.

10. The semiconductor device according to claim 1, wherein
    said insulated gate transistor has an impurity region formed on the surface of said semiconductor layer to be neighboring to said source region, and having a conductivity type different from that of said source region, and
    at said surface of said semiconductor layer, a junction between said source region and said impurity region has a portion protruding toward said impurity region and a portion protruding toward said source region.

11. The semiconductor device according to claim 1, wherein
    said drain has an approximately circular shape at said surface of said semiconductor layer,
    said source has a ring-shape surrounding periphery of said drain at said surface of said semiconductor layer, and
    inner and outer peripheries defining said ring shape are approximately circular.

12. The semiconductor device according to claim 7, wherein
    three mutually adjacent said elements are arranged at said surface of said semiconductor layer, and
    centers of said approximately circular drains of said three elements are arranged at positions corresponding to vertexes of a (hypothetical) approximately regulateral triangle.

13. The semiconductor device according to claim 4, wherein
    said another element includes a diode having first and second impurity regions of mutually different conductivity types, and
    said first and second impurity regions are arranged such that a junction between said first and second impurity regions has a portion extending linearly at the surface of said semiconductor layer.

14. The semiconductor device according to claim 11, wherein four mutually adjacent said elements are arranged at said surface of said semiconductor layer, and centers of said approximately circular drains of said four elements are arranged at positions corresponding to vertexes of a hypothetical approximately square.

15. The semiconductor device according to claim 1, comprising a semiconductor layer having an element formation region having an insulated gate transistor portion and another element formation region; wherein said semiconductor layer is provided with a trench surrounding said element formation region at a surface of said semiconductor layer in order to electrically isolate said element formation region from said another element formation region, source and drain regions of said insulated gate transistor are formed at said surface of said semiconductor layer, and said source region is formed surrounding periphery of said drain region in said element formation region at said surface of said semiconductor layer.

16. The semiconductor device according to claim 11, wherein a plurality of mutually adjacent elements are arranged at said surface of said semiconductor layer, at least one said trench is formed at an outer periphery of each of said element, said gate electrode and said drain region of each of said plurality of elements are electrically connected, and said source regions are electrically independent from each other.

* * * * *